United States Patent
Minemura

(10) Patent No.: US 12,362,019 B2
(45) Date of Patent: Jul. 15, 2025

(54) SEMICONDUCTOR STORAGE DEVICE THAT VARIES VOLTAGES APPLIED TO BIT LINES

(71) Applicant: KIOXIA CORPORATION, Tokyo (JP)

(72) Inventor: Yoichi Minemura, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 248 days.

(21) Appl. No.: 17/900,288

(22) Filed: Aug. 31, 2022

(65) Prior Publication Data

US 2023/0282290 A1 Sep. 7, 2023

(30) Foreign Application Priority Data

Mar. 7, 2022 (JP) .................................. 2022-034434

(51) Int. Cl.
*G11C 16/26* (2006.01)
*G11C 11/56* (2006.01)
*G11C 16/04* (2006.01)
*G11C 16/10* (2006.01)

(52) U.S. Cl.
CPC .......... *G11C 16/26* (2013.01); *G11C 11/5628* (2013.01); *G11C 11/5642* (2013.01); *G11C 11/5671* (2013.01); *G11C 16/0483* (2013.01); *G11C 16/10* (2013.01)

(58) Field of Classification Search
CPC . G11C 16/26; G11C 11/5628; G11C 11/5642; G11C 11/5671; G11C 16/0483; G11C 16/10; G11C 16/08; G11C 16/24; G11C 16/32; G11C 8/08; G11C 7/12
See application file for complete search history.

(56) References Cited

U.S. PATENT DOCUMENTS

| | | | | |
|---|---|---|---|---|
| 6,229,734 B1* | 5/2001 | Watanabe | .......... | G11C 16/3404 365/185.24 |
| 7,983,084 B2* | 7/2011 | Tokiwa | .................. | H10B 43/27 365/185.11 |
| 9,633,741 B1* | 4/2017 | Matsuo | .................. | H10B 43/35 |
| 10,930,355 B2 | 2/2021 | Yang et al. | | |
| 11,322,204 B2* | 5/2022 | Shibuya | ............. | G11C 16/3436 |
| 11,450,383 B2* | 9/2022 | Date | ................... | G11C 11/5671 |
| 2003/0185085 A1* | 10/2003 | Kaneko | ............... | G11C 11/4094 365/230.03 |

(Continued)

FOREIGN PATENT DOCUMENTS

| | | |
|---|---|---|
| TW | 202143447 A | 11/2021 |
| TW | 202203223 A | 1/2022 |

*Primary Examiner* — Khamdan N. Alrobaie
(74) *Attorney, Agent, or Firm* — Kim & Stewart LLP

(57) ABSTRACT

A semiconductor storage device includes a first word line, a first insulating layer extending along the first word line, a first memory cell connected to the first word line, a second memory cell connected to the first word line, a first bit line connected to the first memory cell, a second bit line connected to the second memory cell, and a control circuit. The second memory cell is farther from the first insulating layer than the first memory cell. The control circuit is configured to apply a first voltage to the first bit line during a read operation of the first memory cell, and apply a second voltage to the second bit line during a read operation of the second memory cell. The second voltage is higher than the first voltage.

11 Claims, 22 Drawing Sheets

(56) References Cited

U.S. PATENT DOCUMENTS

| | | | |
|---|---|---|---|
| 2013/0294165 A1* | 11/2013 | Park | G11C 16/26 |
| | | | 365/185.17 |
| 2016/0358664 A1* | 12/2016 | Li | G11C 16/28 |
| 2018/0151234 A1 | 5/2018 | Cho | |
| 2019/0074290 A1 | 3/2019 | Xiao et al. | |
| 2020/0126628 A1* | 4/2020 | Maejima | G11C 16/3454 |
| 2020/0365213 A1* | 11/2020 | Jeon | G11C 16/32 |
| 2021/0012841 A1* | 1/2021 | Yanagidaira | H10B 43/10 |
| 2021/0082512 A1* | 3/2021 | Yamabe | G11C 16/10 |
| 2021/0335418 A1* | 10/2021 | Yanagidaira | G11C 16/32 |
| 2021/0391017 A1 | 12/2021 | Choi | |
| 2022/0020413 A1 | 1/2022 | Tang | |
| 2022/0068402 A1* | 3/2022 | Yamada | G11C 16/32 |

\* cited by examiner

SEMICONDUCTOR STORAGE DEVICE THAT VARIES VOLTAGES APPLIED TO BIT LINES

CROSS-REFERENCE TO RELATED APPLICATION(S)

This application is based upon and claims the benefit of priority from Japanese Patent Application No. 2022-034434, filed Mar. 7, 2022, the entire contents of which are incorporated herein by reference.

FIELD

Embodiments described herein relate generally to a semiconductor storage device.

BACKGROUND

A NAND flash memory capable of storing data non-volatilely is known.

DETAILED DESCRIPTION

Figure 1:
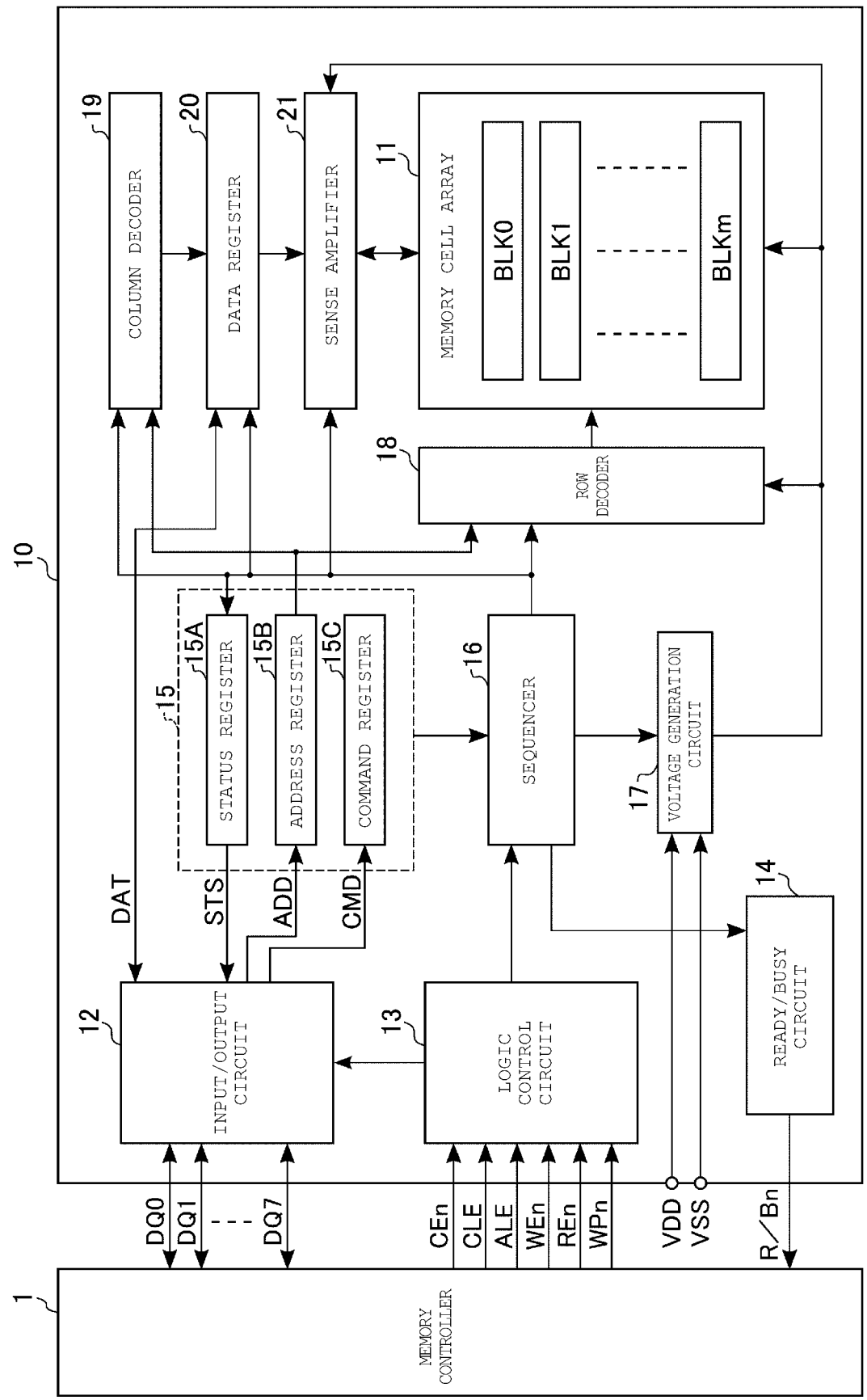
FIG. 1 is a block diagram showing a configuration of a semiconductor storage device according to a first embodiment.

Embodiments provide a semiconductor storage device capable of improving the performance of a read operation and/or a write operation.

In general, according to an embodiment, a semiconductor storage device includes a first word line extending in a first direction and a second direction crossing the first direction, a first insulating layer extending in the first direction and a third direction crossing the first and second directions, a first memory cell connected to the first word line, a second memory cell connected to the first word line, the second memory cell being farther from the first insulating layer than the first memory cell in the second direction, a first bit line connected to the first memory cell, a second bit line connected to the second memory cell, and a control circuit. The control circuit is configured to apply a first voltage to the first bit line during a read operation of the first memory cell, and apply a second voltage to the second bit line during a read operation of the second memory cell. The second voltage is higher than the first voltage.

Hereinafter, embodiments will be described with reference to the drawings. In the following description, elements having the same function and configuration will be given a common reference numeral. Further, the embodiments shown below exemplify devices and methods for embodying the technical idea of the present disclosure, and the materials, shapes, structures, arrangements, and the like of the components are not specified as follows.

Functional blocks may be implemented by hardware, computer software, or a combination of both. It is not essential that the functional blocks are distinguished as in the example below. For example, some functions may be executed by a functional block different from the exemplified functional block. Furthermore, the exemplified functional block may be subdivided into finer functional sub-blocks.

1. First Embodiment

A semiconductor storage device according to a first embodiment will be described. Hereinafter, as a semiconductor storage device, a three-dimensional stacked NAND flash memory in which memory cell transistors are three-dimensionally stacked on a semiconductor substrate will be described as an example. The NAND flash memory is a semiconductor memory that can store data non-volatilely.

1.1 Configuration of Semiconductor Storage Device

First, the configuration of the semiconductor storage device according to the first embodiment will be described. FIG. 1 is a block diagram showing a configuration of the semiconductor storage device according to the first embodiment.

A semiconductor storage device 10 includes a memory cell array 11, an input/output circuit 12, a logic control circuit 13, a ready/busy circuit 14, a register group 15, a sequencer (or control circuit) 16, a voltage generation circuit 17, a row decoder 18, and a column decoder 19, a data register 20, and a sense amplifier 21. The register group 15 includes a status register 15A, an address register 15B, and a command register 15C.

The memory cell array 11 includes one or more blocks BLK0, BLK1, BLK2, . . . , and BLKm (m is a natural number of 0 or more). Each of the plurality of blocks BLK0 to BLKm includes a plurality of memory cell transistors (hereinafter, also referred to as memory cells) associated with rows and columns. Memory cell transistors are non-volatile memory cells that are electrically erasable and programmable. The memory cell array 11 includes a plurality of word lines, a plurality of bit lines, and a source line for applying a voltage to the memory cell transistor. The specific configuration of the block BLKm will be described below.

The input/output circuit 12 and the logic control circuit 13 are connected to a memory controller 1 via an input/output terminal (or a NAND bus). The input/output circuit 12 performs communication of I/O signals DQ (for example, DQ0, DQ1, DQ2, . . . , and DQ7) to and from the memory controller 1 via input/output terminals. The I/O signal DQ signifies commands, addresses, data, and the like.

The logic control circuit 13 receives an external control signal from the memory controller 1 via the input/output terminal (or NAND bus). The external control signal includes, for example, a chip enable signal CEn, a command latch enable signal CLE, an address latch enable signal ALE, a write enable signal WEn, a read enable signal REn, and a write protect signal WPn. An "n" added to the signal name indicates that the signal is active low.

The chip enable signal CEn enables selection of one semiconductor storage device 10 when a plurality of semiconductor storage devices 10 are mounted, and is asserted when the one semiconductor storage device 10 is selected. The command latch enable signal CLE makes it possible to latch a command transmitted as a signal DQ to the command register 15C. The address latch enable signal ALE makes it possible to latch the address transmitted as the signal DQ to the address register 15B. The write enable signal WEn makes it possible to store the data transmitted as the signal DQ in the input/output circuit 12. The read enable signal REn makes it possible to output the data read from the memory cell array 11 as the signal DQ. The write protect signal WPn is asserted when prohibiting the write operation and the erasing operation for the semiconductor storage device 10.

The ready/busy circuit 14 generates a ready/busy signal R/Bn according to the control by the sequencer 16. The ready/busy signal R/Bn indicates whether the semiconductor storage device 10 is in the ready state or the busy state. The ready state is a state in which the semiconductor storage device 10 can accept an instruction from the memory controller 1. The busy state is a state in which an instruction from the memory controller 1 cannot be accepted. By receiving the ready/busy signal R/Bn from the semiconductor storage device 10, the memory controller 1 can know whether the semiconductor storage device 10 is in the ready state or the busy state.

The status register 15A stores status information STS necessary for the operation of the semiconductor storage device 10. The status register 15A transfers the status information STS to the input/output circuit 12 according to the instruction of the sequencer 16.

The address register 15B stores the address ADD transferred from the input/output circuit 12. The address ADD includes a row address and a column address. The row address includes, for example, a block address that designates the block BLKm to be operated, and a page address that designates a word line WL to be operated in the designated block.

The command register 15C stores a command CMD transferred from the input/output circuit 12. The command CMD includes, for example, a write command for ordering a write operation to the sequencer 16, a read command for ordering a read operation, an erase command for ordering an erasing operation, and the like.

For example, a static random access memory (SRAM) is used for the status register 15A, the address register 15B, and the command register 15C.

The sequencer 16 receives a command from the command register 15C and controls the semiconductor storage device 10 in an integrated manner according to a sequence based on this command.

The sequencer 16 controls a voltage generation circuit 17, a row decoder 18, a column decoder 19, a data register 20, a sense amplifier 21, and the like to execute a write operation, a read operation, and an erasing operation. Specifically, the sequencer 16 controls the voltage generation circuit 17, the row decoder 18, the data register 20, and the sense amplifier 21 based on the write command received from the command register 15C, and writes data into a plurality of memory cell transistors designated with the address ADD. The sequencer 16 also controls the voltage generation circuit 17, the row decoder 18, the column decoder 19, the data register 20, and the sense amplifier 21 based on the read command received from the command register 15C, and is read data from a plurality of memory cell transistors designated with the address ADD. The sequencer 16 also controls the voltage generation circuit 17, the row decoder 18, the column decoder 19, the data register 20, and the sense amplifier 21 based on the erase command received from the command register 15C, and erases the data stored in the block designated with the address ADD.

The voltage generation circuit 17 receives a power supply voltage VDD and a ground voltage VSS from the outside of the semiconductor storage device 10 via the power supply terminal. The power supply voltage VDD is an external voltage supplied from the outside of the semiconductor storage device 10, and is, for example, 3.3 V. The ground voltage VSS is an external voltage supplied from the outside of the semiconductor storage device 10, and is, for example, 0 V.

The voltage generation circuit 17 uses the power supply voltage VDD to generate a plurality of voltages required for the write operation, the read operation, and the erasing operation. The voltage generation circuit 17 supplies the generated voltage to the memory cell array 11, the row decoder 18, the sense amplifier 21, and the like.

The row decoder 18 receives a row address from the address register 15B and decodes the row address. The row decoder 18 selects one of a plurality of blocks based on the decoding result of the row address, and further selects the word line WL in the selected block BLKm. Furthermore, the row decoder 18 transfers a plurality of voltages supplied from the voltage generation circuit 17 to the selected block BLKm.

The column decoder 19 receives a column address from the address register 15B and decodes the column address. The column decoder 19 selects the latch circuit in the data register 20 based on the decoding result of the column address.

The data register 20 includes a plurality of latch circuits. The latch circuit temporarily stores write data or read data.

The sense amplifier 21 senses and amplifies the data read from the memory cell transistor into the bit line during the data read operation. Furthermore, the sense amplifier 21 temporarily stores read data DAT read from the memory cell transistor, and transfers the stored read data DAT to the data register 20. Further, the sense amplifier 21 temporarily stores write data DAT transferred from the input/output circuit 12 via the data register 20 during the data write operation. Furthermore, the sense amplifier 21 transfers the write data DAT to the bit line.

1.1.1 Configuration of Memory Cell Array 11

Next, the circuit configuration of the memory cell array 11 in the semiconductor storage device 10 will be described. As described above, the memory cell array 11 has a plurality of blocks BLK0 to BLKm. The circuit configuration of the block BLKm will be described below.

Figure 2:
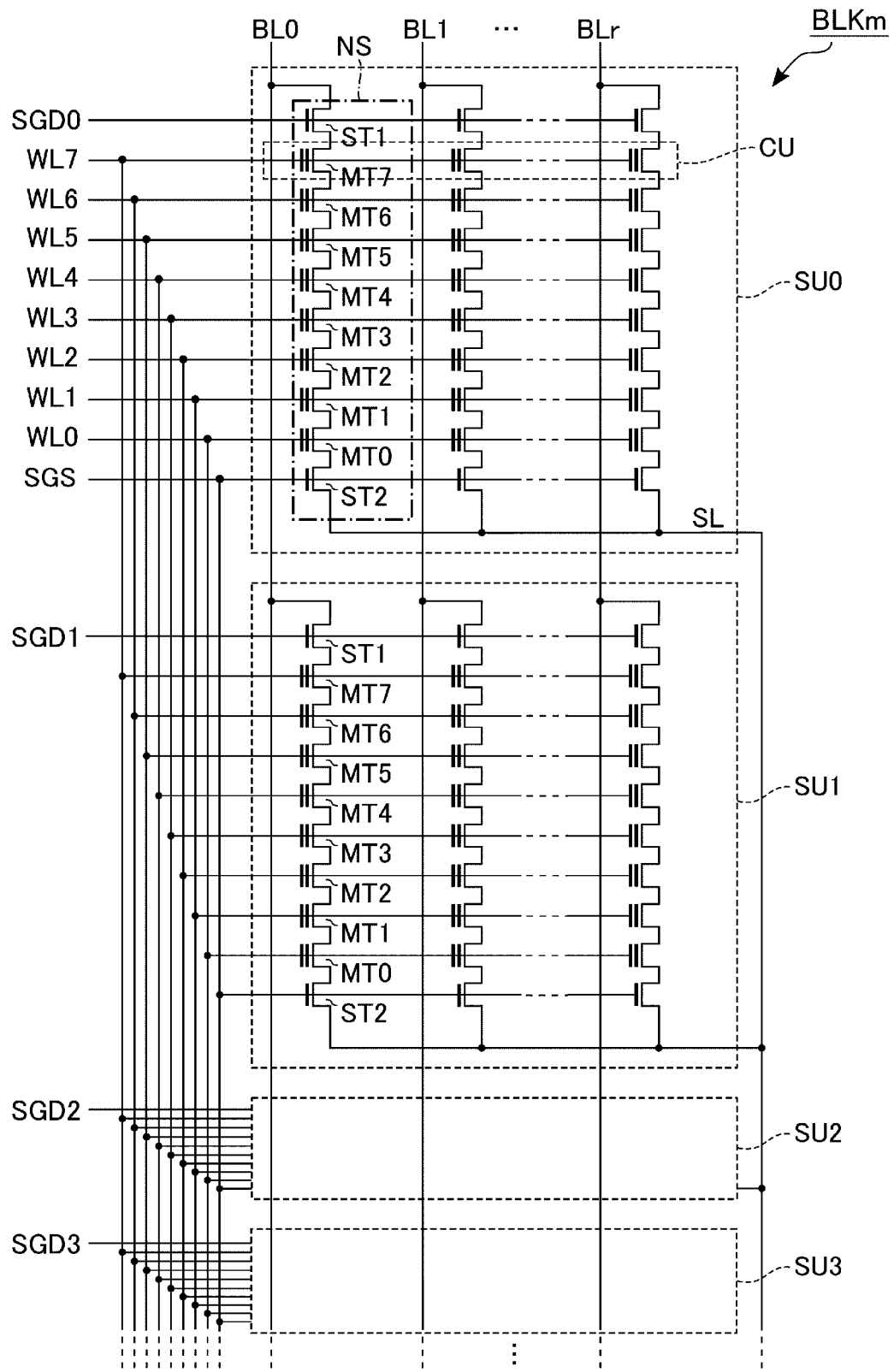
FIG. 2 is a circuit diagram of a block in a memory cell array in the first embodiment.

FIG. 2 is a circuit diagram of the block BLKm in the memory cell array 11. The block BLKm includes, for example, a plurality of string units SU0, SU1, SU2, and SU3. Hereinafter, a case where the term "string unit SU" refers to each of the string units SU0 to SU3 is described. The string unit SU includes a plurality of NAND strings (or memory strings) NS.

Here, for the sake of simplicity, an example is shown in which the NAND string NS includes, for example, eight memory cell transistors MT0, MT1, MT2, . . . , and MT7, and two select transistors ST1 and ST2. Hereinafter, a case where the term "memory cell transistor MT" refers to each of the memory cell transistors MT0 to MT7 is described.

The memory cell transistor MT includes a control gate and a charge storage layer, and stores data non-volatilely. The memory cell transistors MT0 to MT7 are connected in series between the source of the select transistor ST1 and the drain of the select transistor ST2. The memory cell transistor MT can store 1-bit data or 2 or more bits of data.

The gates of the plurality of select transistors ST1 in the string unit SU0 are connected to a select gate line SGD0. Similarly, the gates of each of the select transistors ST1 of the string units SU1 to SU3 are connected to select gate lines SGD1 to SGD3, respectively. Each of the select gate lines SGD0 to SGD3 is independently controlled by the row decoder 18.

The gates of the plurality of select transistors ST2 in the string unit SU0 are connected to select gate lines SGS. Similarly, the gates of each of the select transistors ST2 of the string units SU1 to SU3 are connected to the select gate lines SGS. In some cases, select gate lines SGS may be respectively connected to the gates of the select transistors ST2 of the string units SU0 to SU3. The select transistors ST1 and ST2 are used to select the string unit SU in various operations.

The control gates of the memory cell transistors MT0 to MT7 in the block BLKm are connected to word lines WL0 to WL7, respectively. Each of the word lines WL0 to WL7 is independently controlled by the row decoder 18.

Each of the bit lines BL0 to BLr (r is a natural number of 0 or more) is connected to a plurality of blocks BLK0 to BLKm, and is connected to one NAND string NS in the string unit SU in the block BLKm. That is, each of the bit lines BL0 to BLr is connected to the drain of the select transistor ST1 of the plurality of NAND strings NS in the same row among the NAND strings NS arranged in a matrix configuration in the block BLKm. Further, a source line SL is connected to a plurality of blocks BLK0 to BLKm. That is, the source line SL is connected to the sources of the plurality of select transistors ST2 in the block BLKm.

In short, the string unit SU includes a plurality of NAND strings NS connected to different bit lines BL and connected to the same select gate line SGD. Further, the block BLKm includes a plurality of string units SU having a common word line WL. Furthermore, the memory cell array 11 includes a plurality of blocks BLK0 to BLKm having a common bit line BL.

The block BLKm is, for example, a unit of data erase. That is, the data stored in the memory cell transistor MT in the block BLKm are collectively erased. The data in the plurality of blocks is sequentially erased for each block. In addition, the data in the plurality of blocks is erased in parallel at the same time. The data may be erased in units of string unit SU, or may be erased in units of less than string unit SU.

A plurality of memory cell transistors MT sharing the word line WL in one string unit SU are referred to as a cell unit CU. A collection of 1-bit data stored in each of a plurality of memory cell transistors MT in the cell unit CU is called a page. The storage capacity of the cell unit CU changes according to the number of bits of data stored in the memory cell transistor MT. For example, the cell unit CU stores 1 piece of page data when each memory cell transistor MT stores 1-bit data, 2 pieces of page data when storing 2-bit data, and 3 pieces of page data when storing 3-bit data, respectively.

The write operation and the read operation for the cell unit CU are performed in units of pages. That is, the read operation and the write operation are collectively performed on a plurality of memory cell transistors MT connected to one word line WL arranged in one string unit SU.

The number of string units in the block BLKm is not limited to SU0 to SU3, and may be set in any manner. Further, the number of NAND strings NS in the string unit SU, the number of memory cell transistors in the NAND string NS, and the number of select transistors may be set in any manner. Furthermore, the memory cell transistor MT may be a metal-oxide-nitride-oxide-silicon (MONOS) type using an insulating layer as a charge storage layer, or a floating gate (FG) type using a conductive layer as a charge storage layer.

1.1.2 Configuration of Sense Amplifier 21

Figure 3:
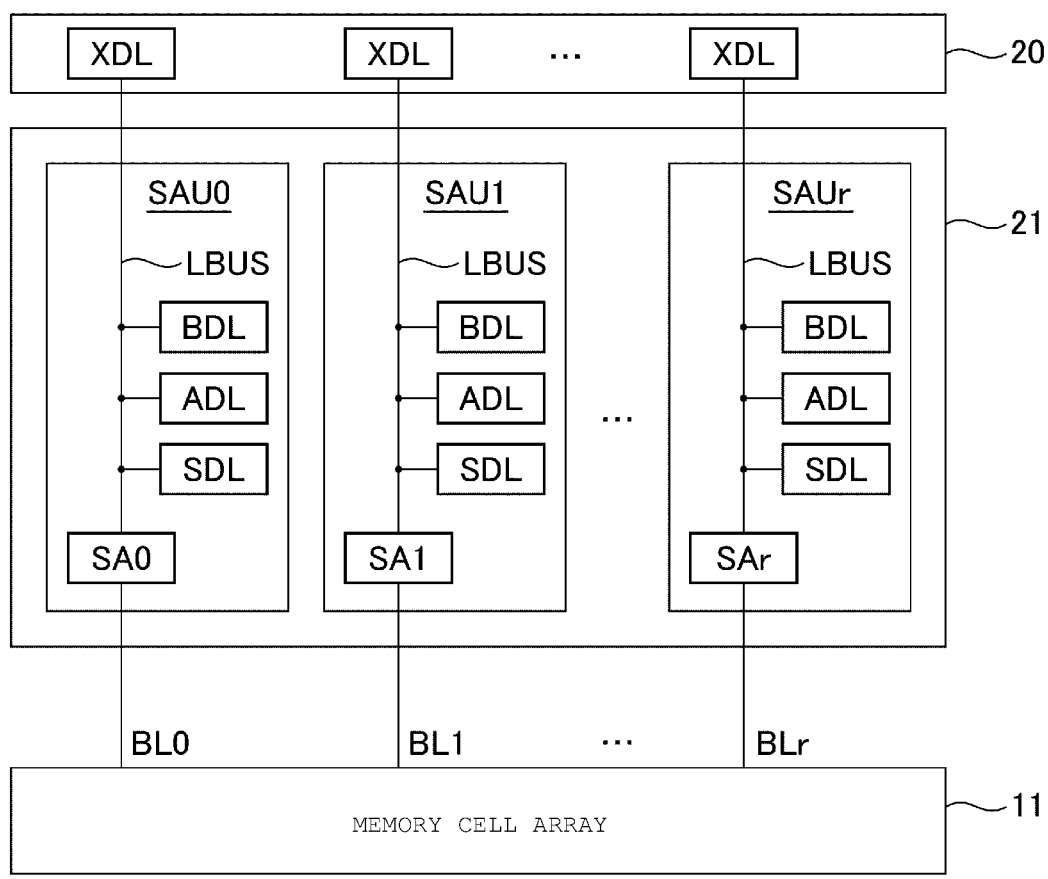
FIG. 3 is a block diagram showing a circuit configuration of a sense amplifier in the first embodiment.

Next, the circuit configuration of the sense amplifier 21 in the semiconductor storage device 10 will be described. FIG. 3 is a diagram showing a circuit configuration of the sense amplifier 21 in the semiconductor storage device 10 according to the first embodiment. The sense amplifier 21 includes a plurality of sense amplifier units SAU0, SAU1, . . . , and SAUr (r is a natural number of 0 or more).

The sense amplifier units SAU0 to SAUr are associated with bit lines BL0 to BLr, respectively. The sense amplifier unit SAUr includes, for example, a sense amplifier section SAr, latch circuits SDL, ADL, and BDL, and a bus LBUS.

For example, in the read operation, the sense amplifier section SAr determines whether the read data is "0" or "1" based on the voltage of the bit line BLr. That is, the sense amplifier section SAr senses and amplifies the voltage read out to the bit line BLr, and determines the bit value of the data stored in the selected memory cell. Each of the latch circuits SDL, ADL, and BDL temporarily stores read data, write data, and the like.

The sense amplifier section SAr and the latch circuits SDL, ADL, and BDL are each connected to the bus LBUS and can perform data communication with each other via the bus LBUS.

Further, the latch circuit XDL in the data register 20 is connected to the input/output circuit 12 of the semiconductor storage device 10 and is used for data input/output between the sense amplifier unit SAUr and the input/output circuit 12. The latch circuit XDL may also be used, for example, as a cache memory of the semiconductor storage device 10. For example, the semiconductor storage device 10 may be set to the ready state when the latch circuit XDL is free even when the latch circuits SDL, ADL, and BDL are in use.

Figure 4:
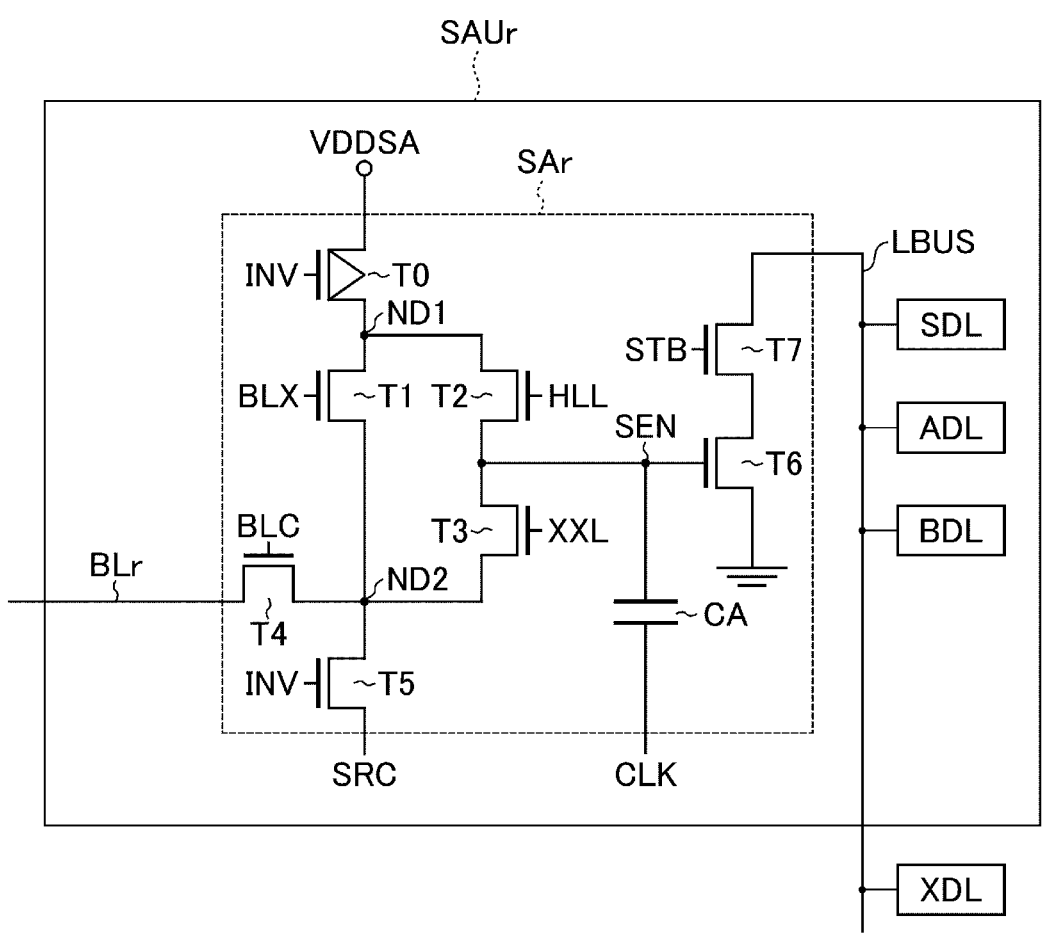
FIG. 4 is a circuit diagram of a sense amplifier section in a sense amplifier unit in the first embodiment.

The configuration of the sense amplifier section SAr in the sense amplifier unit SAUr will be described below. FIG. 4 is a circuit diagram of the sense amplifier section SAr in the sense amplifier unit SAUr in the first embodiment. For example, the sense amplifier section SAr includes transistors T0, T1, . . . , and T7 and a capacitor CA.

The transistor T0 is a p-channel MOS field effect transistor. Each of the transistors T1 to T7 is an re-channel MOS field effect transistor.

The source of the transistor T0 is connected to the node at a voltage VDDSA. For example, the voltage VDDSA is supplied to this node from the voltage generation circuit 17. The drain of the transistor T0 is connected to a node ND1. The gate of the transistor T0 is connected to, for example, a node INV (not shown) of the latch circuit SDL. The drain of the transistor T1 is connected to the node ND1. The source of the transistor T1 is connected to a node ND2. A control signal BLX is input to the gate of the transistor T1. The drain of the transistor T2 is connected to the node ND1. The source of the transistor T2 is connected to a sense node SEN. A control signal HLL is input to the gate of the transistor T2.

The drain of the transistor T3 is connected to the sense node SEN. The source of the transistor T3 is connected to the node ND2. A control signal XXL is input to the gate of the transistor T3. The drain of the transistor T4 is connected to the node ND2. The source of the transistor T4 is connected to the bit line BLr. A control signal BLC is input to the gate of the transistor T4. The drain of the transistor T5 is connected to the node ND2. The source of the transistor T5 is connected to a node SRC. For example, the ground voltage VSS is supplied to the node SRC. The gate of the transistor T5 is connected to the node INV.

The drain of the transistor T7 is connected to the bus LBUS. The source of the transistor T7 is connected to the drain of the transistor T6. A control signal STB is input to the gate of the transistor T7. The source of the transistor T6 is, for example, grounded. That is, the source of the transistor T6 is supplied with, for example, the ground voltage VSS. The gate of the transistor T6 is connected to the sense node SEN.

One electrode of the capacitor CA is connected to the sense node SEN. A clock signal CLK is input to the other electrode of the capacitor CA.

In the circuit configuration of the sense amplifier unit SAUr described above, the node INV is a node in the latch circuit SDL. The voltage of the node INV changes based on the data stored by the latch circuit SDL. Each of the control signals BLX, HLL, XXL, BLC, and STB, and the clock signal CLK is generated by, for example, the sequencer 16. For example, in the read operation, the sense amplifier section SAr determines the bit value of the data read to the bit line BLr based on the timing at which the control signal STB is asserted.

The sense amplifier 21 in the semiconductor storage device 10 according to the first embodiment is not limited to the circuit configuration described above. For example, the number of latch circuits in the sense amplifier unit SAUr may be appropriately changed based on the number of pages stored in one cell unit CU. The sense amplifier section SAr may have another circuit configuration as long as it is possible to determine the bit value of the data read out to the bit line BLr.

1.1.3 Threshold Voltage Distribution of Memory Cell Transistors

Next, the relationship between the data and the possible threshold voltage distribution of the memory cell transistors MT will be described.

Figure 5:
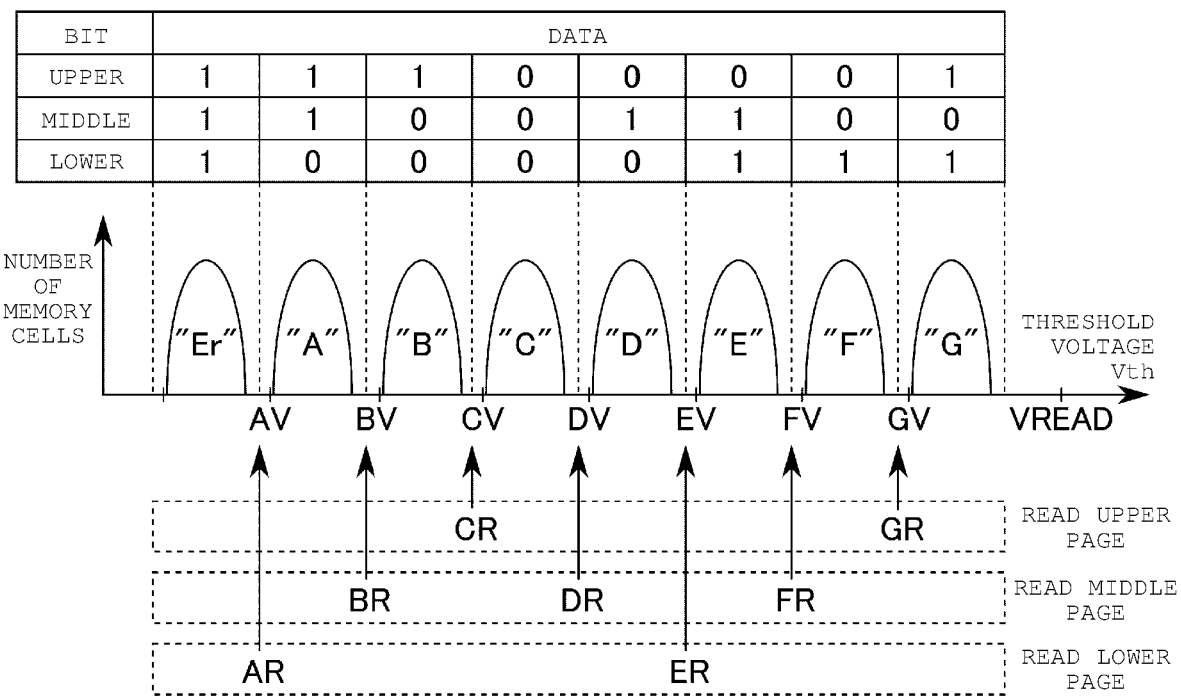
FIG. 5 is a diagram showing a relationship between data and a possible threshold voltage distribution of memory cell transistors in the first embodiment.

FIG. 5 the relationship between the data and the possible threshold voltage distribution of the memory cell transistors MT will be described. Here, as a storage method of storing data in the memory cell transistors MT, an example in which a triple-level cell (TLC) method capable of storing 3-bit data in one memory cell transistor MT is applied is shown. In the present embodiment, the single-level cell (SLC) method capable of storing 1-bit data in one memory cell transistor MT, and the multi-level cell (MLC) method capable of storing 2-bit data in one memory cell transistor MT, the quad-level cell (QLC) method capable of storing 4-bit data in one memory cell transistor MT, and the like, may also be employed when other storage methods are used.

The 3-bit data that can be stored in the memory cell transistor MT is defined by a lower bit, a middle bit, and an upper bit. When the memory cell transistor MT stores 3 bits, the memory cell transistor MT may take any one of eight states corresponding to a plurality of threshold voltages. The eight states are referred to as states "Er", "A", "B", "C", "D", "E", "F", and "G" in order from the lowest. The plurality of memory cell transistors MT belonging to each of the states "Er", "A", "B", "C", "D", "E", "F", and "G" form a distribution of threshold voltage as shown in FIG. 4.

The states "Er", "A", "B", "C", "D", "E", "F", and "G" are, for example, data "111", "110", "100", "000", "010", "011", "001", "101" are assigned, respectively. The arrangement of the bits is "Z, Y, X", where the lower bits "X", the middle bits "Y", and the upper bits "Z" are used. The allocation between the threshold voltage distribution and the data may be set in any manner.

In order to read the data stored in the memory cell transistor MT, which is the read target, the state to which the threshold voltage of the memory cell transistor MT belongs is determined. Read voltages AR, BR, CR, DR, ER, FR, and GR are used to determine the state. Hereinafter, the voltage applied to the memory cell transistor MT, which is the read target, in order to determine the level, including the read voltages AR, BR, CR, DR, ER, FR, and GR, may be referred to as a read voltage VCGRV.

The state "Er" corresponds to, for example, a state where data is erased (erased state). The threshold voltage of the memory cell transistor MT belonging to the state "Er" is lower than the voltage AR and has, for example, a negative value.

The states "A" to "G" correspond to a state where charge is injected into the charge storage layer and data is written to the memory cell transistor MT, and the threshold voltage of the memory cell transistor MT belonging to the states "A" to "G" has, for example, a positive value. The threshold voltage of the memory cell transistor MT belonging to the state "A" is higher than the read voltage AR and equal to or lower than the read voltage BR. The threshold voltage of the memory cell transistor MT belonging to the state "B" is higher than the read voltage BR and equal to or lower than the read voltage CR. The threshold voltage of the memory cell transistor MT belonging to the state "C" is higher than the read voltage CR and equal to or lower than the read voltage DR. The threshold voltage of the memory cell transistor MT belonging to the state "D" is higher than the read voltage DR and is equal to or lower than the read voltage ER. The threshold voltage of the memory cell transistor MT belonging to the state "E" is higher than the read voltage ER and equal to or lower than the read voltage FR. The threshold voltage of the memory cell transistor MT belonging to the state "F" is higher than the read voltage FR and equal to or lower than the read voltage GR. The threshold voltage of the memory cell transistor MT belonging to the state "G" is higher than the read voltage GR and lower than a voltage VREAD.

The voltage VREAD is a voltage applied to the word line WL connected to the memory cell transistor MT of the cell unit CU that is not read, and is higher than the threshold voltage of the memory cell transistor MT in any state. Therefore, the memory cell transistor MT to which the voltage VREAD is applied to the control gate is turned on regardless of the data to be stored.

Further, the verify voltage used in the write operation is set between the adjacent threshold voltage distributions. Specifically, the verify voltages AV, BV, CV, DV, EV, FV, and GV are set corresponding to the states "A", "B", "C", "D", "E", "F", and "G", respectively. For example, the verify voltages AV, BV, CV, DV, EV, FV, and GV are set slightly higher than the read voltages AR, BR, CR, DR, ER, FR, and GR, respectively.

As described above, each memory cell transistor MT is set to any of the eight states and can store 3-bit data. Further, writing and reading are performed in page units in one cell unit CU. When the memory cell transistor MT stores 3-bit data, the lower bit, the middle bit, and the upper bit are assigned to the three pages in one cell unit CU, respectively. A page written through one write operation or a page read through one read operation for the lower bit, middle bit, and upper bit, that is, a set of lower bits, a set of middle bits, and a set of upper bits, which are stored by the cell unit CU, are called a lower page, a middle page, and an upper page, respectively.

When the above data allocation is applied, bit values of the lower page is determined by read operations using the read voltages AR and ER. Bit values of the middle page are determined by read operations using the read voltages BR, DR, and FR. Bit values of the upper page are determined by read operations using the read voltage CR and GR.

1.1.4 Structure of Memory Cell Array 11

Next, an example of the structure of the memory cell array 11 in the semiconductor storage device 10 according to the first embodiment will be described. In the drawings referred to below, X direction corresponds to the extending direction of the word line WL, Y direction corresponds to the extending direction of the bit line BL, and Z direction corresponds to the vertical direction with respect to the surface of the semiconductor substrate on which the semiconductor storage device 10 is formed. The hatch added to the plan view is not necessarily related to the material or property of the element to which the hatch is added. In the present specification, elements such as wiring, contacts, and an insulating layer are appropriately omitted in order to make it easier to see the drawings.

1.1.4.1 Planar Layout (1) of Memory Cell Array 11

Figure 6:
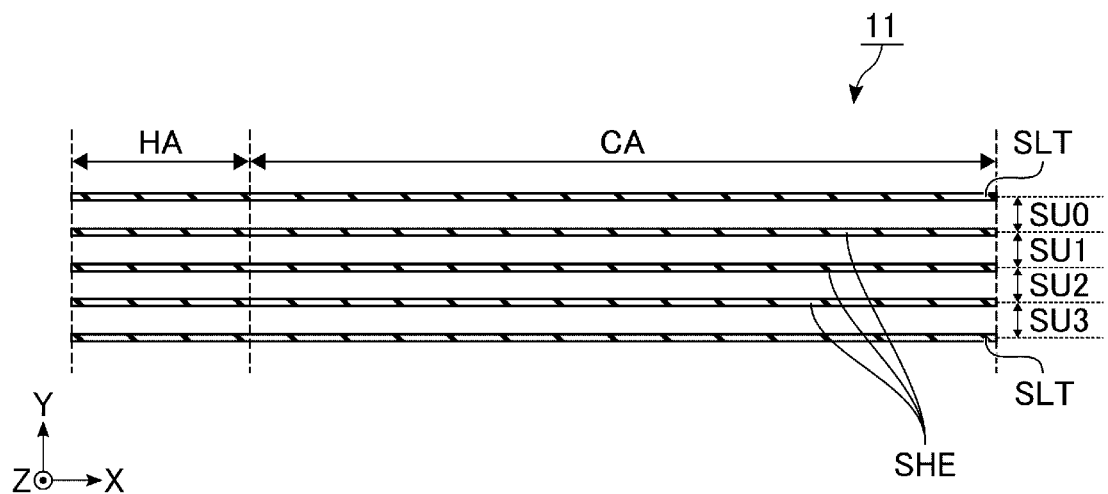
FIG. 6 is a diagram showing a planar layout of the memory cell array in the first embodiment.

FIG. 6 is a diagram showing a planar layout of the memory cell array 11 in the semiconductor storage device 10. FIG. 6 extracts and shows an area corresponding to one block BLKm (that is, string units SU0 to SU3). The memory cell array 11 includes a plurality of slits SLT and a plurality of slits SHE. Further, the planar layout of the memory cell array 11 is divided into a cell area CA and a drawing area HA, for example, in the X direction.

The plurality of slits SLT extend along the X direction and arranged at certain intervals in the Y direction. Further, a plurality of slits SHE are provided between the two slits SLT. The plurality of slits SHE extend along the X direction and arranged at certain intervals in the Y direction.

The slit SLT has a structure including an insulating member inside thereof, is provided in the same wiring layer, and divides adjacent conductive layers via the slit SLT. That is, the slit SLT is a structure including an insulating layer, is provided in the same wiring layer, and insulates and separates adjacent conductive layers. Specifically, the slit SLT divides, for example, a plurality of wiring layers corresponding to the word lines WL0 to WL7 and the select gate lines SGD and SGS, respectively.

The slit SHE has a structure including an insulating member inside thereof, is provided in the same wiring layer, and divides adjacent conductive layers via the slit SHE. Specifically, the slit SHE divides, for example, a plurality of wiring layers corresponding to the select gate line SGD.

The cell area CA is an area in which the NAND string NS is formed. The drawing area HA is an area in which a contact for electrically connecting the word line WL and the select gate lines SGD and SGS, which are connected to the NAND string NS, and the row decoder 18 is formed. The drawing area HA is disposed, for example, on one side of the memory cell array 11 in the X direction to be adjacent to the cell area CA.

In the planar layout of the memory cell array 11 described above, each of the areas separated by the slit SLT and the slit SHE or the two slits SHE corresponds to one string unit SU. That is, in this example, the string units SU0 to SU3 extended in the X direction are arranged in the Y direction. Then, for example, the layout shown in FIG. 6 is repeatedly arranged in the Y direction on the memory cell array 11.

Figure 7:
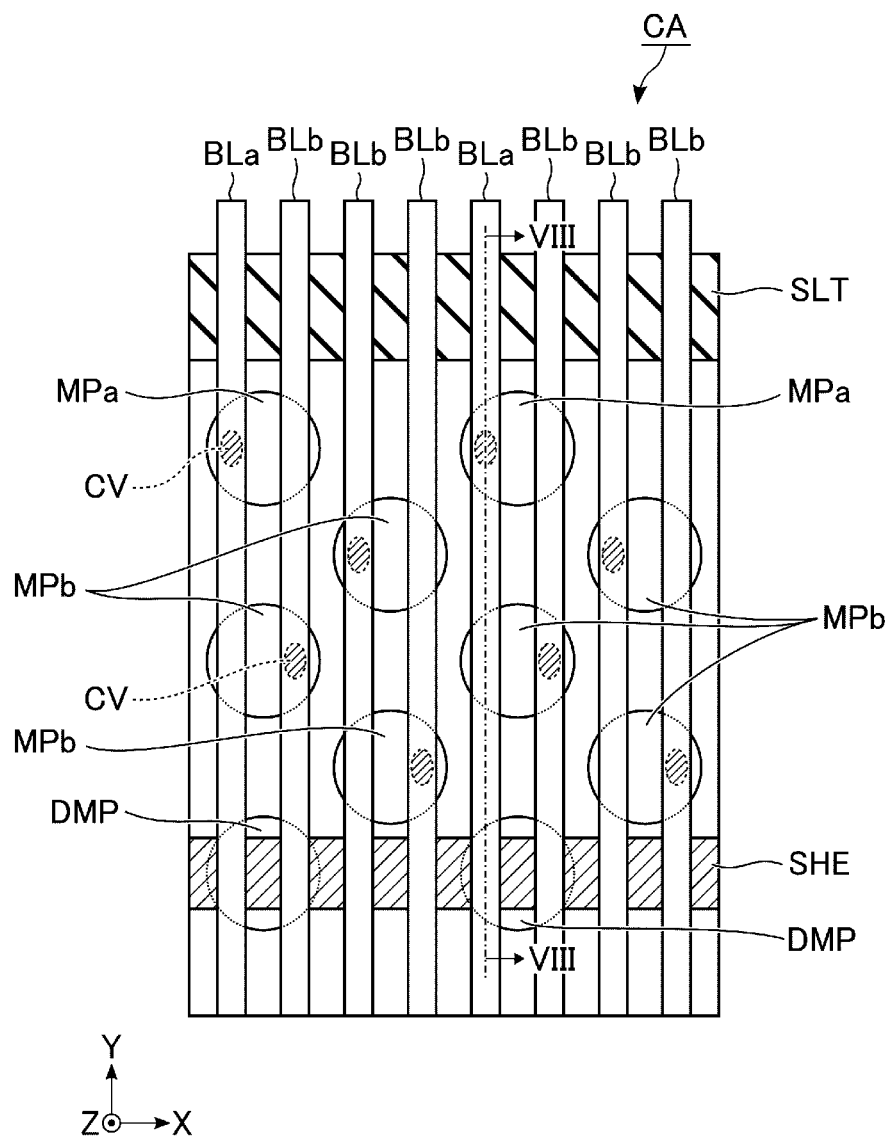
FIG. 7 is a diagram showing an example of a planar layout of a cell area of the memory cell array in the first embodiment.

FIG. 7 is a diagram showing an example of a detailed planar layout in the cell area CA of the memory cell array 11 in the semiconductor storage device 10. FIG. 7 extracts and shows a part of the area corresponding to the string unit SU between the slit SLT and the slit SHE. The cell area CA includes, for example, a plurality of memory pillars MPa and MPb, a plurality of dummy memory pillars DMP, a plurality of bit lines BLa and BLb, and a plurality of contacts CV. Hereinafter, a case where the term "bit line BL" refers to each of the bit lines BLa and BLb is described. Further, a case where the term "memory pillar MP" refers to each of the memory pillars MPa and MPb is described.

In the planar layout, the memory pillar MPa is a memory pillar arranged adjacent to or in the vicinity of the slit SLT. The memory pillar MPb is a memory pillar that is not adjacent to the slit SLT or is not arranged in the vicinity of the slit SLT. The dummy memory pillar DMP is a memory pillar overlapping the slit SHE in the planar layout shown in FIG. 7. The dummy memory pillar DMP is not electrically connected to the bit line BL.

Each of the memory pillars MPa and MPb functions as one NAND string NS. The plurality of memory pillars MPa and MPb are arranged in a staggered shape in four rows, for example, in the area between the adjacent slit SLT and the slit SHE, and between the two slits SHE. The dummy memory pillar DMP does not function as a NAND string NS. The plurality of dummy memory pillars DMP overlap the slit SHE while following the arrangement rules of the memory pillars MPa and MPb.

The number and arrangement of the memory pillars MPa and MPb, and the dummy memory pillar DMP between the adjacent slit SLT and the slit SHE and between the two slits SHE may be appropriately changed without limitation.

The plurality of bit lines BLa and BLb, each extending along the Y direction, are arranged in the X direction. Each of the bit lines BLa and BLb overlaps with at least one memory pillar MP for each string unit SU. In this example, the two bit lines overlap each other in each of the memory pillars MPa and MPb.

Of the bit lines BLa and BLb overlapping the memory pillar MPa, the contact CV is provided between the bit line BLa and the memory pillar MPa. Each of the memory pillars MPa is electrically connected to the corresponding bit line BLa via the contact CV. The contact CV is provided between one bit line BLb and the memory pillar MPb among the bit lines BLa and BLb overlapping the memory pillar MPb or the plurality of bit lines BLb. Each of the memory pillars MPb is electrically connected to the corresponding bit line BLb via the contact CV.

Figure 8:
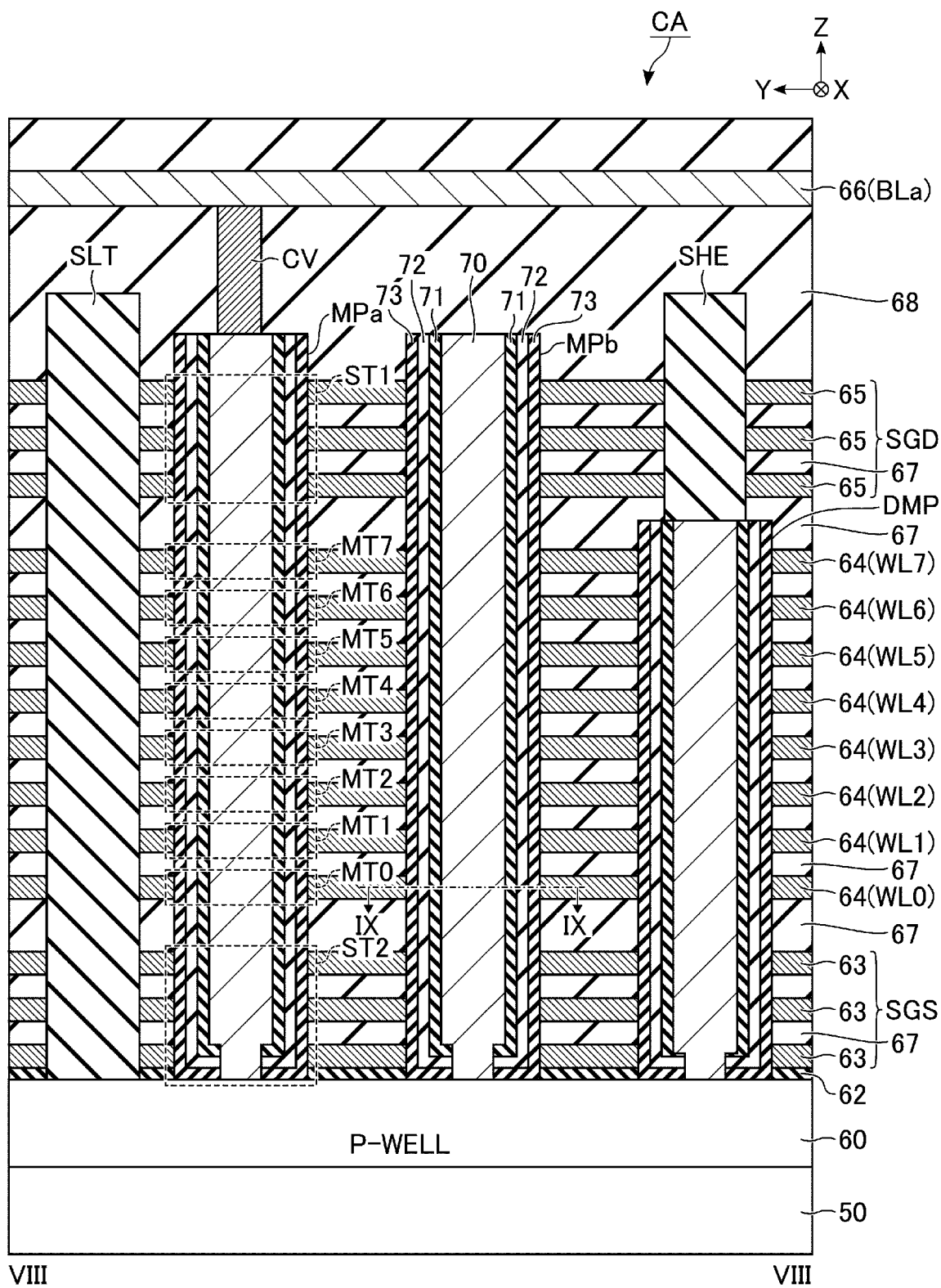
FIG. 8 is a cross-sectional diagram of the memory cell array taken along a line VIII-VIII in FIG. 7.

FIG. 8 is a cross-sectional diagram of the of the memory cell array 11 taken along the line VIII-VIII of FIG. 7, showing a cross-sectional structure of the memory cell array 11 in the semiconductor storage device 10 in the cell area CA. As shown in FIG. 8, the memory cell array 11 includes a semiconductor substrate 50, a p-type well area 60, insulating layers 62, 67, and 68, and conductive layers 63, 64, . . . , and 66.

The p-type well area 60 is provided in the vicinity of the surface of the semiconductor substrate 50. The insulating layer 62 is provided on the p-type well area 60. The conductive layer 63 and the insulating layer 67 are alternately stacked on the insulating layer 62. The conductive layer 63 is formed in a plate shape along the XY plane, for example. The plurality of stacked conductive layers 63 are used as the select gate line SGS. The conductive layer 63 contains, for example, tungsten (W).

Above the conductive layer 63 on the uppermost layer, the conductive layer 64 and the insulating layer 67 are alternately stacked. The conductive layer 64 is formed, for example, in a plate shape along an XY plane. The plurality of stacked conductive layers 64 are used as word lines WL0 to WL7 in order from the p-type well area 60 side. The conductive layer 64 contains, for example, tungsten (W).

Above the conductive layer 64 on the uppermost layer, the conductive layer 65 and the insulating layer 67 are alternately stacked. The conductive layer 65 is formed, for example, in a plate shape along an XY plane. The plurality of stacked conductive layers 65 are used as the select gate line SGD. The conductive layer 65 contains, for example, tungsten (W).

A conductive layer 66 is provided above the conductive layer 65 on the uppermost layer via the insulating layer 68. The conductive layer 66 is formed in a line shape extending in the Y direction, for example. The conductive layer 66 is used as the bit line BLa. That is, in an area (not shown), the plurality of conductive layers 66 are arranged along the X direction. The conductive layer 66 contains, for example, copper (Cu).

Each of the memory pillars MPa and MPb extends along the Z direction and penetrates the insulating layers 62 and 67 and the conductive layers 63 to 65. The bottoms of the memory pillars MPa and MPb are in contact with the p-type well area 60. Each of the memory pillars MPa and MPb includes, for example, a semiconductor layer 70, a tunnel insulating layer 71, an insulating layer 72, and a block insulating layer 73.

The dummy memory pillar DMP extends along the Z direction and penetrates the insulating layers 62 and 67 and the conductive layers 63 and 64. The bottom of the dummy memory pillar DMP is in contact with the p-type well area 60. The dummy memory pillar DMP includes, for example, the semiconductor layer 70, the tunnel insulating layer 71, the insulating layer 72, and the block insulating layer 73.

The semiconductor layer 70 extends along the Z direction. For example, the upper end of the semiconductor layer 70 is positioned above the conductive layer 65 on the uppermost layer, and the lower end of the semiconductor layer 70 is in contact with the p-type well area 60. The tunnel insulating layer 71 covers the side surface of the semiconductor layer 70. The insulating layer 72 covers the side surface of the tunnel insulating layer 71. The block insulating layer 73 covers the side surface of the insulating layer 72. Each of the tunnel insulating layer 71 and the block insulating layer 73 contains, for example, silicon oxide ($SiO_2$) The insulating layer 72 contains, for example, silicon nitride (SiN).

The columnar contact CV is provided on the semiconductor layer 70 in the memory pillars MPa and MPb. Of the two memory pillars MPa and MPb, the contact CV corresponding to the memory pillar MPa is shown in the area shown in FIG. 8.

One conductive layer 66, that is, one bit line BLa is in contact with the upper surface of the contact CV. As described above, one contact CV is connected to one conductive layer 66 in each of the slit SLT and the slit SHE, or the space separated by the two slits SHE. That is, one memory pillar MPa or MPb is electrically connected to each of the conductive layers 66 between two adjacent slits.

The slit SLT is formed in a plate shape along, for example, an XZ plane, and divides the insulating layers 62 and 67 and the conductive layers 63 to 65. The upper end of the slit SLT is positioned between the conductive layer 65 and the conductive layer 66 on the uppermost layer. The lower end of the slit SLT is in contact with the p-type well area 60.

The slit SHE is provided on the semiconductor layer 70 in the dummy memory pillar DMP. The slit SHE is formed in a plate shape along, for example, the XZ plane, and divides the insulating layer 67 and the conductive layer 65. The upper end of the slit SHE is positioned between the conductive layer 65 and the conductive layer 66 on the uppermost layer. The lower end of the slit SHE is in contact with the upper end of the dummy memory pillar DMP.

FIG. 8 shows a cross section along the YZ plane passing through the bit line BLa. The cross section of the YZ plane passing through the bit line BLb has a structure similar to the cross section shown in FIG. 8 except that the contact CV is provided on the memory pillar MPb instead of on the memory pillar MPa.

Figure 9:
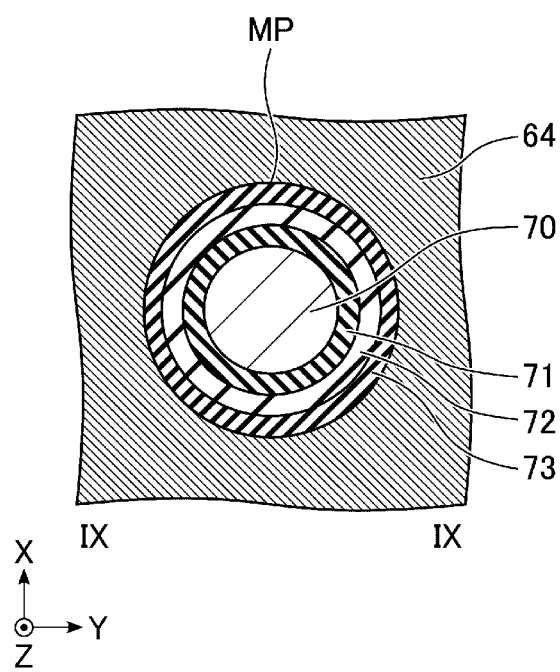
FIG. 9 is a cross-sectional diagram of the memory cell array taken along a line IX-IX in FIG. 8.

FIG. 9 is a cross-sectional diagram of the memory cell array 11 taken along the line IX-IX of FIG. 8 and shows a cross-sectional structure of the memory pillar MP in the semiconductor storage device 10. FIG. 9 extracts and shows a cross section of the memory pillar MP on a layer parallel to the surface of the semiconductor substrate 50 and including the conductive layer 64. The semiconductor layer 70 is provided, for example, in the central portion of the memory pillar MP. The tunnel insulating layer 71 surrounds the side surface of the semiconductor layer 70. The insulating layer 72 surrounds the side surface of the tunnel insulating layer 71. The block insulating layer 73 surrounds the side surface of the insulating layer 72. The conductive layer 64 surrounds the side surface of the block insulating layer 73.

In the structure of the memory pillar MP described above, a part where the memory pillar MP and the conductive layer 63 intersect functions as the select transistor ST2. A part where the memory pillar MP and the conductive layer 64 intersect functions as a memory cell transistor MT. A part where the memory pillar MP and the conductive layer 65 intersect functions as the select transistor ST1. That is, the semiconductor layer 70 functions as channels of the memory cell transistors MT0 to MT7 and the select transistors ST1 and ST2, respectively. The insulating layer 72 functions as a charge storage layer of the memory cell transistor MT.

Here, although the bit line connected to the memory pillar MPa is defined as BLa in FIG. 7, in the string unit SU (not shown), the bit line BLa may be connected to the memory pillar MPb. Whether the memory pillar MPa or MPb is connected to the bit line BL for each string unit SU is managed by the sequencer 16. The sequencer 16 controls the read operation described above and the write operation described below depending on whether the memory pillar MPa or MPb is connected to the bit line BL.

1.1.4.2 Planar Layout (2) of Memory Cell Array 11

In the planar layout (1) shown in FIG. 7, the dummy memory pillar DMP is disposed under the slit SHE. However, in this planar layout (2), instead of the dummy memory pillar DMP, a normal memory pillar, that is, the memory pillar MP having the memory cell transistor MT is disposed under the slit SHE. The planar layout (2) mainly describes the differences from the planar layout (1).

Figure 10:
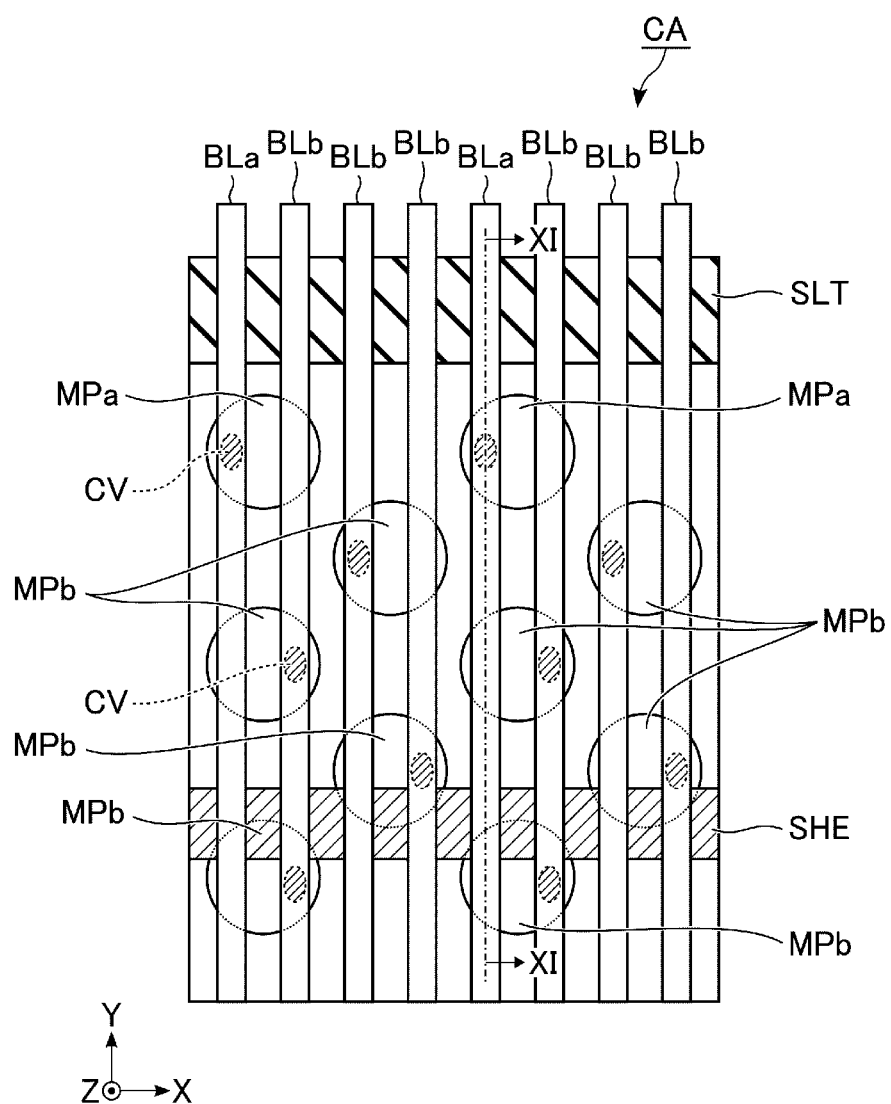
FIG. 10 is a diagram showing another example of the planar layout of the cell area of the memory cell array in the first embodiment.

FIG. 10 is a diagram showing another example of a detailed planar layout in the cell area CA of the memory cell array 11 in the semiconductor storage device 10. FIG. 10 extracts and shows a part of the area corresponding to the string unit SU between the slit SLT and the slit SHE. The memory pillar MPa is a memory pillar adjacent to or in the vicinity of the slit SLT. The memory pillar MPb is a memory pillar other than the memory pillar MPa. That is, the memory pillar MPb is a memory pillar that is not adjacent to the slit SLT or is not arranged in the vicinity of the slit SLT. Some memory pillars MPb overlap the slit SHE.

Each of the memory pillars MPa and MPb functions as one NAND string NS. The plurality of memory pillars MPa and MPb are arranged in a staggered shape in four rows, for example, in the area between the adjacent slit SLT and the slit SHE, and between the two slits SHE. Of the bit lines BLa and BLb overlapping the memory pillar MPa, the contact CV is provided between the bit line BLa and the memory pillar MPa. Each of the memory pillars MPa is electrically connected to the corresponding bit line BLa via the contact CV. The contact CV is provided between one bit line BLb and the memory pillar MPb among the bit lines BLa and BLb overlapping the memory pillar MPb or the plurality of bit lines BLb. Each of the memory pillars MPb is electrically connected to the corresponding bit line BLb via the contact CV. Furthermore, the contact CV is provided between one bit line BLa or BLb and the memory pillar MPb among the bit lines BLa and BLb overlapping the memory pillar MPb or the plurality of bit lines BLb, which overlap the slit SHE.

The memory pillar MPb overlapping the slit SHE is electrically connected to the corresponding bit line BLa or BLb via the contact CV.

The other structures shown in FIG. 10 are similar to those shown in FIG. 8.

Figure 11:
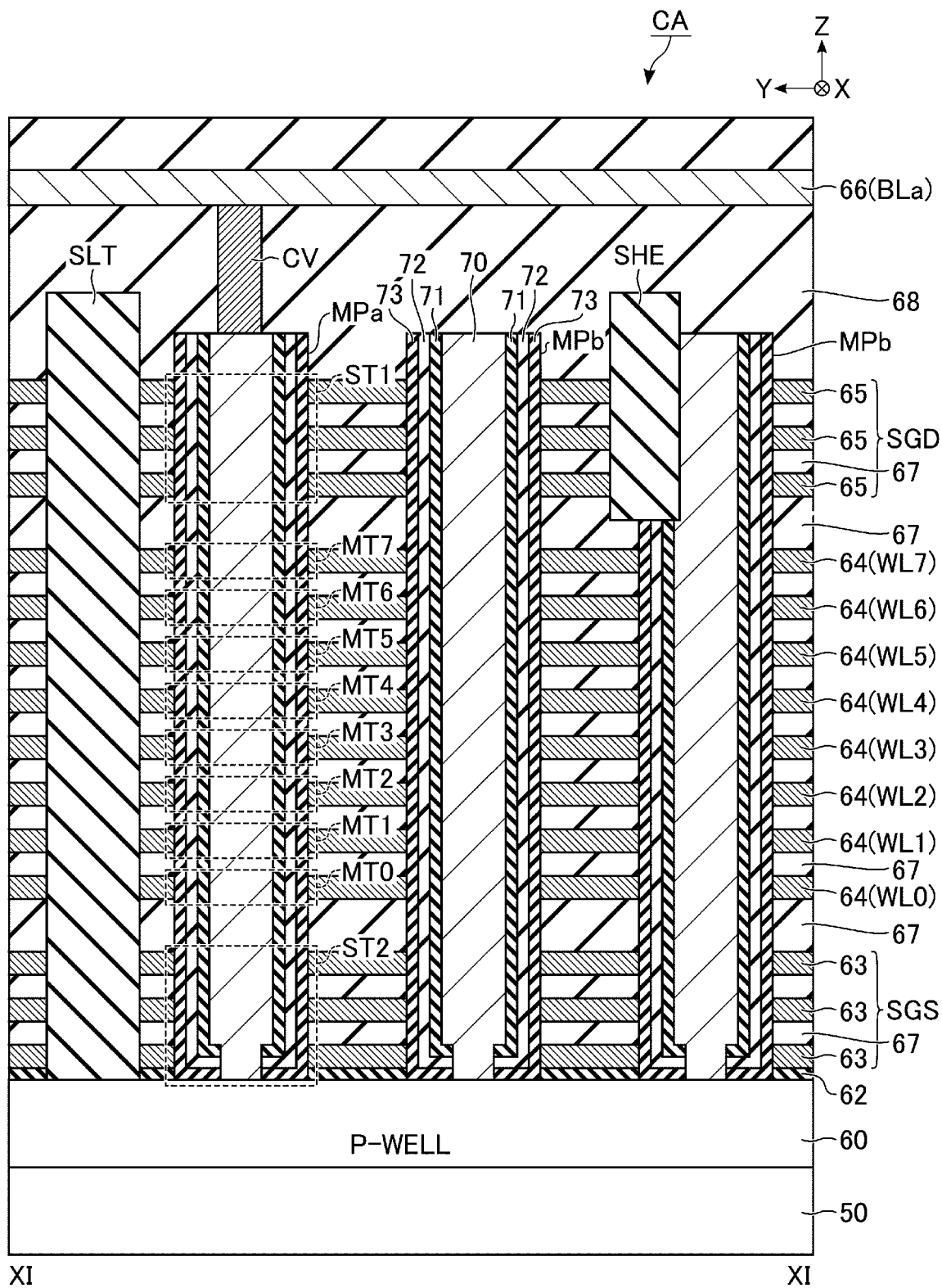
FIG. 11 is a cross-sectional diagram of the memory cell array taken along a line XI-XI in FIG. 10.

FIG. 11 is a cross-sectional diagram of the memory cell array 11 taken along the line XI-XI of FIG. 10, showing a cross-sectional structure of the memory cell array 11 in the semiconductor storage device 10 in the cell area CA.

As shown in FIG. 11, the memory pillar MPb is provided in the vicinity of the slit SHE. That is, the slit SHE is provided on a part of the memory pillar MPb. The slit SHE is in contact with the memory pillar MPb.

The slit SHE is formed in a shape along, for example, the XZ plane, and divides the insulating layer 67 and the conductive layer 65. The upper end of the slit SHE is positioned between the conductive layer 65 and the conductive layer 66 on the uppermost layer. The lower end of the slit SHE is positioned between the conductive layer 64 on the uppermost layer and the conductive layer 65 on the lowermost layer.

The columnar contact CV is provided on the semiconductor layer 70 in the memory pillar MPb in the vicinity of the slit SHE. The conductive layer 66 (that is, one bit line BLa) is in contact with the upper surface of the contact CV.

As described above, one contact CV is connected to the conductive layer 66 in each of the space separated by the slit SLT and the slit SHE, and the space separated by the slit SHE and the slit SHE (not shown). That is, one memory pillar MPa or MPb is electrically connected to each of the conductive layers 66 between two adjacent slits.

The other structures shown in FIGS. 10 and 11 are similar to those shown in FIGS. 7 and 8.

1.2 Operation of Semiconductor Storage Device

The read operation and the write operation performed in the semiconductor storage device 10 according to the first embodiment will be described. In the following, the memory cell transistor in the memory pillar MPa in the vicinity of the slit SLT shown in FIGS. 7 and 10 is referred to as a memory cell MCa, and the memory cell transistors in the other memory pillar MPb are referred to as a memory cell MCb. Further, a case where the term "memory cell MC" refers to each of the memory cells MCa and MCb is described.

For example, when a write operation is executed for the memory cells MCa and MCb provided in the memory cell array 11 using the same write voltage VPGM without applying the present embodiment, a phenomenon in which the write speeds for the memory cells MCa and MCb are different may occur. The write speed refers to the level of the threshold voltage written into the plurality of memory cells when the write operation is executed with respect to the memory cells using the write voltages of the same voltage level. For example, when the threshold voltage written into the first memory cell is lower than the threshold voltage written into the second memory cell, the write speed of the first memory cell is referred to be slower than the write speed of the second memory cell.

In this example, the write speed of the memory cell MCa may be slower than the write speed of the memory cell MCb. That is, the write speed satisfies MCa<MCb. In this case, the threshold voltage of the memory cells MCa and MCb satisfies Vtha<Vthb, where Vtha and Vthb are the threshold voltages of the memory cells MCa and MCb, respectively.

To address this issue, in the first embodiment, the following first, second, and third examples of the read operation, or the first and second examples of the write operation are executed for the memory cell MCa and the memory cell MCb.

When the first example, the second example, or the third example of the read operation of the present embodiment is executed, the first example and the second example of the write operation are not executed, and the normal write operation is executed. That is, in the present embodiment, when the first example, the second example, or the third example of the read operation is executed for the memory cells MCa and MCb, in the write operation for the memory cells MCa and MCb executed before the read operation, the threshold voltage Vtha of the memory cell MCa is set lower than the threshold voltage Vthb of the memory cell MCb.

1.2.1 Read Operation (First Example)

Next, a first example of the read operation in the first embodiment will be described. In the first example of the read operation, depending on whether a memory cell of a read target is disposed in the vicinity of the slit SLT, that is, depending on whether the read target is the memory cell MCa or MCb, the voltage applied to the bit lines BLa and BLb respectively connected to the memory cells MCa and MCb changes.

Figure 12:
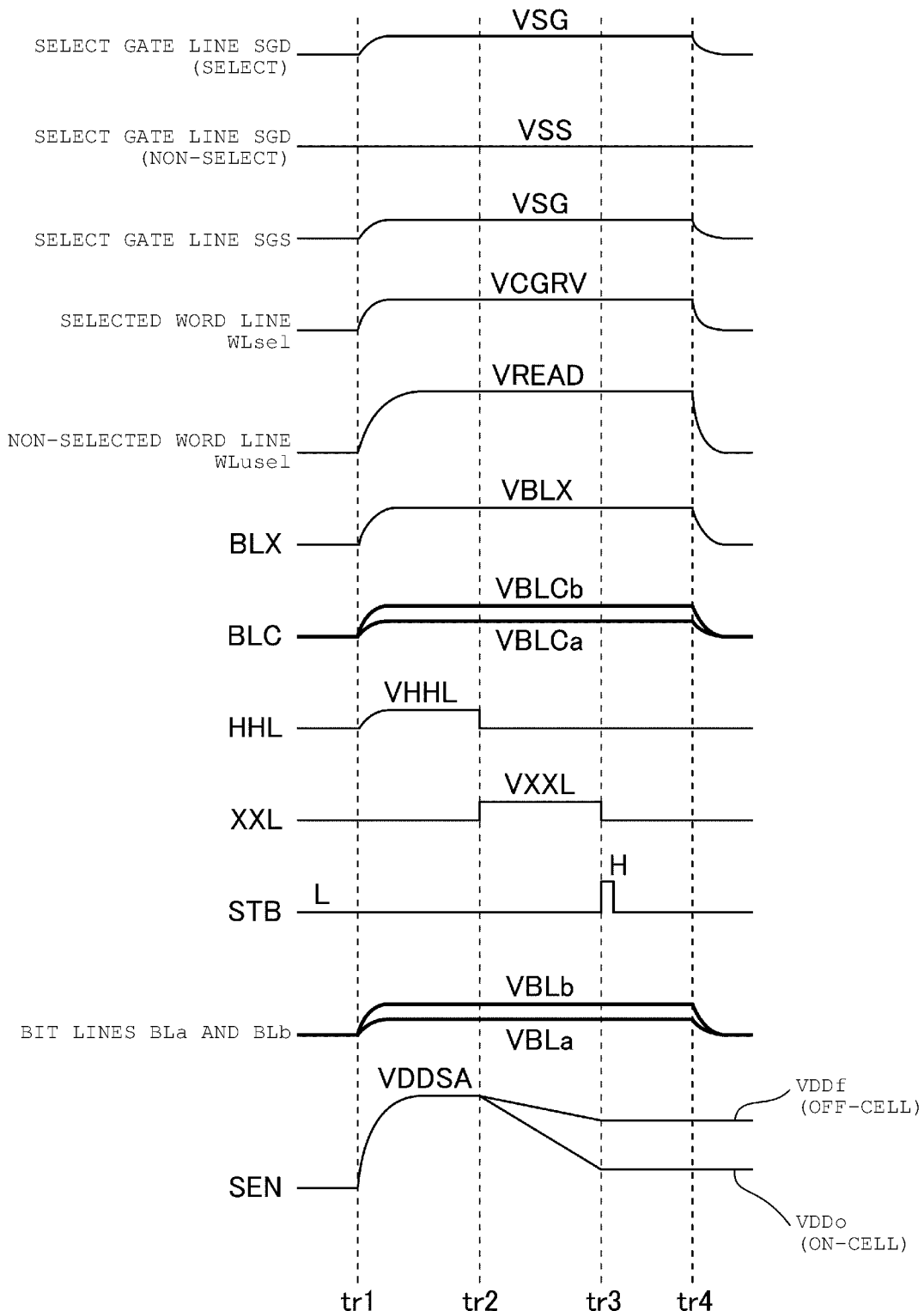
FIG. 12 is a timing chart of voltages of a select gate line, a word line, a bit line, and a control signal according to a first example of a read operation in the first embodiment.

FIG. 12 is a timing chart of voltages of the select gate line, the word line, the bit line, and the control signal according to the first example of the read operation in the first embodiment. In the following, the memory cell transistor MT in the cell unit CU of the read target is referred to as a selected memory cell. The word line WL connected to the selected memory cell is referred to as a selected word line WLsel. The memory cell transistor MT in the cell unit CU of a non-read target is referred to as a non-selected memory cell. The word line WL connected to the non-selected memory cell is referred to as a non-selected word line WLusel.

In the read operation, the voltage generated by the voltage generation circuit 17 is applied to the selected word line WLsel and the non-selected word line WLusel via the row decoder 18. The voltage VDDSA generated by the voltage generation circuit 17 is applied to the node of the voltage VDDSA shown in FIG. 4. Furthermore, it is assumed that the sense node SEN is appropriately charged during the read operation.

Further, a voltage clamped by the transistors T1 and T4 is applied to the bit line BL. For example, during the read operation, a voltage VBLa is applied to the bit line BLa connected to the selected memory cell MCa in the vicinity of the slit SLT. A voltage VBLb is applied to the bit line BLb connected to the selected memory cell MCb that is not arranged in the vicinity of the slit SLT. The voltage VBLa is a voltage lower than the voltage VBLb.

It is assumed that the voltage of the node INV of the latch circuit SDL in the sense amplifier unit SAUr of which the read data is not determined is set to the "L" level. That is, in the sense amplifier unit SAUr of which the read data is not determined, the transistor T0 is in the on state and the transistor T5 is in the off state.

As shown in FIG. 12, the sequencer 16 executes the read operation using the read voltage VCGRV during the period from time tr1 to tr4. The details of the read operation will be described below.

In the state before time tr1, each voltage of each of the select gate lines SGD and SGS, the selected word line WLsel, the non-selected word line WLusel, the control signal BLX, BLC, HHL, XXL, and STB, the bit line BL, and the source line SL (not shown), is set to, for example, the ground voltage VSS.

At time tr1, the row decoder 18 applies a voltage VSG to the select gate line (hereinafter, selected select gate line) SGD and the select gate line SGS of the string unit SU including the cell unit CU which is the read target. Furthermore, the row decoder 18 applies the voltage VSS to the select gate line (hereinafter, non-selected select gate line) SGD of the string unit SU that does not include the cell unit CU which is the read target. The voltage VSG is a voltage that turns on the select transistors ST1 and ST2 corresponding to the selected string unit SU.

Further, at time tr1, the row decoder 18 applies the read voltage VCGRV to the selected word line WLsel. Furthermore, the row decoder 18 applies a voltage VREAD to the non-selected word line WLusel. The voltage VREAD is a voltage that turns on the memory cell MCa or MCb regardless of the data stored in the memory cell MCa or MCb.

Further, at time tr1, the sequencer 16 raises the voltage of the control signal BLX from the voltage VSS to a voltage VBLX, for example. Further, the sequencer 16 raises the voltage of the control signal BLC of the transistor 14 connected to the selected memory cell MCa via the bit line BLa from the voltage VSS to a voltage VBLCa. Furthermore, the sequencer 16 raises the voltage of the control signal BLC of the transistor T4 connected to the selected memory cell MCb via the bit line BLb from the voltage VSS to a voltage VBLCb. The voltage VBLCa is a voltage lower than the voltage VBLCb.

Specifically, the sequencer 16 can transmit the control signal BLC which is different for each transistor 14 of the sense amplifier unit SAUr in the sense amplifier 21. The sequencer 16 transmits, for example, the control signal BLC (that is, voltage VBLCa) for clamping the voltage of the bit line BLa to VBLa, to the gate of the transistor 14 connected to the bit line BLa. Meanwhile, the sequencer 16 transmits, for example, the control signal BLC (that is, voltage VBLCb) for clamping the voltage of the bit line BLb to the voltage VBLb, to the gate of the transistor T4 connected to the bit line BLb. As a result, the sense amplifier unit SAU in the sense amplifier 21 applies the voltage VBLa to the bit line BLa connected to the selected memory cell MCa, and applies the voltage VBLb to the bit line BLb connected to the selected memory cell MCb, respectively.

Further, at time tr1, the sequencer 16 raises the voltage of the control signal HHL from the voltage VSS to a voltage VHHL. The sequencer 16 also supplies the node to be at voltage VDDSA with the voltage VDDSA generated by the voltage generation circuit 17. When the voltage of the control signal HHL rises to the voltage VHHL, the transistor T2 is turned on and the sense node SEN is charged to the voltage VDDSA. When the charging of the sense node SEN is completed, the sequencer 16 lowers the voltage of the control signal HHL to the voltage VSS.

Next, at time tr2, the sequencer 16 raises the voltage of the control signal XXL from the voltage VSS to a voltage VXXL. When the voltage of the control signal XXL rises to the voltage VXXL, the transistor T3 is turned on, and the voltage of the sense node SEN changes according to the threshold voltage of the selected memory cell MCa or MCb. Specifically, when the selected memory cell MCa or MCb is in the on state, the voltages of the sense nodes SEN respectively connected to the bit lines BLa and BLb are lowered to a voltage VDDo.

Here, as described above, the threshold voltage of the memory cell MCa is lower than the threshold voltage of the memory cell MCb. Therefore, when the read voltage VCGRV is applied to the selected word line WLsel, the memory cell MCa causes a larger current than that of the memory cell MCb to flow. However, the voltage of the bit line BLa is lower than that of the bit line BLb. That is, the voltage VBLCa applied to the gate of the transistor T4 connected to the bit line BLa is lower than the voltage VBLCb applied to the gate of the transistor T4 connected to the bit line BLb. Therefore, due to this, the current flowing through the bit line BLa is limited by the bit line BLb, and becomes substantially the same as the current flowing through the bit line BLb. That is, the memory cell MCa causes a larger current than that of the memory cell MCb to flow, but the transistor T4 connected to the bit line BLa clamps the current flowing through the bit line BLa because the voltage VBLCa is applied to the gate. On the other hand, the memory cell MCb causes a smaller current than that of the memory cell MCa to flow, but since the voltage VBLCb higher than the voltage VBLCa is applied to the gate of the transistor T4 connected to the bit line BLb, the transistor T4 connected to the bit line BLb causes a larger current than that of the transistor T4 connected to the bit line BLa to flow. As a result, at time tr2 to tr3, the current flowing through the bit line BLa and the current flowing through the bit line BLb are set to have substantially the same current value. As a result, the voltage of the sense node SEN connected to the memory cell MCa is lowered to the voltage VDDo. Similarly, the voltage of the sense node SEN connected to the memory cell MCb is also lowered to the voltage VDDo.

On the other hand, when the selected memory cell MCa is in the off state, the voltage of the sense node SEN connected to the bit line BLa is maintained at a voltage VDDf higher than the voltage VDDo. Similarly, when the selected memory cell MCb is in the off state, the voltage of the sense node SEN connected to the bit line BLb is maintained at a voltage VDDf higher than the voltage VDDo.

Next, at time tr3, after the currents flowing through the bit lines BLa and BLb are reflected in the sense node SEN, the sequencer 16 lowers the voltage of the control signal XXL from the voltage VXXL to the voltage VSS. When the voltage of the control signal XXL is lowered to the voltage VSS, the transistor T3 is turned off and the voltage of the sense node SEN is fixed.

After this, the sequencer 16 asserts the control signal STB and determines bit values of the data stored in the selected memory cells MCa and MCb, respectively. Specifically, the sequencer 16 raises the voltage of the control signal STB from the "L" level to the "H" level. When the voltage of the control signal STB rises to the "H" level, the transistor T7 is turned on, and the voltage of the latch circuit SDL of the sense amplifier unit SAUr changes depending on the voltage VDDo or VDDf of the sense node SEN applied to the gate of the transistor T6. Then, the sequencer 16 determines the bit value of the data stored in the selected memory cell MCa based on the voltage of the latch circuit SDL of the sense amplifier unit SAUr connected to the bit line BLa. Similarly, the bit value of the data stored in the selected memory cell MCb is determined based on the voltage of the latch circuit SDL of the sense amplifier unit SAUr connected to the bit line BLb.

That is, the sense amplifier unit SAUr connected to the bit line BLa senses whether or not the threshold voltage of the selected memory cell MCa is higher than the read voltage VCGRV, and stores the sense result in the latch circuit SDL. Similarly, the sense amplifier unit SAUr connected to the bit line BLb senses whether or not the threshold voltage of the selected memory cell MCb is higher than the read voltage VCGRV, and stores the sense result in the latch circuit SDL. The sequencer 16 determines bit values of the data stored in the selected memory cells MCa and MCb, respectively, based on the sense results stored in the latch circuit SDL of the sense amplifier unit SAUr. According to the above, the first example of the read operation using the read voltage VCGRV is completed.

As described above, in the first example of the read operation, even when the threshold voltages of the selected memory cells MCa and MCb are different within the threshold voltage distribution of the same state, that is, even when the threshold voltage of the selected memory cells MCa is lower than the threshold voltage of the selected memory cell MCb within the threshold voltage distribution of the same state, the voltages VDDo used for determination when the selected memory cells MCa and MCb are respectively on-cell can be set to be substantially the same voltage level. As a result, in the write operation, it is possible to reduce the problem caused by setting the threshold voltage of the memory cell MCa in the vicinity of the slit SLT to be lower than the threshold voltage of the memory cell MCb.

Furthermore, in the above description, the voltage supplied to the bit line BL during the read operation is changed depending on whether the memory cell is the memory cell MCa in the vicinity of the slit SLT or the other memory cell MCb. Furthermore, depending on whether the memory cell MCa is disposed above or below the memory pillar MPa among the memory cells MCa in the memory pillar MPa in the vicinity of the slit SLT, the voltage supplied to the bit line BLa during the read operation may be changed. For example, during the read operation, the voltage of the bit line BLa is set to VBLau for the memory cell MCa arranged above the memory pillar MPa shown in FIG. 8, and the voltage of the bit line BLa is set to VBLal for the memory cell MCa arranged below the memory pillar MPa. The voltage VBLau is a voltage lower than the voltage VBLal. As a result, the read operation can be executed even for the memory cells MCa positioned above or below the memory pillar MPa under the read conditions according to the write characteristics of the memory cells.

1.2.2 Read Operation (Second Example)

Next, a second example of the read operation in the first embodiment will be described. In the second example of the read operation, depending on whether the memory cell of the read target is disposed in the vicinity of the slit SLT, that is, depending on whether the read target is the memory cell MCa or MCb, the sense time for sensing the data respectively stored in the memory cells MCa and MCb changes. In this second example, the sense time is a period during which the control signal XXL is maintained in the asserted state (for example, "H" level).

Figure 13:
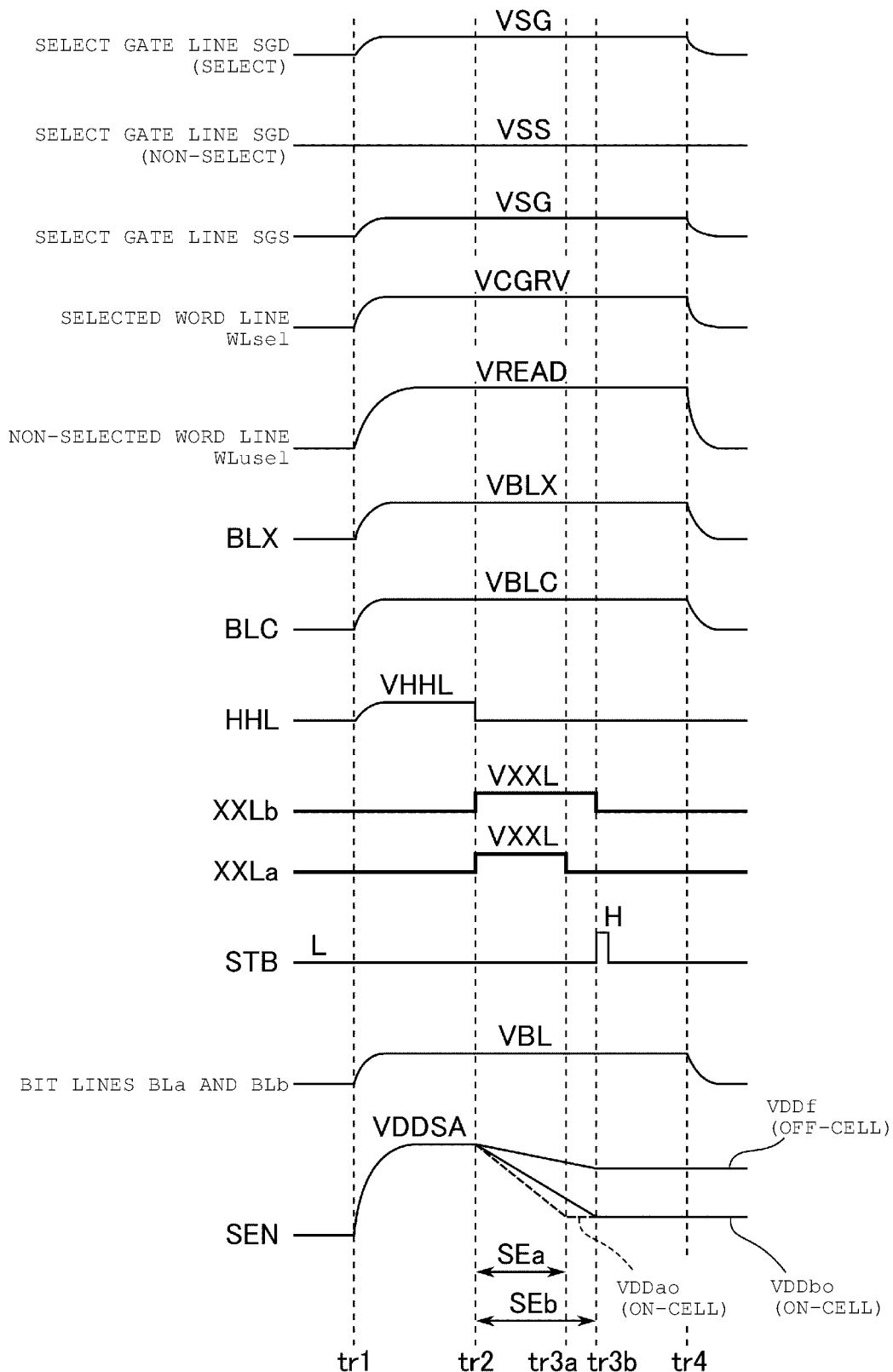
FIG. 13 is a timing chart of voltages of a select gate line, a word line, a bit line, and a control signal according to a second example of the read operation in the first embodiment.

FIG. 13 is a timing chart of voltages of the select gate line, the word line, the bit line, and the control signal according to the second example of the read operation in the first embodiment. In the following, the control signal applied to the gate of the transistor T3 connected to the memory cell MCa in the vicinity of the slit SLT via the bit line BLa is referred to as XXLa, and the control signal applied to the gate of the transistor T3 connected to the memory cell MCb not arranged in the vicinity of the slit SLT via the bit line BLb is referred to as XXLb.

As shown in FIG. 13, the sequencer 16 executes the read operation using the read voltage VCGRV during the period from time tr1 to tr4. The details of the read operation will be described below.

At time tr1, the row decoder 18 applies the voltage VSG to the selected select gate line SGD and the select gate line SGS. Furthermore, the row decoder 18 applies the voltage VSS to the non-selected select gate line SGD.

Further, at time tr1, the row decoder 18 applies the read voltage VCGRV to the selected word line WLsel. Furthermore, the row decoder 18 applies a voltage VREAD to the non-selected word line WLusel.

Further, at time tr1, the sequencer 16 raises the voltage of the control signal BLX from the voltage VSS to a voltage VBLX, for example. Further, the sequencer 16 raises the voltage of the control signal BLC of the transistor T4 connected to the selected memory cell MCa via the bit line BLa from the voltage VSS to a voltage VBLC. Similarly, the sequencer 16 raises the voltage of the control signal BLC of the transistor T4 connected to the selected memory cell MCb via the bit line BLb from the voltage VSS to the voltage VBLC.

Specifically, the sequencer 16 transmits, for example, the control signal BLC (that is, voltage VBLC) for clamping the voltage of the bit line BLa to the voltage VBL, to the gate of the transistor 14 connected to the bit line BLa. Similarly, the sequencer 16 transmits, for example, the control signal BLC for clamping the voltage of the bit line BLb to the voltage VBL, to the gate of the transistor T4 connected to the bit line BLb. As a result, the sense amplifier 21 applies the voltage VBL to the bit line BLa connected to the selected memory cell MCa. Similarly, the sense amplifier 21 applies the voltage VBL to the bit line BLb connected to the selected memory cell MCb.

Further, at time tr1, the sequencer 16 raises the voltage of the control signal HHL from the voltage VSS to a voltage VHHL. When the voltage of the control signal HHL rises to the voltage VHHL, the transistor T2 is turned on and the sense node SEN is charged to the voltage VDDSA. When the charging of the sense node SEN is completed, the sequencer 16 lowers the voltage of the control signal HHL to the voltage VSS.

Next, at time tr2, the sequencer 16 raises the voltage of the control signal XXLa from the voltage VSS to a voltage VXXL. Similarly, the sequencer 16 raises the voltage of the control signal XXLb from the voltage VSS to a voltage VXXL. After this, at time tr3a, the sequencer 16 lowers the voltage of the control signal XXLa from the voltage VXXL to the voltage VSS. Furthermore, at time tr3b, the sequencer 16 lowers the voltage of the control signal XXLb from the voltage VXXL to the voltage VSS.

When the voltage of the control signal XXLa rises to the voltage VXXL, the transistor T3 connected to the bit line BLa is turned on, and the voltage of the sense node SEN changes according to the threshold voltage of the selected memory cell MCa. Specifically, when the selected memory cell MCa is in the on state, the voltage of the sense node SEN connected to the bit line BLa is lowered to a voltage VDDao. Here, as described above, the threshold voltage of the memory cell MCa is lower than the threshold voltage of the memory cell MCb. Therefore, when the read voltage VCGRV is applied to the selected word line WLsel, a larger current than that of the bit line BLb flows through the bit line BLa connected to the memory cell MCa. Therefore, the period for maintaining the control signal XXLa at the "H" level is set to be shorter than the period for maintaining the control signal XXLb at the "H" level. As a result, the voltage of the sense node SEN connected to the bit line BLa is set to the voltage VDDao. Hereinafter, the period for maintaining the control signal XXLa at the "H" level is referred to as a sense time SEa, and the period for maintaining the control signal XXLb at the "H" level is referred to as a sense time SEb.

On the other hand, when the voltage of the control signal XXLb rises to the voltage VXXL, the transistor T3 connected to the bit line BLb is turned on, and the voltage of the sense node SEN changes according to the threshold voltage of the selected memory cell MCb. Specifically, when the selected memory cell MCb is in the on state, the voltage of the sense node SEN connected to the bit line BLb is lowered to a voltage VDDbo. As described above, the threshold voltage of the memory cell MCb is higher than the threshold voltage of the memory cell MCa. Therefore, when the read voltage VCGRV is applied to the selected word line WLsel, a smaller current than that of the bit line BLa flows through the bit line BLb connected to the memory cell MCb. Therefore, the sense time SEb for maintaining the control signal XXLb at the "H" level is set to be longer than the sense time SEa. As a result, the voltage of the sense node SEN connected to the bit line BLb is set to the voltage VDDbo. As a result, the voltages VDDao and VDDbo of the sense nodes SEN respectively connected to the memory cells MCa and MCb are fixed to substantially the same voltage level.

After this, the sequencer 16 asserts the control signal STB and determines bit values of the data stored in the selected memory cells MCa and MCb, respectively. Specifically, the sequencer 16 raises the voltage of the control signal STB from the "L" level to the "H" level. When the voltage of the control signal STB rises to the "H" level, the transistor T7 is turned on, and the voltage of the latch circuit SDL of the sense amplifier unit SAUr in the sense amplifier 21 changes depending on the voltage VDDao and VDDbo or VDDf of the sense node SEN applied to the gate of the transistor T6. Then, the sequencer 16 determines the bit value of the data stored in the selected memory cell MCa based on the voltage of the latch circuit SDL of the sense amplifier unit SAUr connected to the bit line BLa. Similarly, the bit value of the data stored in the selected memory cell MCb is determined based on the voltage of the latch circuit SDL of the sense amplifier unit SAUr connected to the bit line BLb.

That is, the sense amplifier unit SAUr connected to the bit line BLa senses whether or not the threshold voltage of the selected memory cell MCa is higher than the read voltage VCGRV, and stores the sense result in the latch circuit SDL. Similarly, the sense amplifier unit SAUr connected to the bit line BLb senses whether or not the threshold voltage of the selected memory cell MCb is higher than the read voltage VCGRV, and stores the sense result in the latch circuit SDL. The sequencer 16 determines bit values of the data stored in the selected memory cells MCa and MCb, respectively, based on the sense results stored in the latch circuit SDL of the sense amplifier unit SAUr. According to the above, the second example of the read operation using the read voltage VCGRV is completed.

As described above, in the second example of the read operation, even when the threshold voltages of the selected memory cells MCa and MCb are different within the threshold voltage distribution of the same state, that is, even when the threshold voltage of the selected memory cell MCa is lower than the threshold voltage of the selected memory cell MCb within the threshold voltage distribution of the same state, the determination voltage VDDao when the selected memory cell MCa is on-cell and the determination voltage VDDbo when the selected memory cell MCb is on-cell can be set to be substantially the same voltage level. As a result, in the write operation, it is possible to reduce the problem caused by setting the threshold voltage of the memory cell MCa in the vicinity of the slit SLT to be lower than the threshold voltage of the memory cell MCb.

As described above, among the memory cells MCa in the memory pillar MPa in the vicinity of the slit SLT, depending on whether the memory cell MCa is disposed above or below the memory pillar MPa, the sense time during the read operation may change. For example, the sense time during the read operation is set to SEau for the memory cell MCa arranged above the memory pillar MPa shown in FIG. 8, and the sense time during the read operation is set to SEal for the memory cell MCa arranged below the memory pillar MPa. The sense time SEau is shorter than the sense time SEal. As a result, the read operation can be executed even for the memory cells MCa positioned above or below the memory pillar MPa under the read conditions according to the write characteristics of the memory cells.

1.2.3 Read Operation (Third Example)

Next, a third example of the read operation in the first embodiment will be described. In the third example of the read operation, similarly to the second example, depending on whether the memory cell of the read target is disposed in the vicinity of the slit SLT, the sense time for sensing the data respectively stored in the memory cells MCa and MCb changes. In this third example, the sense time is a period from the time when the control signal XXL is asserted until the control signal BLC is lowered to the voltage VSS, or a period during which the control signal BLC is maintained at the voltage VBLC and the control signal XXL is maintained in the asserted state (for example, "H" level).

Figure 14:
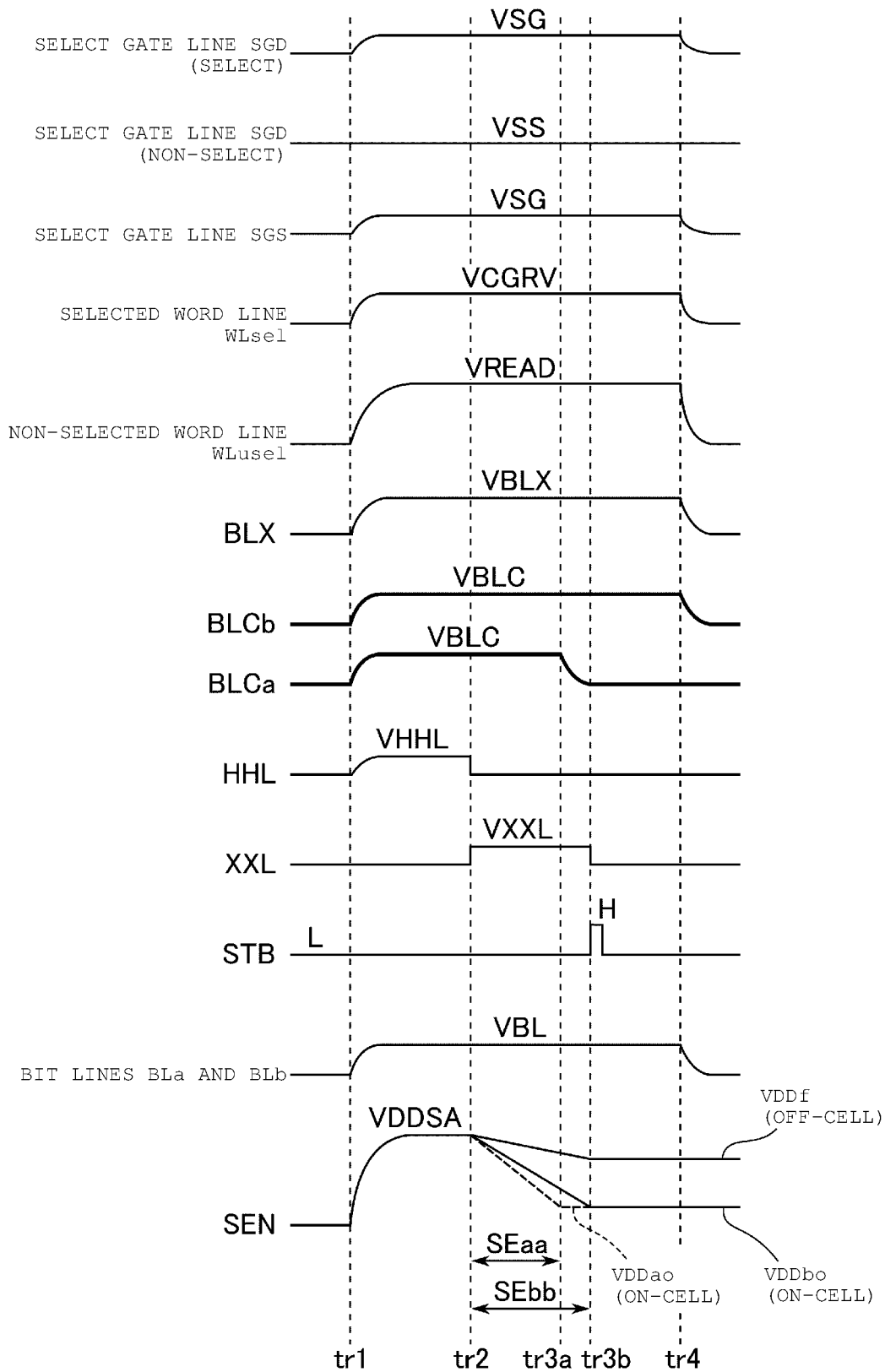
FIG. 14 is a timing chart of voltages of a select gate line, a word line, a bit line, and a control signal according to a third example of the read operation in the first embodiment.

FIG. 14 is a timing chart of voltages of the select gate line, the word line, the bit line, and the control signal according to the third example of the read operation in the first embodiment. In the following, the control signal applied to the gate of the transistor T4 connected to the memory cell MCa in the vicinity of the slit SLT via the bit line BLa is referred to as BLCa, and the control signal applied to the gate of the transistor T4 connected to the memory cell MCb not arranged in the vicinity of the slit SLT via the bit line BLb is referred to as BLCb.

As shown in FIG. 14, the sequencer 16 executes the read operation using the read voltage VCGRV during the period from time tr1 to tr4. The details of the read operation will be described below.

At time tr1, the row decoder 18 applies the voltage VSG to the selected select gate line SGD and the select gate line SGS. Furthermore, the row decoder 18 applies the voltage VSS to the non-selected select gate line SGD.

Further, at time tr1, the row decoder 18 applies the read voltage VCGRV to the selected word line WLsel. Furthermore, the row decoder 18 applies a voltage VREAD to the non-selected word line WLusel.

Further, at time tr1, the sequencer 16 raises the voltage of the control signal BLX from the voltage VSS to a voltage VBLX, for example. Further, the sequencer 16 raises the voltage of the control signal BLCa of the transistor T4 connected to the selected memory cell MCa via the bit line BLa from the voltage VSS to a voltage VBLC. Similarly, the sequencer 16 raises the voltage of the control signal BLCb of the transistor 14 connected to the selected memory cell MCb via the bit line BLb from the voltage VSS to the voltage VBLC.

Specifically, the sequencer 16 transmits, for example, the control signal BLCa (that is, voltage VBLC) for clamping the voltage of the bit line BLa to the voltage VBL, to the gate of the transistor 14 connected to the bit line BLa. Similarly, the sequencer 16 transmits, for example, the control signal BLCb for clamping the voltage of the bit line BLb to the voltage VBL, to the gate of the transistor T4 connected to the bit line BLb. As a result, the sense amplifier 21 applies the voltage VBL to the bit line BLa connected to the selected memory cell MCa. Similarly, the sense amplifier 21 applies the voltage VBL to the bit line BLb connected to the selected memory cell MCb.

Further, at time tr1, the sequencer 16 raises the voltage of the control signal HHL from the voltage VSS to a voltage VHHL. When the voltage of the control signal HHL rises to the voltage VHHL, the transistor T2 is turned on and the sense node SEN is charged to the voltage VDDSA. When the charging of the sense node SEN is completed, the sequencer 16 lowers the voltage of the control signal HHL to the voltage VSS.

Next, at time tr2, the sequencer 16 raises the voltage of the control signal XXL from the voltage VSS to a voltage VXXL.

After this, at time tr3$a$, the sequencer 16 lowers the voltage of the control signal BLCa from the voltage VBLC to the voltage VSS. Furthermore, at time tr3$b$, the sequencer 16 lowers the voltage of the control signal XXL from the voltage VXXL to the voltage VSS.

Here, at time tr2, when the voltage of the control signal XXL rises to the voltage VXXL, the transistor T3 connected to the bit line BLa is turned on, and the voltage of the sense node SEN changes according to the threshold voltage of the selected memory cell MCa. Specifically, when the selected memory cell MCa is in the on state, the voltage of the sense node SEN connected to the bit line BLa is lowered to a voltage VDDao. As described above, the threshold voltage of the memory cell MCa is lower than the threshold voltage of the memory cell MCb. Therefore, when the read voltage VCGRV is applied to the selected word line WLsel, a larger current than that of the bit line BLb flows through the bit line BLa connected to the memory cell MCa. Therefore, the period from the time when the control signal XXL is asserted until the control signal BLCa is lowered to the voltage VSS is set to be shorter than the period for maintaining the control signal XXL at the "H" level. As a result, the voltage of the sense node SEN connected to the bit line BLa is set to the voltage VDDao. Hereinafter, the period from the time when the control signal XXL is asserted until the control signal BLCa is lowered to the voltage VSS is referred to as a sense time SEaa, and the period for maintaining the control signal XXL at the "H" level is referred to as a sense time SEbb.

On the other hand, when the voltage of the control signal XXL rises to the voltage VXXL, the transistor T3 connected to the bit line BLb is turned on, and the voltage of the sense node SEN changes according to the threshold voltage of the selected memory cell MCb. Specifically, when the selected memory cell MCb is in the on state, the voltage of the sense node SEN connected to the bit line BLb is lowered to a voltage VDDbo. As described above, the threshold voltage of the memory cell MCb is higher than the threshold voltage of the memory cell MCa. Therefore, when the read voltage VCGRV is applied to the selected word line WLsel, a smaller current than that of the bit line BLa flows through the bit line BLb connected to the memory cell MCb. Therefore, the sense time SEbb for maintaining the control signal BLC at the voltage VBLC and the control signal XXL at the "H" level is set to be longer than the sense time SEaa. As a result, the voltage of the sense node SEN connected to the bit line BLb is set to the voltage VDDbo. As a result, the voltages VDDao and VDDbo of the sense nodes SEN respectively connected to the memory cells MCa and MCb are fixed to substantially the same voltage level.

After this, the sequencer 16 asserts the control signal STB and determines bit values of the data stored in the selected memory cells MCa and MCb, respectively. That is, the sense amplifier unit SAUr senses whether or not the threshold voltage of the selected memory cell MCa is higher than the read voltage VCGRV, and stores the sense result in the latch circuit SDL. Similarly, the sense amplifier unit SAUr senses whether or not the threshold voltage of the selected memory cell MCb is higher than the read voltage VCGRV, and stores the sense result in the latch circuit SDL. The sequencer 16 determines bit values of the data stored in the selected memory cells MCa and MCb, respectively, based on the sense results stored in the latch circuit SDL of the sense amplifier unit SAUr. According to the above, the third example of the read operation using the read voltage VCGRV is completed.

As described above, in the third example of the read operation, similarly to the second example, even when the threshold voltage of the selected memory cell MCa is lower than the threshold voltage of the selected memory cell MCb within the threshold voltage distribution of the same state, the determination voltage VDDao when the selected memory cell MCa is on-cell and the determination voltage VDDbo when the selected memory cell MCb is on-cell can be set to be substantially the same voltage level. As a result, in the write operation, it is possible to reduce the problem caused by setting the threshold voltage of the memory cell MCa in the vicinity of the slit SLT to be lower than the threshold voltage of the memory cell MCb.

1.2.4 Write Operation (First Example)

The write operation includes a program operation and a program verification operation. The program operation is an operation of applying the write voltage VPGM to the gate electrode of the memory cell transistor MT to inject charge into the insulating layer (that is, charge storage layer) 72 of the memory cell transistor MT, and to raise the threshold voltage of the memory cell transistor. The program verification operation is a read operation for verifying whether or not the threshold voltage of the memory cell transistor MT generated by the application of the write voltage reached the target voltage.

In the write operation, one program operation and one program verification operation are regarded as one write loop, and the write loop is repeated until passing the verification by the program verification operation. Specifically, in the verification by the program verification operation after the program operation, when the threshold voltage of the memory cell transistor does not reach the predetermined threshold voltage, that is, when the verification fails, the write voltage VPGM is increased by a voltage AV and the program operation is executed again, and then the program verification operation is executed. Then, the write loop is repeated until passing the verification.

When the first example or the second example of the write operation of the present embodiment is executed, the first to third examples of the read operation described above are not executed, and the normal read operation is executed. In this case, the write speed of the memory cell MCa is adjusted in substantially the same manner as the write speed of the memory cell MCb according to the first example or the second example of the write operation. Therefore, when the write operation is executed for the memory cell MCa and the memory cell MCb using the write voltages of the same voltage level, the threshold voltages of the memory cell MCa and the memory cell MCb are set to substantially the same voltage level.

Hereinafter, a first example of the write operation in the first embodiment will be described. In the first example of the write operation, depending on whether the memory cell of the write target is disposed in the vicinity of the slit SLT, that is, depending on whether the write target is the memory cell MCa or MCb, the voltage applied to the bit lines BLa and BLb respectively connected to the memory cells MCa and MCb changes.

Figure 15:
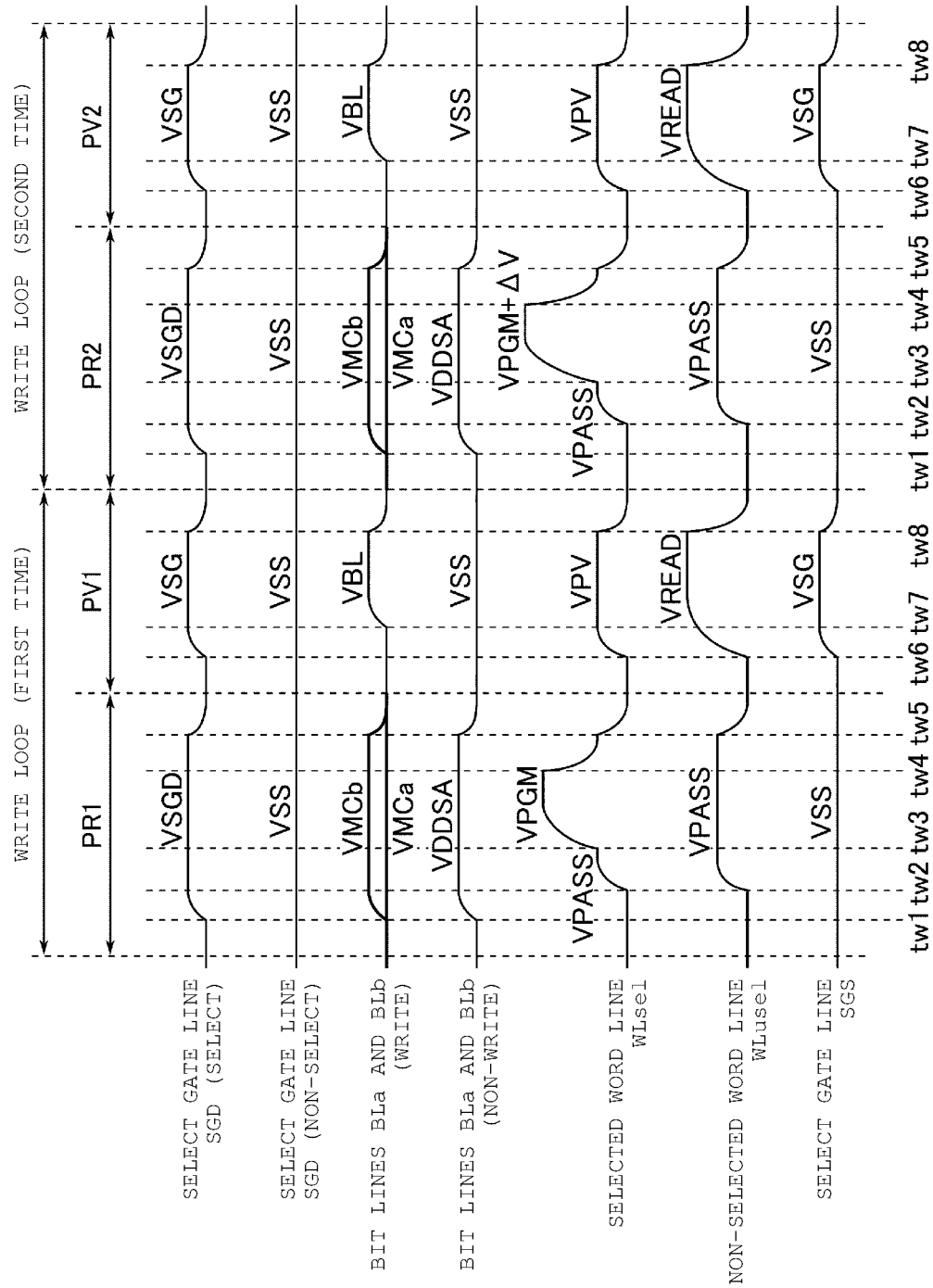
FIG. 15 is a timing chart of voltages applied to a select gate line, a word line, and a bit line according to a first example of a write operation in the first embodiment.

FIG. 15 is a timing chart of voltages applied to the select gate line, the word line, and the bit line according to a first example of the write operation in the first embodiment.

First, a program operation PR1 is executed.

At time tw1, the row decoder 18 applies a voltage VSGD to the selected select gate line SGD and also supplies the voltage VSS to the non-selected select gate line SGD. The voltage VSGD is a voltage higher than the voltage VSS.

Further, at time tw1, the sense amplifier 21 applies the voltage VDDSA to the bit line BL connected to the memory cell of the non-write target (or write-protected or non-selected). The voltage VDDSA is a voltage at which the select transistor ST1 is turned off when the voltage VSGD is applied to the selected select gate line SGD. Further, the sense amplifier 21 applies a voltage VMCa to the bit line BLa which is a write target (or is selected) and is connected to the memory cell MCa in the vicinity of the slit SLT. The voltage VMCa is the voltage VSS (for example, 0 V). The sense amplifier 21 applies a voltage VMCb to the bit line BLb connected to the memory cell MCb which is a write target and is not arranged in the vicinity of the slit SLT. The voltage VMCb is higher than the voltage VMCa and lower than the voltage VDDSA. The voltage VMCb is, for example, 0.5 V.

Next, at time tw2, the row decoder 18 applies a voltage VPASS to the selected word line WLsel and the non-selected word line WLusel.

Subsequently, at time tw3, the row decoder 18 applies a write voltage VPGM (for example, 14 to 20 V) to the selected word line WLsel. By applying the write voltage VPGM, electrons are injected into the charge storage layer of the memory cell of the write target connected to the selected word line WLsel, and writing is performed. Further, in the memory cell of the non-write target connected to the selected word line WLsel, the channel potential of the memory cell is boosted, that is, the channel potential rises, and almost no charge is injected into the charge storage layer. The write voltage VPGM is higher than the voltage VPASS.

Next, at time two, the row decoder 18 lowers the voltage applied to the selected word line WLsel from the write voltage VPGM to the voltage VPASS.

After this, at time tw5, the voltage VSS is supplied to the selected word line WLsel, the non-selected word line WLusel, the select gate lines SGD and SGS, and the bit line BL. With the above, the program operation is completed.

As described above, the voltage VMCa of the bit line BLa connected to the memory cell MCa in the memory pillar MPa is set to the voltage VSS (for example, 0 V). Furthermore, the voltage VMCb of the bit line BLb connected to the memory cell MCb in the memory pillar MPb is set to a voltage higher than the voltage VMCa and lower than the voltage VDDSA. Therefore, during program operation, the potential of the channel of the memory cell MCa is set to the voltage VSS, and the voltage of the selected word line WLsel is set to the write voltage VPGM. Meanwhile, the potential of the channel of the memory cell MCb is set to the voltage VMCb, and the voltage of the selected word line WLsel is set to the write voltage VPGM. As a result, the voltage difference between the word line voltage and the channel potential in the memory cell MCb becomes smaller than the voltage difference between the word line voltage and the channel potential in the memory cell MCa, and the write speed of the memory cell MCb becomes slower than the write speed of the memory cell MCa. That is, the threshold voltage written into the memory cell MCb is lower than the threshold voltage written into the memory cell MCa. As a result, the difference in write speed between the memory cell MCa and the memory cell MCb is adjusted, and the threshold voltages written into the memory cell MCa and the memory cell MCb are set to substantially the same voltage level.

Next, a program verification operation PV1 is executed.

At time tw6, the row decoder 18 applies the voltage VSG to the selected select gate line SGD and the select gate line SGS. The row decoder 18 applies the voltage VSS to the non-selected select gate line SGD. The voltage VSG is a voltage that turns on the select transistors ST1 and ST2 corresponding to the selected string unit SU. As a result, the select transistors ST1 and ST2 of the selected string unit SU are turned on, and the select transistors ST1 of the non-selected string unit SU are turned off.

Further, at time tw6, the row decoder 18 applies a verify voltage VPV to the selected word line WLsel and the voltage VREAD to the non-selected word line WLusel. The verify voltage VPV is a read voltage that is set according to the write data. As described above, the voltage VREAD is a voltage that turns on the memory cell regardless of the threshold voltage of the memory cell, and VREAD>VPV is satisfied. For example, when the threshold voltage of the memory cell of the write target is higher than the voltage VPV, the memory cell is turned off, and when the threshold voltage is equal to or lower than the voltage VPV, the memory cell is turned on.

Next, at time tw7, the sense amplifier 21 applies the voltage VBL to the bit lines BLa and BLb respectively connected to the memory cells MCa and MCb which are the write target. The voltage VBL is, for example, a voltage lower than the voltage VPV (VBL<VPV). Furthermore, the sense amplifier 21 applies the voltage VSS to the bit line connected to the memory cell of the non-write target.

Then, at time tw8, the row decoder 18 applies the voltage VSS to the selected word line WLsel, the non-selected word line WLusel, the select gate line SGD, and the select gate line SGS. Further, the sense amplifier 21 applies the voltage VSS to the bit lines BLa and BLb.

By the above operation, data is read from the memory cells MCa and MCb connected to the selected word line WLsel. When the read data passes the verification, the write operation is completed. On the other hand, when the read data verification fails, the write voltage VPGM is increased by the voltage AV, and the write loop including the program operation and the program verification operation is repeated until passing the verification. With the above, the write operation is completed.

Furthermore, in the above description, the voltage supplied to the bit line BL during the write operation is changed depending on whether the memory cell is the memory cell MCa in the vicinity of the slit SLT or the other memory cell MCb. However, further, depending on whether the memory cell MCa is disposed above or below the memory pillar MPa among the memory cells MCa in the memory pillar MPa in the vicinity of the slit SLT, the voltage supplied to the bit line BLa during the write operation may be changed. For example, during the write operation, the voltage of the bit line BLa is set to VMCau for the memory cell MCa arranged above the memory pillar MPa shown in FIG. 8, and the voltage of the bit line BLa is set to VMCal for the memory cell MCa arranged below the memory pillar MPa. The voltage VMCau is a voltage lower than the voltage VMCal.

As a result, the write operation can be executed even for the memory cells MCa positioned above or below the memory pillar MPa under the write conditions according to the write characteristics of the memory cells.

1.2.5 Write Operation (Second Example)

Next, a second example of the write operation in the first embodiment will be described. In the second example of the write operation, it is assumed that the states A, B, . . . , and G are set to the memory cell, for example. In each write to set the states A to G, an operation for narrowing the threshold voltage distribution of the memory cells belonging to each state is executed. When the operation of narrowing the threshold voltage distribution is executed in the states A to G, the time required for the write operation becomes long. Here, since the threshold voltage distribution in the state G is positioned on the side having the highest voltage in the threshold voltage distributions in the states A to G, it is not necessary to narrow the threshold voltage distribution. According to this perspective, in the first embodiment, the write of changing the bit line voltage between the memory cells MCa and MCb is applied to the setting of the state G to the memory cells MCa and MCb. That is, in the setting of the state G, the voltage VMCa is applied to the bit line BLa connected to the memory cell MCa, and the voltage VMCb is applied to the bit line BLb connected to the memory cell MCb.

Figure 16:
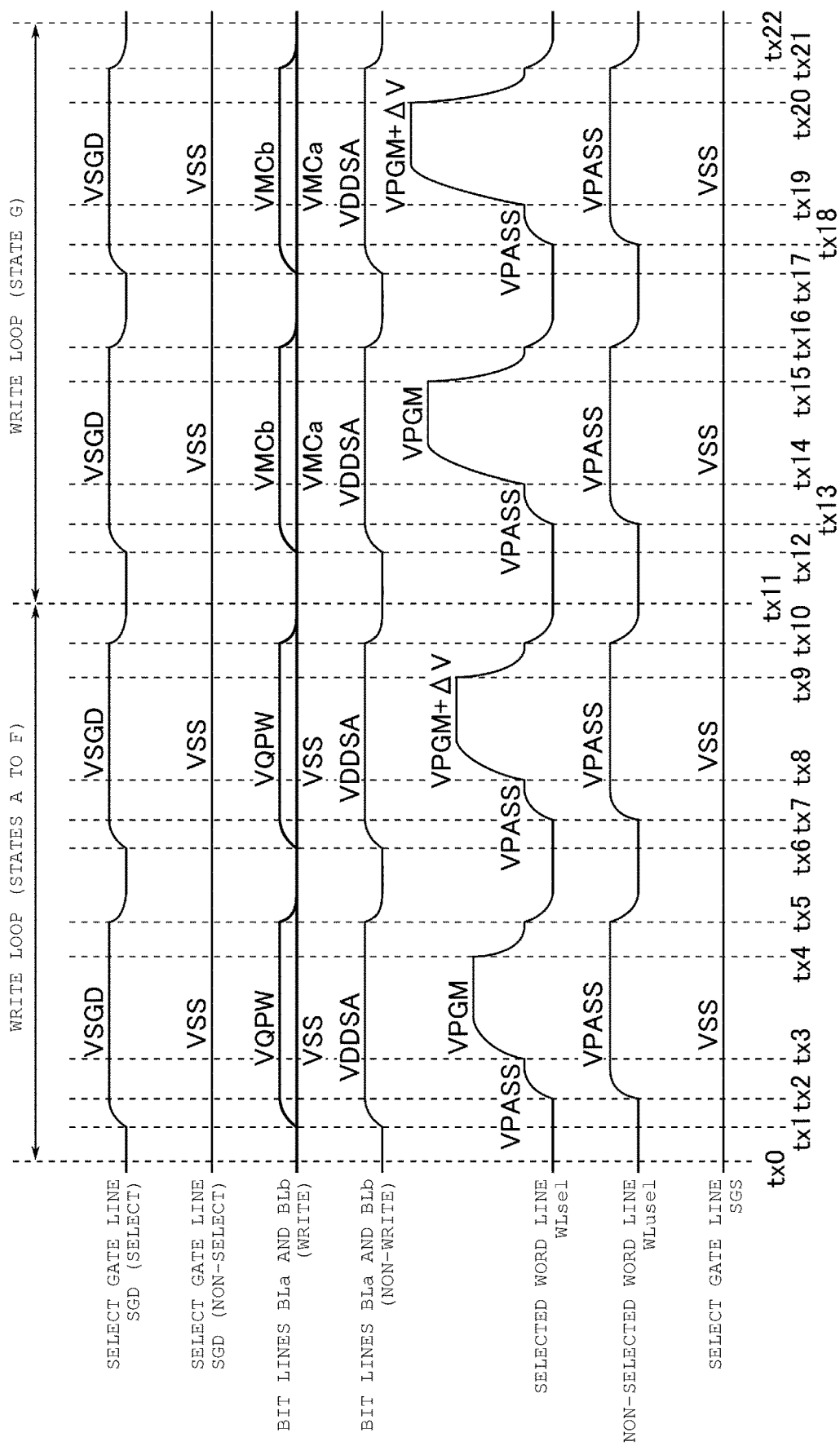
FIG. 16 is a timing chart of voltages applied to a select gate line, a word line, and a bit line according to a second example of the write operation in the first embodiment.

FIG. 16 is a timing chart of voltages applied to the select gate line, the word line, and the bit line according to a second example of the write operation in the first embodiment. Here, the description of the program verification operation is omitted.

In the setting of the states A to F, an operation for narrowing the threshold voltage distribution is executed with respect to the memory cells MCa and MCb at time tx0 to tx11. Specifically, as shown in FIG. 16, the sense amplifier 21 applies a voltage VQPW (for example, 0.3 V) to the bit lines BLa and BLb respectively connected to the memory cells MCa and MCb, which are targets of the weak write for narrowing the threshold voltage distribution, and applies the voltage VSS (for example, 0 V) to the bit lines connected to other memory cells, which are write targets. Furthermore, the sense amplifier 21 applies the voltage VDDSA to the bit lines BLa and BLb respectively connected to the memory cells MCa and MCb of the non-write target. Then, at time tx0 to tx11, an operation for narrowing the threshold voltage distribution is executed with respect to the memory cells MCa and MCb. The weak writing is an operation of writing a threshold voltage smaller than the threshold voltage to be written into other memory cells which are write targets.

Further, in setting of the state G, at time tx11 to tx22, the operation of changing the bit line voltage is executed with respect to the memory cells MCa and MCb according to the present embodiment.

Specifically, at time tx12, the row decoder 18 applies the voltage VSGD to the selected select gate line SGD and also supplies the voltage VSS to the non-selected select gate line SGD.

Further, at time tx12, the sense amplifier 21 applies the voltage VDDSA to the bit line BL connected to the memory cell of the non-write target. Further, the sense amplifier 21 applies the voltage VMCa to the bit line BLa which is a write target and is connected to the memory cell MCa in the vicinity of the slit SLT. The voltage VMCa is the voltage VSS. The sense amplifier 21 applies a voltage VMCb to the bit line BLb connected to the memory cell MCb which is a write target and is not arranged in the vicinity of the slit SLT.

The voltage VMCb is higher than the voltage VMCa and lower than the voltage VDDSA. The voltage VMCb is, for example, 0.5 V.

Next, at time tx13, the row decoder 18 applies a voltage VPASS to the selected word line WLsel and the non-selected word line WLusel.

Subsequently, at time tx14, the row decoder 18 applies a write voltage VPGM (for example, 14 to 20 V) to the selected word line WLsel. By applying the write voltage VPGM, electrons are injected into the charge storage layer of the memory cell which is the write target connected to the selected word line WLsel, and writing is performed.

Next, at time tx15, the row decoder 18 lowers the voltage applied to the selected word line WLsel from the write voltage VPGM to the voltage VPASS.

Next, at time tx16, the voltage VSS is supplied to the selected word line WLsel, the non-selected word line WLusel, the select gate lines SGD and SGS, and the bit line BL.

After this, a program verification operation (not shown) is executed for the memory cell of the write target. When the verification by the program verification operation fails, the write voltage VPGM is increased by the voltage AV and the program operation is executed again at time tx17 to tx22.

Specifically, at time tx17, the row decoder 18 applies the voltage VSGD to the selected select gate line SGD and also supplies the voltage VSS to the non-selected select gate line SGD.

Further, at time tx17, the sense amplifier 21 applies the voltage VDDSA to the bit line BL connected to the memory cell of the non-write target. Further, the sense amplifier 21 applies the voltage VMCa to the bit line BLa connected to the memory cell MCa of the write target. The voltage VMCa is the voltage VSS. The sense amplifier 21 applies the voltage VMCb to the bit line BLb connected to the memory cell MCb of the write target.

Next, at time tx18, the row decoder 18 applies the voltage VPASS to the selected word line WLsel and the non-selected word line WLusel.

Subsequently, at time tx19, the row decoder 18 applies the voltage, which is obtained by adding AV to the write voltage VPGM, to the selected word line WLsel. By applying this write voltage, electrons are injected into the charge storage layer of the memory cell which is the write target connected to the selected word line WLsel, and writing is performed.

Next, at time tx20, the row decoder 18 lowers the voltage applied to the selected word line WLsel from the write voltage VPGM to the voltage VPASS.

Next, at time tx21, the voltage VSS is supplied to the selected word line WLsel, the non-selected word line WLusel, the select gate lines SGD and SGS, and the bit lines BLa and BLb.

After this, a program verification operation (not shown) is executed again for the memory cell of the write target. Then, the write loop is repeated until passing the verification by the program verification operation. With the above, the write operation is completed.

It is noted that FIGS. 15 and 16 are examples of timing charts in the write operation of the present embodiment. The voltage and timing applied to each of the word line WL, the select gate lines SGD and SGS, and the bit lines BLa and BLb do not necessarily have to match those shown in FIGS. 15 and 16.

1.3 Effect of First Embodiment

According to the first embodiment, it is possible to provide a semiconductor storage device capable of improving the performance of a read operation and/or a write operation.

The effects of the first embodiment will be described in detail below.

In the semiconductor storage device, a plurality of word lines WL are stacked, and the stacked word lines are separated by an insulating layer called the slit SLT. Then, the plurality of memory pillars MP are arranged between the two slits SLT. When viewed from above the main surface of the semiconductor substrate 50, the memory pillar MPa is disposed in the vicinity of the slit SLT, and the memory pillar MPb is disposed in an area other than the vicinity of the slit SLT.

In such a structure, when the write operation is performed for the memory cell MCa formed in the memory pillar MPa and the memory cell MCb formed in the memory pillar MPb, the write characteristics of the memory cell MCa and the memory cell MCb may be different.

To the contrary, according to the configuration of the present embodiment, when the read operation is performed for the memory cells MCa and MCb, the voltage VBLa of the bit line BLa connected to the memory cells MCa is set to be lower than the voltage VBLb of the bit line BLb connected to the memory cell MCb. As a result, the current flowing through the bit line BLa and the current flowing through the bit line BLb are set to have substantially the same current value. As a result, the voltages of the sense nodes SEN respectively connected to the memory cells MCa and MCb are fixed to substantially the same voltage VDDo. As a result, the data stored in the selected memory cells MCa and MCb can be accurately determined, and the performance of the read operation can be improved.

Further, according to the configuration of the present embodiment, when the read operation is performed for the memory cells MCa and MCb, the sense time SEa (or SEaa) for sensing the data stored in the memory cell MCa is set to be shorter than the sense time SEb (or SEbb) for sensing the data stored in the memory cell MCb. As a result, the current amount flowing through the bit line BLa and the current amount flowing through the bit line BLb are set to have substantially the same current amount. Accordingly, the voltages VDDao and VDDbo of the sense nodes SEN respectively connected to the memory cells MCa and MCb are fixed to substantially the same voltage level. As a result, the data stored in the selected memory cells MCa and MCb can be accurately determined, and the performance of the read operation can be improved.

Further, according to the configuration of the present embodiment, when the write operation is performed for the memory cells MCa and MCb, the voltage VMCa of the bit line BLa is set to be lower than the voltage VMCb of the bit line BLb. Accordingly, the difference in write speed between the memory cell MCa and the memory cell MCb is adjusted, and the threshold voltages written into the memory cell MCa and the memory cell MCb are set to substantially the same voltage level. Thereby, the performance of the write operation can be improved.

Further, according to the configuration of the present embodiment, for example, when the states A, B, . . . , and G are set to the memory cells MCa and MCb, the write operation of the present embodiment is not applied to the setting of the states A to F. Instead, for example, an operation of narrowing the threshold voltage distribution of each of the states A to F is executed, and the write operation of the present embodiment is applied only to the setting of the state G. Specifically, in the setting of the state G, the voltage VMCa of the bit line BLa is set to be lower than the voltage VMCb of the bit line BLb. Accordingly, the difference in write speed between the memory cell MCa and the memory cell MCb is adjusted, and the threshold voltages written into the memory cell MCa and the memory cell MCb are set to substantially the same voltage level. As a result, since the number of write loops in the setting of the state G can be reduced, the time required for the write operation can be shortened, and the performance of the write operation can be improved.

Other effects of the first embodiment are as described in the section of the read operation and the write operation.

2. Second Embodiment

A semiconductor storage device according to a second embodiment will be described. In the semiconductor storage device according to the first embodiment, the dummy memory pillar DMP or the memory pillar MP is provided in the area overlapping the slit SHE in the planar layout. In contrast, in the semiconductor storage device according to the second embodiment, the dummy memory pillar DMP or the memory pillar MP is not provided in the area overlapping the slit SHE and the area where the dummy memory pillar DMP is provided in the first embodiment is a vacant area in the second embodiment. Hereinafter, the structure and operation of the semiconductor storage device according to the second embodiment will be described. The second embodiment mainly describes the differences from the first embodiment.

2.1 Structure of Memory Cell Array 11

An example of the structure of the memory cell array 11 in the semiconductor storage device 10 according to the second embodiment will be described. The detailed planar layout in the cell area CA of the memory cell array 11 will be described below.

Figure 17:
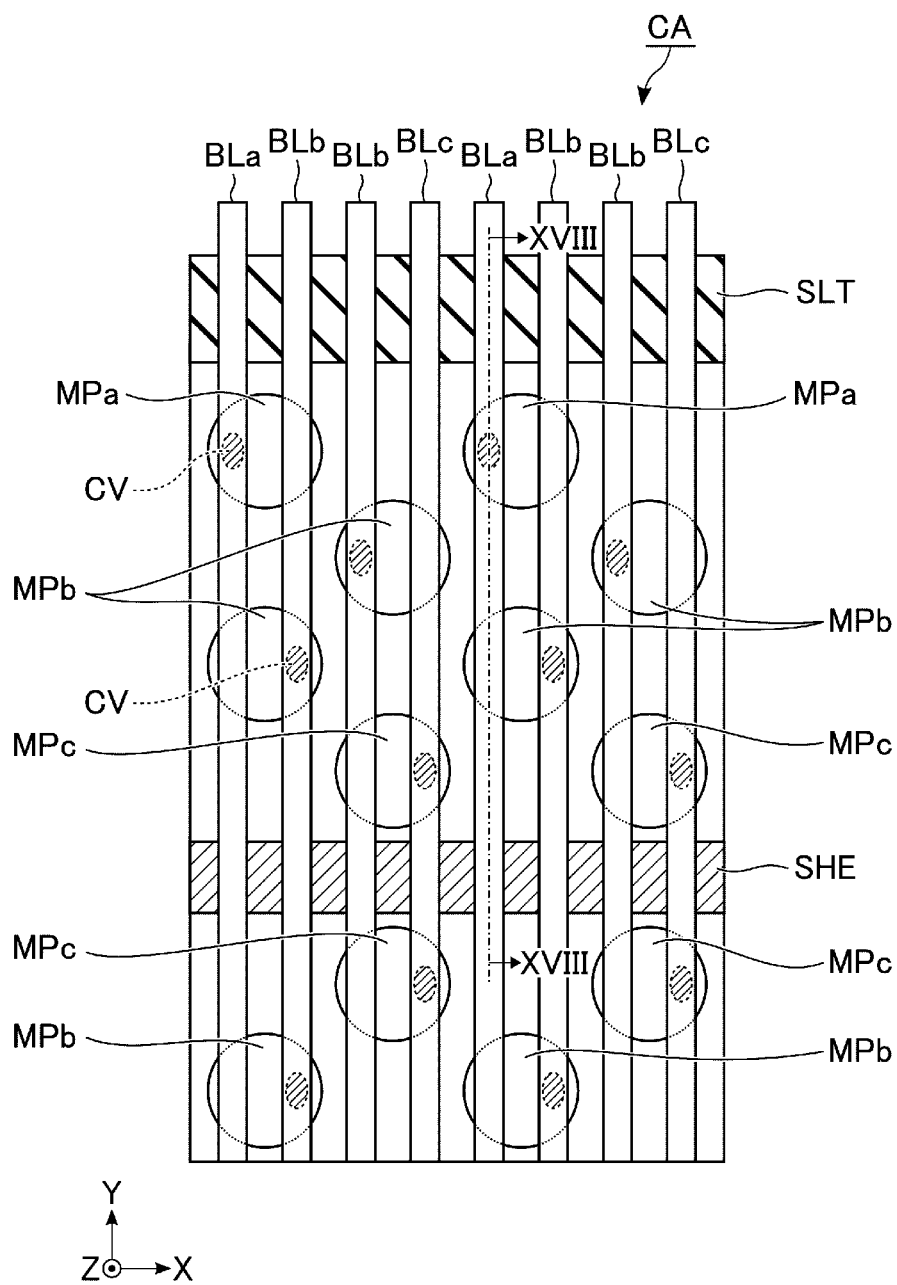
FIG. 17 is a diagram showing an example of a planar layout of a cell area of a memory cell array of a semiconductor storage device according to a second embodiment.

FIG. 17 is a diagram showing an example of a detailed planar layout in the cell area CA of the memory cell array 11 in the semiconductor storage device 10. FIG. 17 extracts and shows the string unit SU between the slit SLT and the slit SHE, and a part of the area corresponding to the string unit SU adjacent thereto. The cell area CA includes, for example, the plurality of memory pillars MPa, MPb, and MPc, the plurality of bit lines BLa, BLb, and BLc, and the plurality of contacts CV. Hereinafter, a case where the term "bit line BL" refers to each of the bit lines BLa, BLb, and BLc is described. Further, a case where the term "memory pillar MP" refers to each of the memory pillars MPa, MPb, and MPc is described.

In the planar layout, the memory pillar MPa is a memory pillar arranged adjacent to or in the vicinity of the slit SLT. The memory pillar MPc is a memory pillar arranged adjacent to the vacant area overlapping the slit SHE or in the vicinity of the vacant area (or the slit SHE). The memory pillar MPb is a memory pillar other than the memory pillars MPa and MPc. That is, the memory pillar MPb is a memory pillar that is not arranged in either the vicinity of the slit SLT or the vicinity of the vacant area.

Each of the memory pillars MPa, MPb, and MPc functions as one NAND string NS. The plurality of memory pillars MPa, MPb, and MPc are arranged in a staggered shape in four rows, for example, in the area between the adjacent slit SLT and the slit SHE, and between the two slits SHE. The number and arrangement of the memory pillars MPa, MPb, and MPc between the adjacent slit SLT and the slit SHE and between the two slits SHE may be appropriately changed without limitation.

The plurality of bit lines BLa, BLb, and BLc, each extending along the Y direction, are arranged in the X direction. Each of the bit lines BLa, BLb, and BLc overlaps with at least one memory pillar MP for each string unit SU. In this example, the two bit lines overlap each other in each of the memory pillars MPa, MPb, and MPc.

Each of the memory pillars MPa, MPb, and MPc is electrically connected to the corresponding bit line BLa, BLb, or BLc via the contact CV, respectively.

Figure 18:
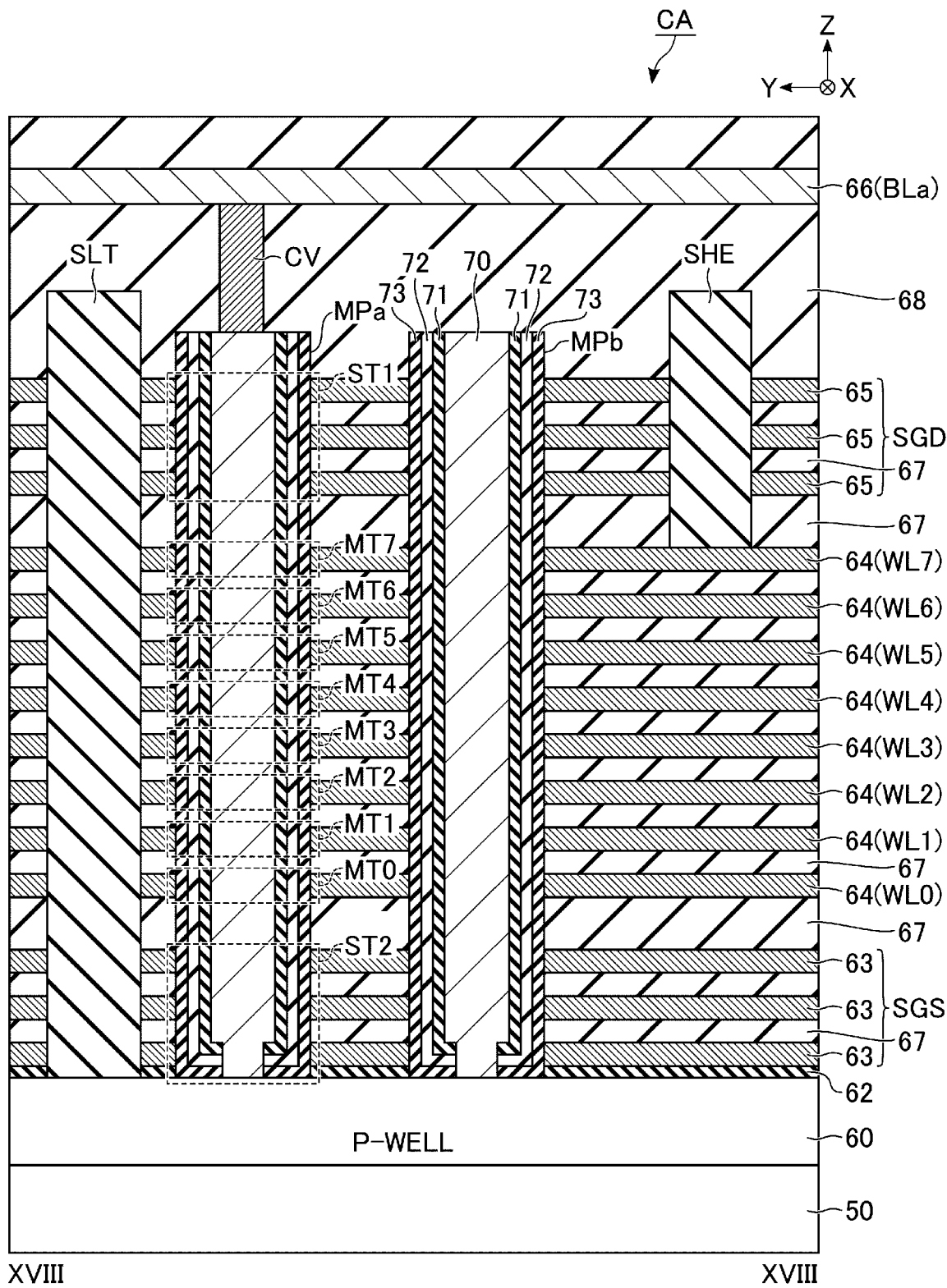
FIG. 18 is a cross-sectional diagram of the memory cell array taken along a line XVIII-XVIII in FIG. 17.

FIG. 18 is a cross-sectional diagram of the memory cell array 11 taken along the line XVIII-XVIII of FIG. 17, showing a cross-sectional structure of the memory cell array 11 in the semiconductor storage device 10 in the cell area CA.

In the cross-sectional structure shown in FIG. 8 or 11, the dummy memory pillar DMP or the memory pillar MPb is provided under (that is, in the Z direction) or in the vicinity of the slit SHE. However, in this example, the memory pillar MP is not provided in the area overlapping the slit SHE in the Z direction. That is, under the slit SHE, a vacant area in which the memory pillar MP is not arranged is provided.

The slit SHE is formed in a shape along, for example, the XZ plane, and divides the conductive layer 65 and the insulating layer 67. The upper end of the slit SHE is positioned between the conductive layer 65 and the conductive layer 66 on the uppermost layer. The lower end of the slit SHE is in contact with the conductive layer 64 on the uppermost layer.

As described above, one contact CV is connected to the conductive layer 66 in each of the space separated by the slit SLT and the slit SHE, and the space separated by two slits SHE. That is, one memory pillar MPa, MPb, or MPc is electrically connected to each of the conductive layers 66 between two adjacent slits.

The other structures shown in FIGS. 17 and 18 are the same as the structures shown in the first embodiment.

2.2 Operation of Semiconductor Storage Device

The read operation and the write operation in the semiconductor storage device 10 according to the second embodiment will be described. In the following, the memory cell transistor in the memory pillar MPa in the vicinity of the slit SLT shown in FIG. 17 is referred to as the memory cell MCa, and the memory cell transistor in the memory pillar MPc in the vicinity of the vacant area overlapping the slit SHE is referred to as a memory cell MCc. Furthermore, the memory cell transistors in the memory pillar MPb other than these are referred to as the memory cell MCb. Further, a case where the term "memory cell MC" refers to each of the memory cells MCa, MCb, and MCc is described.

For example, when a write operation is executed for the memory cells MCa, MCb, and MCc provided in the memory cell array 11 using the same write voltage VPGM without applying the present embodiment, a phenomenon in which the write speeds for the memory cells MCa, MCb, and MCc are different may occur.

In this example, the write speed of the memory cell MCa becomes slower than the write speed of the memory cells MCb and MCc, and the write speed of the memory cell MCc becomes faster than that of the memory cell MCa and slower than that of the MCb. That is, the write speed satisfies MCa<MCc<MCb. That is, when the threshold voltages of the memory cells MCa, MCb, and MCc are Vtha, Vthb, and Vthc, respectively, Vtha<Vthc<Vthb is satisfied.

When the first example, the second example, and the third example of the read operation in the second embodiment are executed, the first example and the second example of the write operation are not executed, and the normal write operation is executed. In this case, the threshold voltages of the memory cells MCa, MCc, and MCb are set to Vtha<Vthc<Vthb.

2.2.1 Read Operation (First Example)

Next, a first example of the read operation in the second embodiment will be described. In the first example of the read operation, depending on whether the read target is the memory cells MCa, MCb, or MCc, the voltage applied to the bit lines BLa, BLb, and BLc respectively connected to the memory cells MCa, MCb, and MCc changes.

Figure 19:
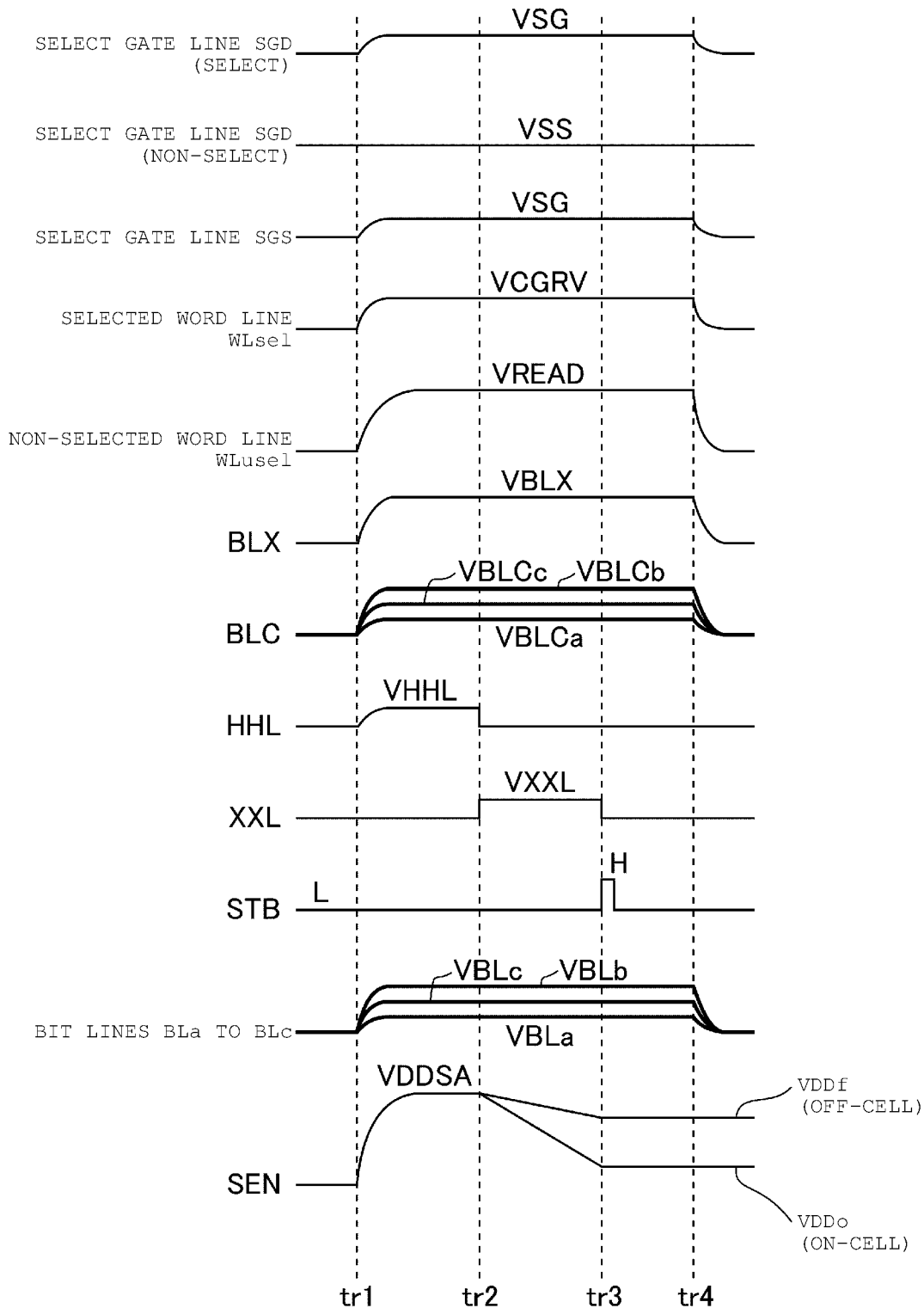
FIG. 19 is a timing chart of voltage waveforms of a select gate line, a word line, a bit line, and a control signal according to a first example of a read operation in the second embodiment.

FIG. 19 is a timing chart of voltage waveforms of the select gate line, the word line, the bit line, and the control signal according to the first example of the read operation in the second embodiment.

A voltage clamped by the transistors T1 and T4 is applied to the bit line BL. For example, during the read operation, a voltage VBLa is applied to the bit line BLa connected to the selected memory cell MCa in the vicinity of the slit SLT. The voltage VBLc is applied to the bit line BLc connected to the selected memory cell MCc in the vicinity of the vacant area overlapping the slit SHE. The voltage VBLb is applied to the bit line BLb connected to the selected memory cell MCb that is not arranged in the vicinity of any one of the slit SLT and the vacant area. The voltage VBLa is a voltage lower than the voltage VBLb and the voltage VBLc. The voltage VBLc is a voltage lower than the voltage VBLb. That is, VBLa<VBLc<VBLb is satisfied.

It is assumed that the voltage of the node INV of the latch circuit SDL in the sense amplifier unit SAUr of which the read data is not determined is set to the "L" level. That is, in the sense amplifier unit SAUr of which the read data is not determined, the transistor T0 is in the on state and the transistor T5 is in the off state.

As shown in FIG. 19, the sequencer 16 executes the read operation using the read voltage VCGRV during the period from time tr1 to tr4. The details of the read operation will be described below.

At time tr1, the row decoder 18 applies the voltage VSG to the selected select gate line SGD and the select gate line SGS of the string unit SU including the cell unit CU of the read target. Furthermore, the row decoder 18 applies the voltage VSS to the non-selected select gate line SGD of the string unit SU that does not include the cell unit CU of the read target.

Further, at time tr1, the row decoder 18 applies the read voltage VCGRV to the selected word line WLsel. Furthermore, the row decoder 18 applies a voltage VREAD to the non-selected word line WLusel. The voltage VREAD is a voltage that turns on the memory cells MCa, MCb, or MCc regardless of the data stored in the memory cells MCa, MCb, or MCc.

Further, at time tr1, the sequencer 16 raises the voltage of the control signal BLX from the voltage VSS to a voltage VBLX, for example. Further, the sequencer 16 raises the voltage of the control signal BLC of the transistor T4 connected to the selected memory cell MCa via the bit line BLa from the voltage VSS to a voltage VBLCa. The sequencer 16 raises the voltage of the control signal BLC of the transistor T4 connected to the selected memory cell MCb via the bit line BLb from the voltage VSS to a voltage VBLCb. Furthermore, the sequencer 16 raises the voltage of the control signal BLC of the transistor T4 connected to the selected memory cell MCc via the bit line BLc from the voltage VSS to a voltage VBLCc. The voltage VBLCa is a voltage lower than the voltage VBLCb and the voltage VBLCc. The voltage VBLCc is a voltage lower than the voltage VBLCb. That is, VBLCa<VBLCc<VBLCb is satisfied.

Specifically, the sequencer 16 can transmit the control signal BLC which is different for each transistor 14 of the sense amplifier unit SAUr in the sense amplifier 21. The sequencer 16 transmits, for example, the control signal BLC (that is, voltage VBLCa) for clamping the voltage of the bit line BLa to VBLa, to the gate of the transistor 14 connected to the bit line BLa. The sequencer 16 transmits the control signal BLC (that is, voltage VBLCb) for clamping the voltage of the bit line BLb to the voltage VBLb, to the gate of the transistor 14 connected to the bit line BLb. Furthermore, the sequencer 16 transmits the control signal BLC (that is, voltage VBLCc) for clamping the voltage of the bit line BLc to the voltage VBLc, to the gate of the transistor 14 connected to the bit line BLc. As a result, the sense amplifier 21 applies the voltage VBLa to the bit line BLa connected to the selected memory cell MCa, applies the voltage VBLb to the bit line BLb connected to the selected memory cell MCb, and applies the voltage VBLc to the bit line BLc connected to the selected memory cell MCc.

Further, at time tr1, the sequencer 16 raises the voltage of the control signal HHL from the voltage VSS to a voltage VHHL. When the voltage of the control signal HHL rises to the voltage VHHL, the transistor T2 is turned on and the sense node SEN is charged to the voltage VDDSA. When the charging of the sense node SEN is completed, the sequencer 16 lowers the voltage of the control signal HHL to the voltage VSS.

Next, at time tr2, the sequencer 16 raises the voltage of the control signal XXL from the voltage VSS to a voltage VXXL. When the voltage of the control signal XXL rises to the voltage VXXL, the transistor T3 is turned on, and the voltage of the sense node SEN changes according to the threshold voltage of the selected memory cells MCa, MCb, or MCc. Specifically, when the selected memory cell MCa, MCb, or MCc is in the on state, the voltages of the sense nodes SEN respectively connected to the bit lines BLa, BLb, and BLc are lowered to the voltage VDDo.

Here, as described above, the threshold voltage of the memory cell MCa is lower than the threshold voltage of the memory cell MCb. Therefore, when the read voltage VCGRV is applied to the selected word line WLsel, the memory cell MCa causes a larger current than that of the memory cell MCb to flow. However, the voltage of the bit line BLa is lower than that of the bit line BLb. That is, the voltage VBLCa applied to the gate of the transistor T4 connected to the bit line BLa is lower than the voltage VBLCb applied to the gate of the transistor T4 connected to the bit line BLb. Therefore, due to this, the current flowing through the bit line BLa is limited by the bit line BLb, and becomes substantially the same as the current flowing through the bit line BLb. That is, the memory cell MCa causes a larger current than that of the memory cell MCb to flow, but the transistor T4 connected to the bit line BLa clamps the current flowing through the bit line BLa because the voltage VBLCa is applied to the gate.

The threshold voltage of the memory cell MCc is lower than the threshold voltage of the memory cell MCb and higher than the threshold voltage of the memory cell MCa. Therefore, when the read voltage VCGRV is applied to the selected word line WLsel, the memory cell MCc causes a larger current than that of the memory cell MCb and a smaller current than that of the memory cell MCa to flow. However, the voltage of the bit line BLc is lower than that of the bit line BLb and higher than that of the bit line BLa. That is, the voltage VBLCc applied to the gate of the transistor T4 connected to the bit line BLc is lower than the voltage VBLCb applied to the gate of the transistor T4 connected to the bit line BLb, and higher than the voltage VBLCa applied to the gate of the transistor 14 connected to the bit line BLa. Therefore, due to this, the current flowing through the bit line BLc is limited by the bit line BLb or BLa, and becomes substantially the same as the current flowing through the bit line BLb. That is, the memory cell MCc causes a larger current than that of the memory cell MCb or MCa to flow, but the transistor 14 connected to the bit line BLc clamps the current flowing through the bit line BLc because the voltage VBLCc is applied to the gate.

On the other hand, the memory cell MCb causes a smaller current than that of the memory cell MCa or MCc to flow, but since the voltage VBLCb higher than the voltage VBLCa or VBLCc is applied to the gate of the transistor 14 connected to the bit line BLb, the transistor T4 connected to the bit line BLb causes a larger current than that of the transistor T4 connected to the bit line BLa or BLc to flow. As a result, at time tr2 to tr3, the current flowing through the bit line BLa or BLc is set to have substantially the same current value as the current that flows through the bit line BLb. As a result, the voltages of the sense nodes SEN respectively connected to the memory cells MCa and MCc are lowered to the voltage VDDo. Similarly, the voltage of the sense node SEN connected to the memory cell MCb is also lowered to the voltage VDDo.

On the other hand, when the selected memory cell MCa is in the off state, the voltage of the sense node SEN connected to the bit line BLa is maintained at a voltage VDDf higher than the voltage VDDo. Similarly, when the selected memory cell MCc is in the off state, the voltage of the sense node SEN connected to the bit line BLc is maintained at a voltage VDDf higher than the voltage VDDo. When the selected memory cell MCb is in the off state, the voltage of the sense node SEN connected to the bit line BLb is maintained at the voltage VDDf higher than the voltage VDDo.

Next, at time tr3, after the currents flowing through the bit lines BLa, BLb, and BLc are reflected in the sense node SEN, the sequencer 16 lowers the voltage of the control signal XXL from the voltage VXXL to the voltage VSS. When the voltage of the control signal XXL is lowered to the voltage VSS, the transistor T3 is turned off and the voltage of the sense node SEN is fixed.

After this, the sequencer 16 asserts the control signal STB and determines bit values of the data stored in the selected memory cells MCa, MCb, and MCc, respectively. Specifically, the sequencer 16 raises the voltage of the control signal STB from the "L" level to the "H" level. When the voltage of the control signal STB rises to the "H" level, the transistor T7 is turned on, and the voltage of the latch circuit SDL of the sense amplifier unit SAUr changes depending on the voltage VDDo or VDDf of the sense node SEN applied to the gate of the transistor T6. Then, the sequencer 16 determines the bit value of the data stored in the selected memory cell MCa based on the voltage of the latch circuit SDL of the sense amplifier unit SAUr connected to the bit line BLa. Similarly, the bit value of the data stored in the selected memory cell MCb is determined based on the voltage of the latch circuit SDL of the sense amplifier unit SAUr connected to the bit line BLb. The bit value of the data stored in the selected memory cell MCc is determined based on the voltage of the latch circuit SDL of the sense amplifier unit SAUr connected to the bit line BLc.

That is, the sense amplifier unit SAUr connected to the bit line BLa senses whether or not the threshold voltage of the selected memory cell MCa is higher than the read voltage VCGRV, and stores the sense result in the latch circuit SDL. Similarly, the sense amplifier unit SAUr connected to the bit line BLb senses whether or not the threshold voltage of the selected memory cell MCb is higher than the read voltage VCGRV, and stores the sense result in the latch circuit SDL. The sense amplifier unit SAUr connected to the bit line BLc senses whether or not the threshold voltage of the selected memory cell MCc is higher than the read voltage VCGRV, and stores the sense result in the latch circuit SDL. The sequencer 16 determines bit values of the data stored in the selected memory cells MCa, MCb, and MCc respectively, based on the sense results stored in the latch circuit SDL of the sense amplifier unit SAUr. According to the above, the first example of the read operation using the read voltage VCGRV is completed.

As described above, in the first example of the read operation, even when the threshold voltages of the selected memory cells MCa, MCb, and MCc are different within the threshold voltage distribution of the same state, that is, even when the threshold voltages of the selected memory cells MCa and MCc are lower than the threshold voltage of the selected memory cell MCb within the threshold voltage distribution of the same state, the voltages VDDo used for determination when the selected memory cells MCa, MCb, and MCc are respectively on-cell can be set to be substantially the same voltage level. As a result, in the write operation, it is possible to reduce the problem caused by setting the threshold voltage of the memory cell MCa in the vicinity of the slit SLT and the threshold voltage of the memory cell MCc in the vicinity of the vacant area to be lower than the threshold voltage of the memory cell MCb.

Furthermore, in the above description, the voltage supplied to the bit line BL during the read operation is changed depending on whether the memory cell is the memory cell MCa in the vicinity of the slit SLT, the memory cell MCc in the vicinity of the vacant area overlapping the slit SHE, or the other memory cell MCb. However, further, depending on whether the memory cell MCa is disposed above or below the memory pillar MPa among the memory cells MCa in the memory pillar MPa in the vicinity of the slit SLT, the voltage supplied to the bit line BLa during the read operation may be changed. As a result, the read operation can be executed even for the memory cells MCa positioned above or below the memory pillar MPa under the read conditions according to the write characteristics of the memory cells.

2.2.2 Read Operation (Second Example)

Next, a second example of the read operation in the second embodiment will be described. In the second example of the read operation, depending on whether the memory cell of the read target is disposed in the vicinity of the slit SLT, or arranged in the vicinity of the vacant area overlapping the slit SHE, that is, depending on whether the read target is the memory cell MCa, MCb, or MCc, the sense time for sensing the data respectively stored in the memory cells MCa, MCb, and MCc changes. In this second example, the sense time is a period during which the control signal XXL is maintained in the asserted state.

Figure 20:
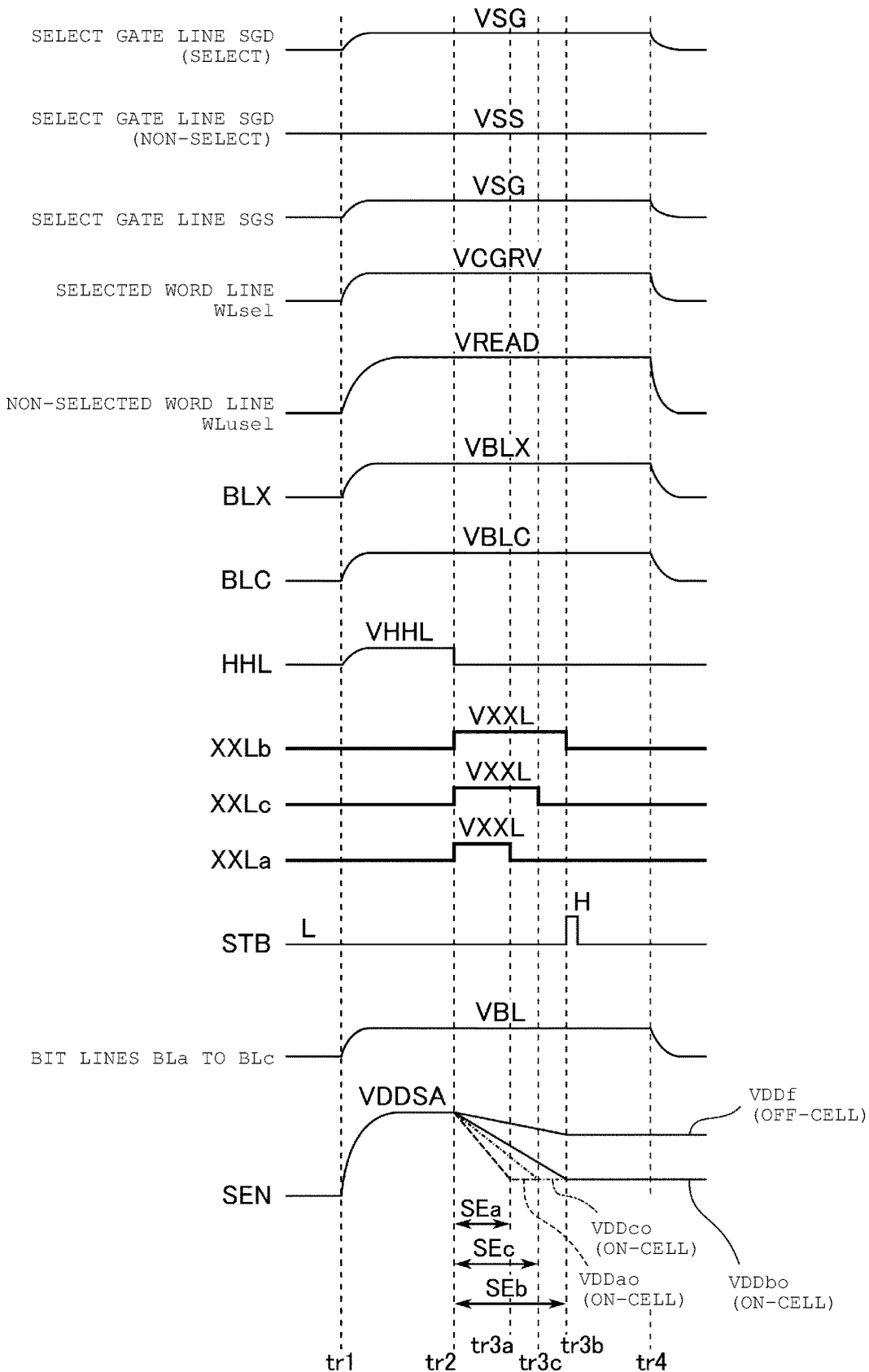
FIG. 20 is a timing chart of voltages of a select gate line, a word line, a bit line, and a control signal according to a second example of the read operation in the second embodiment.

FIG. 20 is a timing chart of voltages of the select gate line, the word line, the bit line, and the control signal according to the second example of the read operation in the second embodiment. In the following, the control signal applied to the gate of the transistor T3 connected to the memory cell MCa in the vicinity of the slit SLT via the bit line BLa is referred to as XXLa, the control signal applied to the gate of the transistor T3 connected to the memory cell MCc in the vicinity of the vacant area overlapping the slit SHE via the bit line BLc is referred to as XXLc, and the control signal applied to the gate of the transistor T3 connected to the memory cell MCb, which is not arranged in the vicinity of either the slit SLT or the vacant area, via the bit line BLb is referred to as XXLb.

As shown in FIG. 20, the sequencer 16 executes the read operation using the read voltage VCGRV during the period from time tr1 to tr4. The details of the read operation will be described below.

At time tr1, the row decoder 18 applies the voltage VSG to the selected select gate line SGD and the select gate line SGS. Furthermore, the row decoder 18 applies the voltage VSS to the non-selected select gate line SGD.

Further, at time tr1, the row decoder 18 applies the read voltage VCGRV to the selected word line WLsel. Furthermore, the row decoder 18 applies a voltage VREAD to the non-selected word line WLusel.

Further, at time tr1, the sequencer 16 raises the voltage of the control signal BLX from the voltage VSS to a voltage VBLX, for example. Further, the sequencer 16 raises the voltage of the control signal BLC of the transistor 14 connected to the selected memory cell MCa via the bit line BLa from the voltage VSS to a voltage VBLC. Similarly, the sequencer 16 raises the voltage of the control signal BLC of the transistor 14 connected to the selected memory cell MCc via the bit line BLc from the voltage VSS to the voltage VBLC. Furthermore, the sequencer 16 raises the voltage of the control signal BLC of the transistor 14 connected to the selected memory cell MCb via the bit line BLb from the voltage VSS to the voltage VBLC.

Specifically, the sequencer 16 transmits, for example, the control signal BLC (that is, voltage VBLC) for clamping the voltage of the bit line BLa to the voltage VBL, to the gate of the transistor 14 connected to the bit line BLa. Similarly, the sequencer 16 transmits, for example, the control signal BLC for clamping the voltage of the bit line BLc to the voltage VBL, to the gate of the transistor 14 connected to the bit line BLc. Furthermore, the sequencer 16 transmits, for example, the control signal BLC for clamping the voltage of the bit line BLb to the voltage VBL, to the gate of the transistor 14 connected to the bit line BLb. As a result, the sense amplifier 21 applies the voltage VBL to the bit line BLa connected to the selected memory cell MCa. Similarly, the sense amplifier 21 applies the voltage VBL to the bit line BLc connected to the selected memory cell MCc. Furthermore, the sense amplifier 21 applies the voltage VBL to the bit line BLb connected to the selected memory cell MCb.

Further, at time tr1, the sequencer 16 raises the voltage of the control signal HHL from the voltage VSS to a voltage VHHL. When the voltage of the control signal HHL rises to the voltage VHHL, the transistor T2 is turned on and the sense node SEN is charged to the voltage VDDSA. When the charging of the sense node SEN is completed, the sequencer 16 lowers the voltage of the control signal HHL to the voltage VSS.

Next, at time tr2, the sequencer 16 raises the voltage of the control signal XXLa from the voltage VSS to the voltage VXXL. Similarly, the sequencer 16 raises the voltage of the control signal XXLc from the voltage VSS to the voltage VXXL. Furthermore, the sequencer 16 raises the voltage of the control signal XXLb from the voltage VSS to the voltage VXXL. After this, at time tr3a, the sequencer 16 lowers the voltage of the control signal XXLa from the voltage VXXL to the voltage VSS. At time tr3c, the sequencer 16 lowers the voltage of the control signal XXLc from the voltage VXXL to the voltage VSS. Furthermore, at time tr3b, the sequencer 16 lowers the voltage of the control signal XXLb from the voltage VXXL to the voltage VSS.

When the voltage of the control signal XXLa rises to the voltage VXXL, the transistor T3 connected to the bit line BLa is turned on, and the voltage of the sense node SEN changes according to the threshold voltage of the selected memory cell MCa. Specifically, when the selected memory cell MCa is in the on state, the voltage of the sense node SEN connected to the bit line BLa is lowered to a voltage VDDao. Here, as described above, the threshold voltage of the memory cell MCa is lower than the threshold voltage of the memory cell MCb or MCc. Therefore, when the read voltage VCGRV is applied to the selected word line WLsel, a larger current than that of the bit line BLb or BLc flows through the bit line BLa connected to the memory cell MCa. Therefore, the period for maintaining the control signal XXLa at the "H" level is set to be shorter than the period for maintaining the control signal XXLb or XXLc at the "H" level. As a result, the voltage of the sense node SEN connected to the bit line BLa is set to the voltage VDDao. Hereinafter, the period for maintaining the control signal XXLa at the "H" level is referred to as a sense time SEa, and the period for maintaining the control signal XXLc at the "H" level is referred to as a sense time SEc. Furthermore, the period for maintaining the control signal XXLb at the "H" level is referred to as the sense time SEb.

Further, when the voltage of the control signal XXLc rises to the voltage VXXL, the transistor T3 connected to the bit line BLc is turned on, and the voltage of the sense node SEN changes according to the threshold voltage of the selected memory cell MCc. Specifically, when the selected memory cell MCc is in the on state, the voltage of the sense node SEN connected to the bit line BLc is lowered to a voltage VDDco. Here, as described above, the threshold voltage of the memory cell MCc is lower than the threshold voltage of the memory cell MCb and higher than the threshold voltage of the memory cell MCa. Therefore, when the read voltage VCGRV is applied to the selected word line WLsel, a current larger than that of the bit line BLb and smaller than that of the bit line BLa flows through the bit line BLc connected to the memory cell MCc. Therefore, the period for maintaining the control signal XXLc at the "H" level is set to be shorter than the period for maintaining the control signal XXLb at the "H" level, and is set to be longer than the period for maintaining the control signal XXLa at the "H" level. As a result, the voltage of the sense node SEN connected to the bit line BLc is set to the voltage VDDco.

On the other hand, when the voltage of the control signal XXLb rises to the voltage VXXL, the transistor T3 connected to the bit line BLb is turned on, and the voltage of the sense node SEN changes according to the threshold voltage of the selected memory cell MCb. Specifically, when the selected memory cell MCb is in the on state, the voltage of the sense node SEN connected to the bit line BLb is lowered to a voltage VDDbo. As described above, the threshold voltage of the memory cell MCb is higher than the threshold voltage of the memory cell MCa or MCc. Therefore, when the read voltage VCGRV is applied to the selected word line WLsel, a smaller current than that of the bit line BLa or BLc flows through the bit line BLb connected to the memory cell MCb. Therefore, the sense time SEb for maintaining the control signal XXLb at the "H" level is set to be longer than the sense time SEa and SEc. As a result, the voltage of the sense node SEN connected to the bit line BLb is set to the voltage VDDbo. As a result, the voltages VDDao, VDDbo, and VDDco of the sense nodes SEN respectively connected to the memory cells MCa, MCb, and MCc are fixed to substantially the same voltage level.

After this, the sequencer 16 asserts the control signal STB and determines bit values of the data stored in the selected memory cells MCa, MCb, and MCc, respectively. Specifically, the sequencer 16 raises the voltage of the control signal STB from the "L" level to the "H" level. When the voltage of the control signal STB rises to the "H" level, the transistor T7 is turned on, and the voltage of the latch circuit SDL of the sense amplifier unit SAUr changes depending on the voltage VDDao, VDDbo, VDDco, or VDDf of the sense node SEN applied to the gate of the transistor T6. Then, the sequencer 16 determines the bit value of the data stored in the selected memory cell MCa based on the voltage of the latch circuit SDL of the sense amplifier unit SAUr connected to the bit line BLa. Similarly, the bit value of the data stored in the selected memory cell MCc is determined based on the voltage of the latch circuit SDL of the sense amplifier unit SAUr connected to the bit line BLc. Furthermore, the bit value of the data stored in the selected memory cell MCb is determined based on the voltage of the latch circuit SDL of the sense amplifier unit SAUr connected to the bit line BLb.

That is, the sense amplifier unit SAU connected to the bit line BLa senses whether or not the threshold voltage of the selected memory cell MCa is higher than the read voltage VCGRV, and stores the sense result in the latch circuit SDL. Similarly, the sense amplifier unit SAUr connected to the bit line BLc senses whether or not the threshold voltage of the selected memory cell MCc is higher than the read voltage VCGRV, and stores the sense result in the latch circuit SDL. Furthermore, the sense amplifier unit SAUr connected to the bit line BLb senses whether or not the threshold voltage of the selected memory cell MCb is higher than the read voltage VCGRV, and stores the sense result in the latch circuit SDL.

The sequencer 16 determines bit values of the data stored in the selected memory cells MCa, MCb, and MCc respectively, based on the sense results stored in the latch circuit SDL of the sense amplifier unit SAUr. According to the above, the second example of the read operation using the read voltage VCGRV is completed.

As described above, in the second example of the read operation, even when the threshold voltages of the selected memory cells MCa, MCb, and MCc are different within the threshold voltage distribution of the same state, that is, even when the threshold voltages of the selected memory cells MCa and MCc are lower than the threshold voltage of the selected memory cell MCb within the threshold voltage distribution of the same state, the voltages VDDao, VDDbo, and VDDco used for determination when the selected memory cells MCa, MCb, and MCc are respectively on-cell can be set to be substantially the same voltage level. As a result, in the write operation, it is possible to reduce the problem caused by setting the threshold voltage of the memory cell MCa in the vicinity of the slit SLT and the threshold voltage of the memory cell MCc in the vicinity of the vacant area to be lower than the threshold voltage of the memory cell MCb.

As described above, among the memory cells MCa in the memory pillar MPa in the vicinity of the slit SLT, depending on whether the memory cell MCa is disposed above or below the memory pillar MPa, the sense time during the read operation may change. For example, the sense time during the read operation is set to SEau for the memory cell MCa arranged above the memory pillar MPa shown in FIG. 18, and the sense time during the read operation is set to SEal for the memory cell MCa arranged below the memory pillar MPa. The sense time SEau is shorter than the sense time SEal. As a result, the read operation can be executed even for the memory cells MCa positioned above or below the memory pillar MPa under the read conditions according to the write characteristics of the memory cells.

2.2.3 Read Operation (Third Example)

Next, a third example of the read operation in the second embodiment will be described. In the third example of the read operation, similarly to the second example, depending on whether the read target is the memory cell MCa, MCb, or MCc, the sense time for sensing the data respectively stored in the memory cells MCa, MCb, and MCc changes. In this third example, the sense time is a period from the time when the control signal XXL is asserted until the control signal BLC is lowered to the voltage VSS, or a period during which the control signal BLC is maintained at the voltage VBLC and the control signal XXL is maintained in the asserted state (for example, "H" level).

Figure 21:
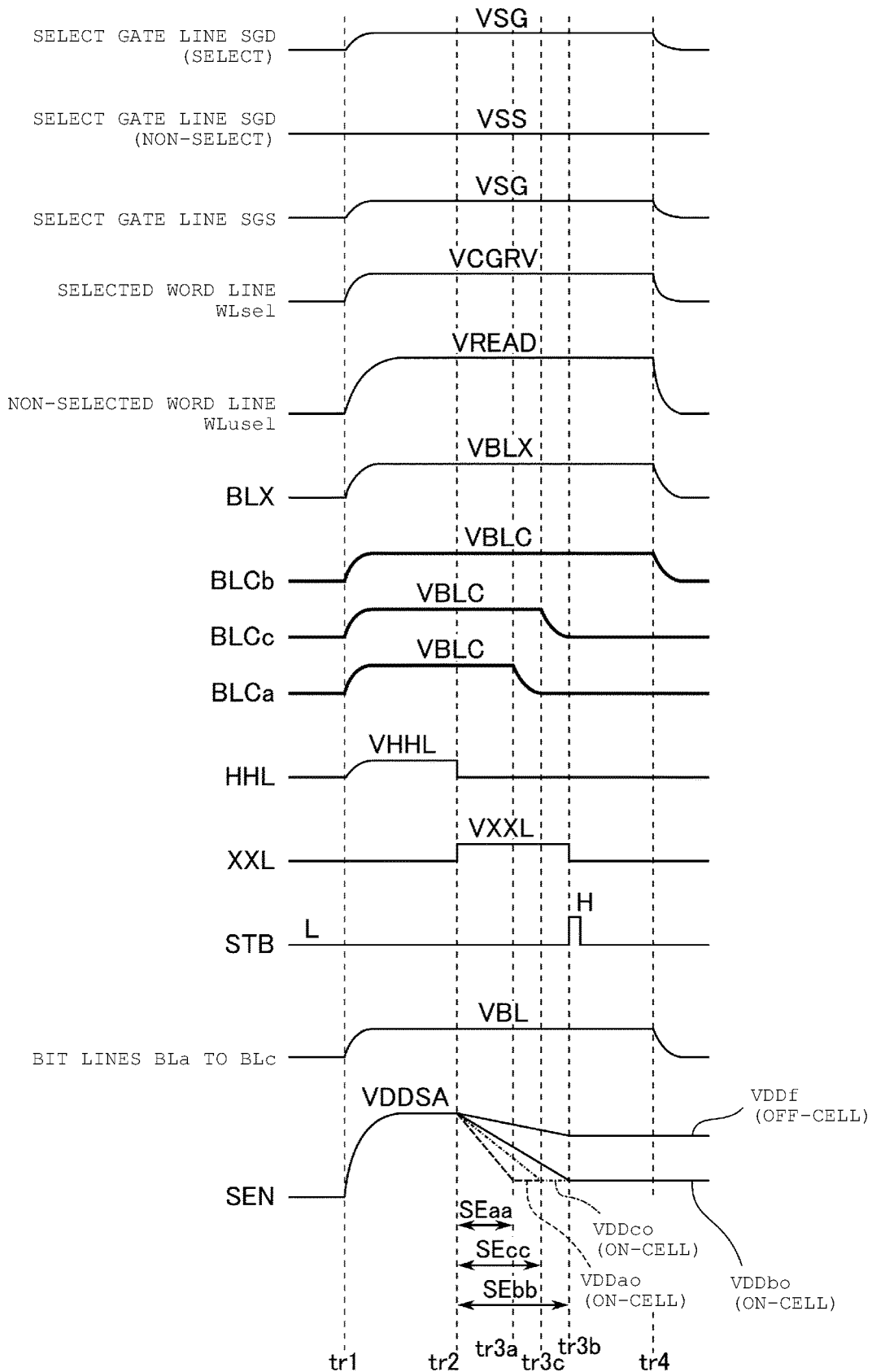
FIG. 21 is a timing chart of voltages of a select gate line, a word line, a bit line, and a control signal according to a third example of the read operation in the second embodiment.

FIG. 21 is a timing chart of voltages of the select gate line, the word line, the bit line, and the control signal according to the third example of the read operation in the second embodiment. In the following, the control signal applied to the gate of the transistor T4 connected to the memory cell MCa in the vicinity of the slit SLT via the bit line BLa is referred to as BLCa, the control signal applied to the gate of the transistor 14 connected to the memory cell MCc in the vicinity of the vacant area overlapping the slit SHE via the bit line BLc is referred to as BLCc, and the control signal applied to the gate of the transistor T4 connected to the memory cell MCb, which is not arranged in the vicinity of either the slit SLT or the vacant area, via the bit line BLb is referred to as BLCb.

As shown in FIG. 21, the sequencer 16 executes the read operation using the read voltage VCGRV during the period from time tr1 to tr4. The details of the read operation will be described below.

At time tr1, the row decoder 18 applies the voltage VSG to the selected select gate line SGD and the select gate line SGS. Furthermore, the row decoder 18 applies the voltage VSS to the non-selected select gate line SGD.

Further, at time tr1, the row decoder 18 applies the read voltage VCGRV to the selected word line WLsel. Furthermore, the row decoder 18 applies a voltage VREAD to the non-selected word line WLusel.

Further, at time tr1, the sequencer 16 raises the voltage of the control signal BLX from the voltage VSS to a voltage VBLX, for example. Further, the sequencer 16 raises the voltage of the control signal BLCa of the transistor T4 connected to the selected memory cell MCa via the bit line BLa from the voltage VSS to a voltage VBLC. Similarly, the sequencer 16 raises the voltage of the control signal BLCc of the transistor 14 connected to the selected memory cell MCc via the bit line BLc from the voltage VSS to the voltage VBLC. Furthermore, the sequencer 16 raises the voltage of the control signal BLCb of the transistor T4 connected to the selected memory cell MCb via the bit line BLb from the voltage VSS to the voltage VBLC.

Specifically, the sequencer 16 transmits, for example, the control signal BLCa (that is, voltage VBLC) for clamping the voltage of the bit line BLa to the voltage VBL, to the gate of the transistor 14 connected to the bit line BLa. Similarly, the sequencer 16 transmits, for example, the control signal BLCc for clamping the voltage of the bit line BLc to the voltage VBL, to the gate of the transistor T4 connected to the bit line BLc. Furthermore, the sequencer 16 transmits the control signal BLCb for clamping the voltage of the bit line BLb to the voltage VBL, to the gate of the transistor T4 connected to the bit line BLb. As a result, the sense amplifier 21 applies the voltage VBL to the bit line BLa connected to the selected memory cell MCa. Similarly, the sense amplifier 21 applies the voltage VBL to the bit line BLc connected to the selected memory cell MCc. Furthermore, the sense amplifier 21 applies the voltage VBL to the bit line BLb connected to the selected memory cell MCb.

Further, at time tr1, the sequencer 16 raises the voltage of the control signal HHL from the voltage VSS to a voltage VHHL. When the voltage of the control signal HHL rises to the voltage VHHL, the transistor T2 is turned on and the sense node SEN is charged to the voltage VDDSA. When the charging of the sense node SEN is completed, the sequencer 16 lowers the voltage of the control signal HHL to the voltage VSS.

Next, at time tr2, the sequencer 16 raises the voltage of the control signal XXL from the voltage VSS to a voltage VXXL.

After this, at time tr3a, the sequencer 16 lowers the voltage of the control signal BLCa from the voltage VBLC to the voltage VSS. At time tr3c, the sequencer 16 lowers the voltage of the control signal BLCc from the voltage VBLC to the voltage VSS. Furthermore, at time tr3b, the sequencer 16 lowers the voltage of the control signal XXL from the voltage VXXL to the voltage VSS.

Here, at time tr2, when the voltage of the control signal XXL rises to the voltage VXXL, the transistor T3 connected to the bit line BLa is turned on, and the voltage of the sense node SEN changes according to the threshold voltage of the selected memory cell MCa. Specifically, when the selected memory cell MCa is in the on state, the voltage of the sense node SEN connected to the bit line BLa is lowered to a voltage VDDao. As described above, the threshold voltage of the memory cell MCa is lower than the threshold voltage of the memory cell MCb or MCc. Therefore, when the read voltage VCGRV is applied to the selected word line WLsel, a larger current than that of the bit line BLb or BLc flows through the bit line BLa connected to the memory cell MCa. Therefore, the period from the time when the control signal XXL is asserted until the control signal BLCa is lowered to the voltage VSS is set to be shorter than the period for maintaining the control signal XXL at the "H" level. As a result, the voltage of the sense node SEN connected to the bit line BLa is set to the voltage VDDao. Hereinafter, the period from the time when the control signal XXL is asserted until the control signal BLCa is lowered to the voltage VSS is referred to as a sense time SEaa, the period from the time when the control signal XXL is asserted until the control signal BLCc is lowered to the voltage VSS is referred to as a sense time SEcc, and the period for maintaining the control signal XXL at the "H" level is referred to as a sense time SEbb.

Further, when the voltage of the control signal XXL rises to the voltage VXXL, the transistor T3 connected to the bit line BLc is turned on, and the voltage of the sense node SEN changes according to the threshold voltage of the selected memory cell MCc. Specifically, when the selected memory cell MCc is in the on state, the voltage of the sense node SEN connected to the bit line BLc is lowered to a voltage VDDco. As described above, the threshold voltage of the memory cell MCc is lower than the threshold voltage of the memory cell MCb and higher than the threshold voltage of the memory cell MCa. Therefore, when the read voltage VCGRV is applied to the selected word line WLsel, a current larger than that of the bit line BLb and smaller than that of the bit line BLa flows through the bit line BLc connected to the memory cell MCc. Therefore, the period from the time when the control signal XXL is asserted until the control signal BLCc is lowered to the voltage VSS (that is, sense time SEcc) is set to be longer than the sense time SEaa and shorter than the sense time SEbb. As a result, the voltage of the sense node SEN connected to the bit line BLc is set to the voltage VDDco.

Further, when the voltage of the control signal XXL rises to the voltage VXXL, the transistor T3 connected to the bit line BLb is turned on, and the voltage of the sense node SEN changes according to the threshold voltage of the selected memory cell MCb. Specifically, when the selected memory cell MCb is in the on state, the voltage of the sense node SEN connected to the bit line BLb is lowered to a voltage VDDbo. As described above, the threshold voltage of the memory cell MCb is higher than the threshold voltage of the memory cell MCa or MCc. Therefore, when the read voltage VCGRV is applied to the selected word line WLsel, a smaller current than that of the bit line BLa or BLc flows through the bit line BLb connected to the memory cell MCb. Therefore, the period for maintaining the control signal BLC at the voltage VBLC and maintaining the control signal XXL at the "H" level (that is, sense time SEbb) is set to be longer than the sense times SEaa and SEcc. As a result, the voltage of the sense node SEN connected to the bit line BLb is set to the voltage VDDbo. As a result, the voltages VDDao, VDDbo, and VDDco of the sense nodes SEN respectively connected to the memory cells MCa, MCb, and MCc are fixed to substantially the same voltage level.

After this, the sequencer 16 asserts the control signal STB and determines bit values of the data stored in the selected memory cells MCa, MCb, and MCc, respectively. That is, the sense amplifier unit SAUr senses whether or not the threshold voltage of the selected memory cell MCa is higher than the read voltage VCGRV, and stores the sense result in the latch circuit SDL. Similarly, the sense amplifier unit SAUr senses whether or not the threshold voltage of the selected memory cell MCc is higher than the read voltage VCGRV, and stores the sense result in the latch circuit SDL. Furthermore, the sense amplifier unit SAUr senses whether or not the threshold voltage of the selected memory cell MCb is higher than the read voltage VCGRV, and stores the sense result in the latch circuit SDL. The sequencer 16 determines bit values of the data stored in the selected memory cells MCa, MCb, and MCc respectively, based on the sense results stored in the latch circuit SDL of the sense amplifier unit SAUr. According to the above, the third example of the read operation using the read voltage VCGRV is completed.

As described above, in the third example of the read operation, similarly to the second example, even when the threshold voltages of the selected memory cells MCa, MCb, and MCc are different within the threshold voltage distribution of the same state, that is, even when the threshold voltages of the selected memory cells MCa and MCc are lower than the threshold voltage of the selected memory cell MCb within the threshold voltage distribution of the same state, the voltages VDDao, VDDbo, and VDDco used for determination when the selected memory cells MCa, MCb, and MCc are respectively on-cell can be set to be substantially the same voltage level. As a result, in the write operation, it is possible to reduce the problem caused by setting the threshold voltage of the memory cell MCa in the vicinity of the slit SLT and the threshold voltage of the memory cell MCc in the vicinity of the vacant area to be lower than the threshold voltage of the memory cell MCb.

2.2.4 Write Operation (First Example)

When the first example or the second example of the write operation of the present embodiment is executed, the first to third examples of the read operation described above are not executed, and the normal read operation is executed. In this case, the write speed of the memory cells MCa and MCc is adjusted in substantially the same manner as the write speed of the memory cell MCb according to the first example or the second example of the write operation. Therefore, when the write operation is executed for the memory cells MCa, MCb, and MCc using the write voltages of the same voltage level, the threshold voltages of the memory cells MCa, MCb, and MCc are set to substantially the same voltage level.

Hereinafter, a first example of the write operation in the second embodiment will be described. In the first example of the write operation, depending on whether the read target is the memory cell MCa, MCb, or MCc, the voltage applied to the bit lines BLa, BLb, and BLc respectively connected to the memory cells MCa, MCb, and MCc changes.

Figure 22:
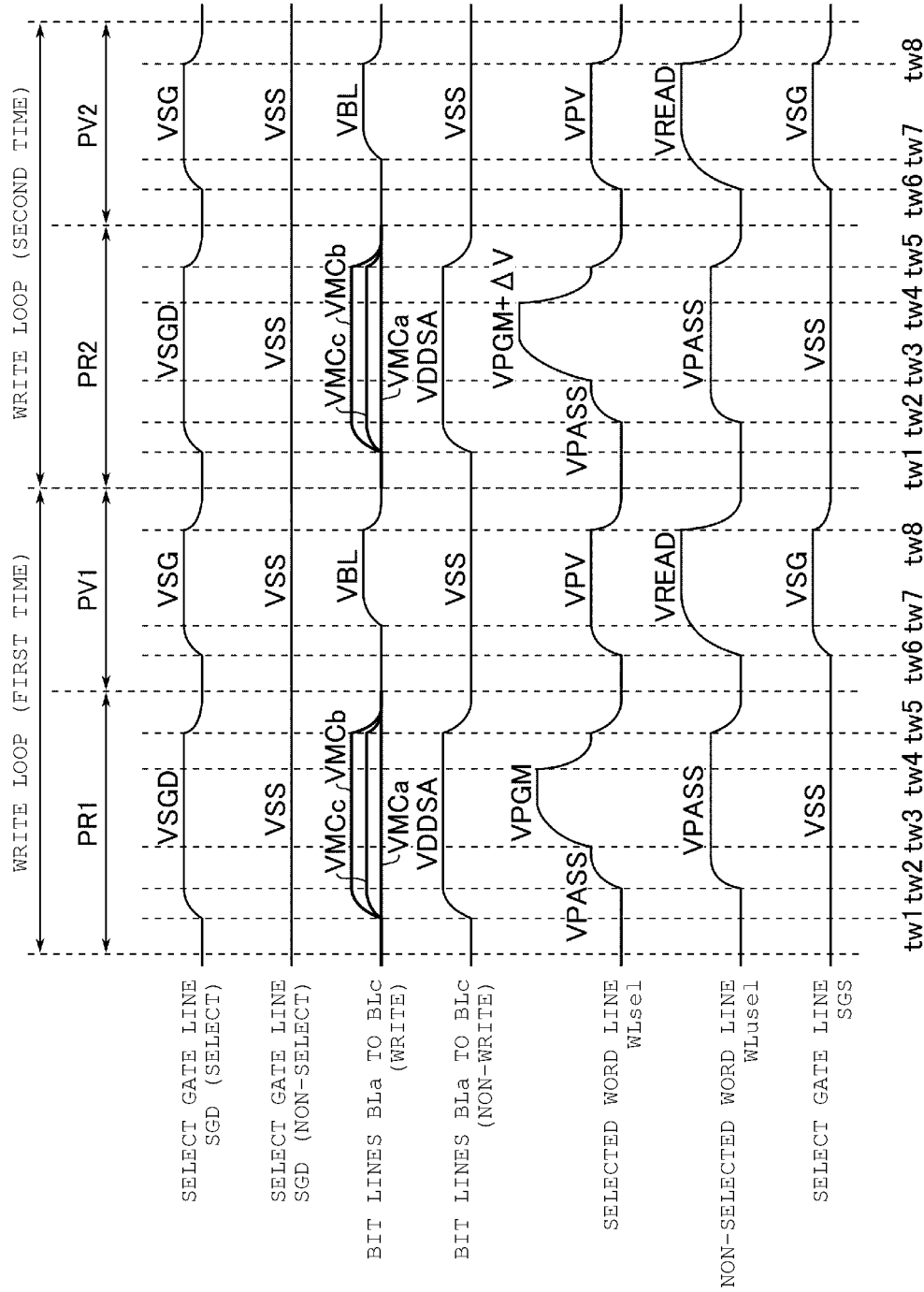
FIG. 22 is a timing chart of voltages applied to a select gate line, a word line, and a bit line according to a first example of a write operation in the second embodiment.

FIG. 22 is a timing chart of voltages applied to the select gate line, the word line, and the bit line according to a first example of the write operation in the second embodiment.

First, the program operation PR1 is executed.

At time tw1, the row decoder 18 applies a voltage VSGD to the selected select gate line SGD and also supplies the voltage VSS to the non-selected select gate line SGD. The voltage VSGD is a voltage higher than the voltage VSS.

Further, at time tw1, the sense amplifier 21 applies the voltage VMCa to the bit line BLa of a write target and is connected to the memory cell MCa in the vicinity of the slit SLT. The voltage VMCa is the voltage VSS. The sense amplifier 21 applies the voltage VMCc to the bit line BLc of a write target and is connected to the memory cell MCc in the vicinity of the vacant area overlapping the slit SHE. The voltage VMCc is higher than the voltage VMCa and lower than the voltage VMCb. The voltage VMCc is, for example, 0.2 V. Furthermore, the sense amplifier 21 applies the voltage VMCb to the bit line BLb connected to the memory cell MCb of a write target and is not arranged in the vicinity of either the slit SLT or the vacant area. The voltage VMCb is higher than the voltage VMCa and lower than the voltage VDDSA. The voltage VMCb is, for example, 0.5 V.

Further, at time tw1, the sense amplifier 21 applies the voltage VDDSA to the bit line BL connected to the memory cell of the non-write target. The voltage VDDSA is a voltage at which the select transistor ST1 is turned off when the voltage VSGD is applied to the selected select gate line SGD.

Next, at time tw2, the row decoder 18 applies a voltage VPASS to the selected word line WLsel and the non-selected word line WLusel.

Subsequently, at time tw3, the row decoder 18 applies a write voltage VPGM1 (for example, 14 to 20 V) to the selected word line WLsel. By applying the write voltage VPGM1, electrons are injected into the charge storage layer of the memory cell which is the write target connected to the selected word line WLsel, and writing is performed. Further, in the memory cell which is the non-write target connected to the selected word line WLsel, the channel potential of the memory cell is boosted, that is, the channel potential rises, and almost no charge is injected into the charge storage layer. The write voltage VPGM1 is higher than the voltage VPASS.

Next, at time two, the row decoder 18 lowers the voltage applied to the selected word line WLsel from the write voltage VPGM1 to the voltage VPASS.

After this, at time tw5, the voltage VSS is supplied to the selected word line WLsel, the non-selected word line WLu-sel, the select gate lines SGD and SGS, and the bit lines BLa, BLb, and BLc. With the above, the program operation is completed.

As described above, the voltage VMCa of the bit line BLa connected to the memory cell MCa in the memory pillar MPa is set to the voltage VSS. The voltage VMCc of the bit line BLc connected to the memory cell MCc in the memory pillar MPc is set to a voltage higher than the voltage VMCa and lower than the voltage VMCb. Furthermore, the voltage VMCb of the bit line BLb connected to the memory cell MCb in the memory pillar MPb is set to a voltage higher than the voltage VMCc and lower than the voltage VDDSA. Therefore, during program operation, the potential of the channel of the memory cell MCa is set to the voltage VSS, and the voltage of the selected word line WLsel is set to the write voltage VPGM1. The potential of the channel of the memory cell MCc is set to the voltage VMCc, and the voltage of the selected word line WLsel is set to the write voltage VPGM1. Furthermore, the potential of the channel of the memory cell MCb is set to the voltage VMCb, and the voltage of the selected word line WLsel is set to the write voltage VPGM1.

As a result, the voltage difference between the word line voltage and the channel potential in the memory cell MCb becomes smaller than the voltage difference between the word line voltage and the channel potential in the memory cell MCa, and the write speed of the memory cell MCb becomes slower than the write speed of the memory cell MCa. That is, by the program operation using the write voltage VPGM1, the threshold voltage written into the memory cell MCb is lower than the threshold voltage written into the memory cell MCa. Furthermore, the voltage difference between the word line voltage and the channel potential in the memory cell MCc becomes smaller than the voltage difference between the word line voltage and the channel potential in the memory cell MCa, and becomes larger than the voltage difference between the word line voltage and the channel potential in the memory cell MCb. Therefore, the write speed of the memory cell MCc becomes slower than the write speed of the memory cells MCa, and faster than the write speed of the memory cell MCb. That is, by the program operation using the write voltage VPGM1, the threshold voltage written into the memory cell MCc is lower than the threshold voltage written into the memory cell MCa and higher than the threshold voltage written into the memory cell MCb. As a result, the difference in write speed in the memory cells MCa, MCb, and MCc is adjusted, and the threshold voltages respectively written into the memory cells MCa, MCb, and MCc are set to substantially the same voltage level.

Next, the program verification operation PV1 is executed.

At time tw6, the row decoder 18 applies the voltage VSG to the selected select gate line SGD and the select gate line SGS. The row decoder 18 applies the voltage VSS to the non-selected select gate line SGD. The voltage VSG is a voltage that turns on the select transistors ST1 and ST2 corresponding to the selected string unit SU. As a result, the select transistors ST1 and ST2 of the selected string unit SU are turned on, and the select transistors ST1 of the non-selected string unit SU are turned off.

Further, at time tw6, the row decoder 18 applies a verify voltage VPV to the selected word line WLsel and the voltage VREAD to the non-selected word line WLusel. The verify voltage VPV is a read voltage set according to the write data. As described above, the voltage VREAD is a voltage that turns on the memory cell regardless of the threshold voltage of the memory cell, and VREAD>VPV is satisfied.

Next, at time tw7, the sense amplifier 21 applies the voltage VBL to the bit lines BLa, BLb, and BLc respectively connected to the memory cells MCa, MCb, and MCc of the write target. Furthermore, the sense amplifier 21 applies the voltage VSS to the bit line connected to the memory cell of the non-write target.

Then, at time tw8, the row decoder 18 applies the voltage VSS to the selected word line WLsel, the non-selected word line WLusel, the select gate line SGD, and the select gate line SGS. Further, the sense amplifier 21 applies the voltage VSS to the bit lines BLa, BLb, and BLc.

By the above operation, data is read from the memory cells MCa, MCb, and MCc connected to the selected word line WLsel. When the read data passes the verification, the write operation is completed. On the other hand, when the read data verification fails, the write voltage VPGM1 is increased by the voltage AV, and the write loop including the program operation PR2 and the program verification operation PV2 is repeated until passing the verification. With the above, the write operation is completed.

Furthermore, in the above description, the voltage supplied to the bit line BL during the write operation is changed depending on whether the memory cell is the memory cell MCa in the vicinity of the slit SLT, the memory cell MCc in the vicinity of the vacant area overlapping the slit SHE, or the other memory cell MCb. However, further, depending on whether the memory cell MCa is disposed above or below the memory pillar MPa among the memory cells MCa in the memory pillar MPa in the vicinity of the slit SLT, the voltage supplied to the bit line BLa during the write operation may be changed. As a result, the write operation can be executed even for the memory cells MCa positioned above or below the memory pillar MPa under the write conditions according to the write characteristics of the memory cells.

2.2.5 Write Operation (Second Example)

Next, a second example of the write operation in the second embodiment will be described. In the second example of the write operation, it is assumed that the states A, B, . . . , and G are set to the memory cell, for example. During the write operation, the write to change the voltages of the bit lines BLa, BLb, and BLc respectively connected to the memory cells MCa, MCb, and MCc is applied to the setting of the state G to the memory cells MCa, MCb, and MCc. That is, in the setting of the state G, the voltage VMCa is applied to the bit line BLa connected to the memory cell MCa, the voltage VMCb is applied to the bit line BLb connected to the memory cell MCb, and further, the voltage VMCc is applied to the bit line BLc connected to the memory cell MCc.

Figure 23:
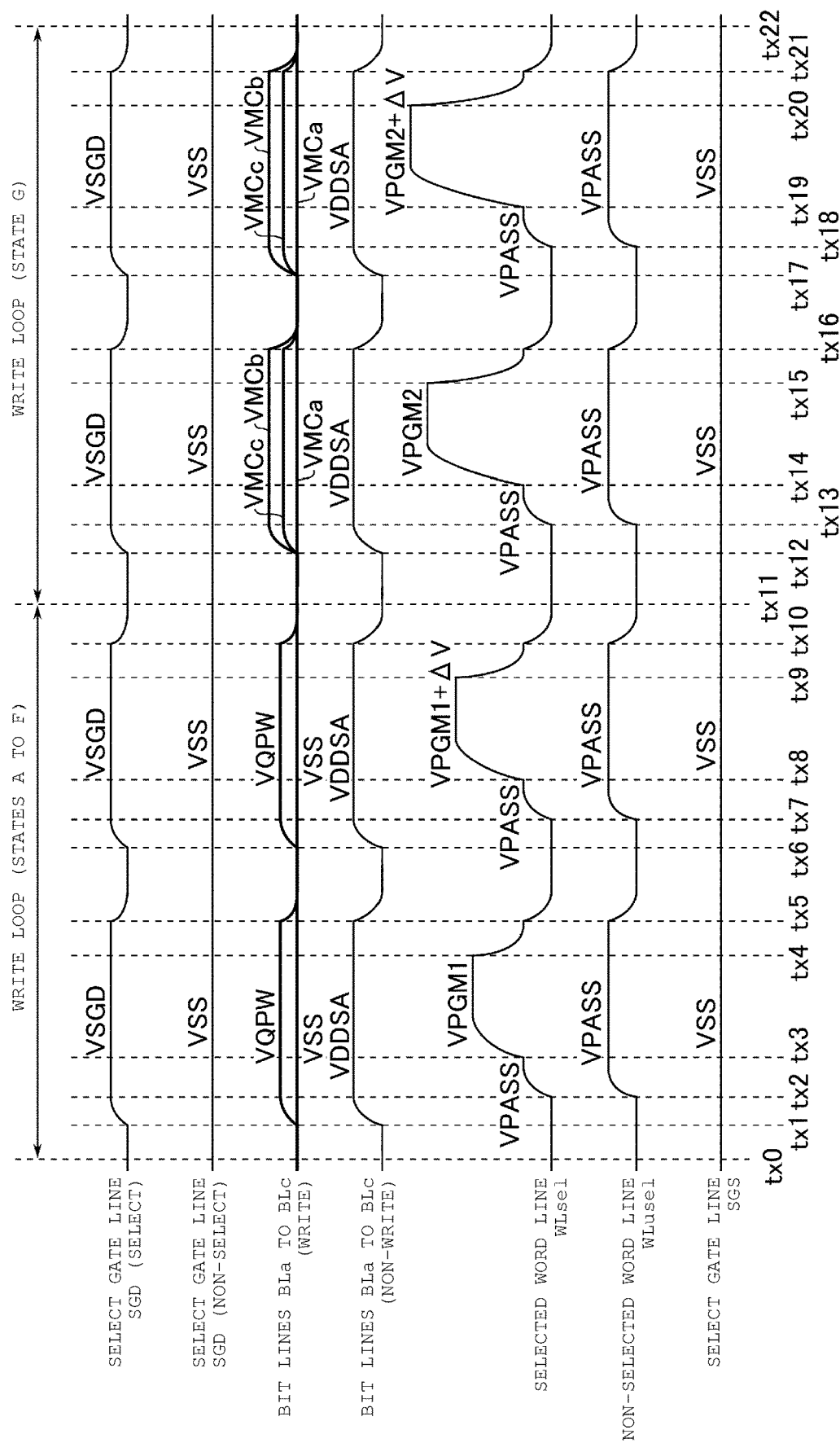
FIG. 23 is a timing chart of voltages applied to a select gate line, a word line, and a bit line according to a second example of the write operation in the second embodiment.

FIG. 23 is a timing chart of voltages applied to the select gate line, the word line, and the bit line according to a second example of the write operation in the second embodiment. Here, the description of the program verification operation is omitted.

In the setting of the states A to F, an operation for narrowing the threshold voltage distribution is executed with respect to the memory cells MCa, MCb, and MCc at time tx0 to tx11. Specifically, as shown in FIG. 23, the sense amplifier 21 applies the voltage VQPW (for example, 0.3 V) to the bit lines BLa, BLb, and BLc respectively connected to the memory cells MCa, MCb, and MCc which are targets of the weak write for narrowing the threshold voltage distribution, and applies the voltage VSS (for example, 0 V) to the bit lines connected to other memory cells, which are write targets. Furthermore, the sense amplifier 21 applies the voltage VDDSA to the bit lines BLa, BLb, and BLc respectively connected to the memory cells MCa, MCb, and MCc which are the non-write target. Then, at time tx0 to tx11, an operation for narrowing the threshold voltage distribution is executed with respect to the memory cells MCa, MCb, and MCc.

Further, in setting of the state G, at time tx11 to tx22, the operation of changing the bit line voltage is executed with respect to the memory cells MCa, MCb, and MCc according to the present embodiment.

Specifically, at time tx12, the row decoder 18 applies the voltage VSGD to the selected select gate line SGD and also supplies the voltage VSS to the non-selected select gate line SGD.

Further, at time tx12, the sense amplifier 21 applies the voltage VMCa to the bit line BLa of a write target and is connected to the memory cell MCa in the vicinity of the slit SLT. The voltage VMCa is the voltage VSS. The sense amplifier 21 applies the voltage VMCc to the bit line BLc of a write target and is connected to the memory cell MCc in the vicinity of the vacant area overlapping the slit SHE. The voltage VMCc is higher than the voltage VMCa and lower than the voltage VMCb. The voltage VMCc is, for example, 0.2 V. Furthermore, the sense amplifier 21 applies the voltage VMCb to the bit line BLb connected to the memory cell MCb of a write target and is not arranged in the vicinity of either the slit SLT or the vacant area. The voltage VMCb is higher than the voltage VMCa and lower than the voltage VDDSA. The voltage VMCb is, for example, 0.5 V.

Further, at time tx12, the sense amplifier 21 applies the voltage VDDSA to the bit lines BLa, BLb, and BLc respectively connected to the memory cells MCa, MCb, and MCc of the non-write target.

Next, at time tx13, the row decoder 18 applies a voltage VPASS to the selected word line WLsel and the non-selected word line WLusel.

Subsequently, at time tx14, the row decoder 18 applies a write voltage VPGM2 (for example, 14 to 20 V) to the selected word line WLsel. By applying the write voltage VPGM2, electrons are injected into the charge storage layer of the memory cell which is the write target connected to the selected word line WLsel, and writing is performed.

Next, at time tx15, the row decoder 18 lowers the voltage applied to the selected word line WLsel from the write voltage VPGM2 to the voltage VPASS.

Next, at time tx16, the voltage VSS is supplied to the selected word line WLsel, the non-selected word line WLusel, the select gate lines SGD and SGS, and the bit lines BLa, BLb, and BLc. With the above, the program operation is completed.

As described above, the voltage VMCa of the bit line BLa connected to the memory cell MCa is set to the voltage VSS. The voltage VMCc of the bit line BLc connected to the memory cell MCc is set to a voltage higher than the voltage VMCa and lower than the voltage VMCb. Furthermore, the voltage VMCb of the bit line BLb connected to the memory cell MCb is set to a voltage higher than the voltage VMCc and lower than the voltage VDDSA. Therefore, during program operation, the potential of the channel of the memory cell MCa is set to the voltage VSS, and the voltage of the selected word line WLsel is set to the write voltage VPGM2. The potential of the channel of the memory cell MCc is set to the voltage VMCc, and the voltage of the selected word line WLsel is set to the write voltage VPGM2. Furthermore, the potential of the channel of the memory cell MCb is set to the voltage VMCb, and the voltage of the selected word line WLsel is set to the write voltage VPGM2.

As a result, the voltage difference between the word line voltage and the channel potential in the memory cell MCb becomes smaller than the voltage difference between the word line voltage and the channel potential in the memory cell MCa, and the write speed of the memory cell MCb becomes slower than the write speed of the memory cell MCa. That is, by the program operation using the write voltage VPGM2, the threshold voltage written into the memory cell MCb is lower than the threshold voltage written into the memory cell MCa. Furthermore, the voltage difference between the word line voltage and the channel potential in the memory cell MCc becomes smaller than the voltage difference between the word line voltage and the channel potential in the memory cell MCa, and becomes larger than the voltage difference between the word line voltage and the channel potential in the memory cell MCb. Therefore, the write speed of the memory cell MCc becomes slower than the write speed of the memory cells MCa, and faster than the write speed of the memory cell MCb. That is, by the program operation using the write voltage VPGM2, the threshold voltage written into the memory cell MCc is lower than the threshold voltage written into the memory cell MCa and higher than the threshold voltage written into the memory cell MCb. As a result, the difference in write speed in the memory cells MCa, MCb, and MCc is adjusted, and the threshold voltages respectively written into the memory cells MCa, MCb, and MCc are set to substantially the same voltage level.

After this, a program verification operation (not shown) is executed for the memory cell of the write target. When the verification by the program verification operation fails, the write voltage VPGM2 is increased by the voltage AV and the program operation is executed again at time tx17 to tx22.

Specifically, at time tx17, the row decoder 18 applies the voltage VSGD to the selected select gate line SGD and also supplies the voltage VSS to the non-selected select gate line SGD.

Further, at time tx17, the sense amplifier 21 applies the voltage VMCa to the bit line BLa connected to the memory cell MCa of the write target. The sense amplifier 21 applies the voltage VMCc to the bit line BLc connected to the memory cell MCc of the write target. Furthermore, the sense amplifier 21 applies the voltage VMCb to the bit line BLb connected to the memory cell MCb of the write target.

Further, at time tx17, the sense amplifier 21 applies the voltage VDDSA to the bit lines BLa, BLb, and BLc respectively connected to the memory cells MCa, MCb, and MCc of the non-write target.

Next, at time tx18, the row decoder 18 applies the voltage VPASS to the selected word line WLsel and the non-selected word line WLusel.

Subsequently, at time tx19, the row decoder 18 applies the voltage, which is obtained by adding AV to the write voltage VPGM2, to the selected word line WLsel. By applying this write voltage, electrons are injected into the charge storage layer of the memory cell which is the write target connected to the selected word line WLsel, and writing is performed.

Next, at time tx20, the row decoder 18 lowers the voltage applied to the selected word line WLsel from the write voltage to the voltage VPASS.

Next, at time tx21, the voltage VSS is supplied to the selected word line WLsel, the non-selected word line WLusel, the select gate lines SGD and SGS, and the bit lines BLa, BLb, and BLc.

After this, a program verification operation (not shown) is executed again for the memory cell of the write target. Then, the write loop is repeated until passing the verification by the program verification operation. With the above, the write operation is completed.

FIGS. 22 and 23 are examples of timing charts in the write operation of the present embodiment. The voltage and timing applied to each of the word line WL, the select gate lines SGD and SGS, and the bit lines BLa, BLb, and BLc do not necessarily have to match those shown in FIGS. 22 and 23.

2.3 Effect of Second Embodiment

According to the second embodiment, it is possible to provide a semiconductor storage device capable of improving the performance of the read operation and/or the write operation.

The effects of the second embodiment will be described in detail below.

In the semiconductor storage device, the plurality of word lines WL and the plurality of select gate lines SGD are stacked, the stacked word lines WL are separated by the insulating layer called the slit SLT, and further, the stacked select gate lines SGD are separated by the insulating layer called the slit SHE. Then, the plurality of memory pillars MP are arranged between the plurality of slits SLT and the plurality of slits SHE. The memory pillar MP is not arranged in the area overlapping the slit SHE when viewed from above the main surface of the semiconductor substrate 50, and a vacant area is provided. The memory pillar MPa is disposed in the vicinity of the slit SLT, the memory pillar MPc is disposed in the vicinity of the vacant area overlapping the slit SHE, and further, the memory pillar MPb is disposed in the area other than these.

In such a structure, when the write operation is performed on the memory cell MCa formed in the memory pillar MPa, the memory cell MCb formed in the memory pillar MPb, and the memory cell MCc formed in the memory pillar MPc, the memory cells MCa, MCb, and MCc may have different write characteristics.

On the other hand, according to the configuration of the present embodiment, when the read operation is performed for the memory cells MCa, MCb, and MCc, the voltage VBLa of the bit line BLa is set to be lower than the voltage VBLb of the bit line BLb and the voltage VBLc of the bit line BLc, and the voltage VBLc of the bit line BLc is set to be lower than the voltage VBLb of the bit line BLb. As a result, the current flowing through the bit line BLa, the current flowing through the bit line BLb, and the current flowing through the bit line BLc are all set to have substantially the same current value. As a result, the voltages of the sense nodes SEN respectively connected to the memory cells MCa, MCb, and MCc are fixed to substantially the same voltage VDDo. As a result, the data stored in the selected memory cells MCa, MCb, and MCc can be accurately determined, and the performance of the read operation can be improved.

Further, according to the configuration of the present embodiment, when the read operation is performed for the memory cells MCa, MCb, and MCc, the sense time SEa (or SEaa) for sensing the data of the memory cell MCa is set to be shorter than the sense time SEb (or SEbb) for sensing the data of the memory cell MCb and the sense time SEc (or SEcc) for sensing the data of the memory cell MCc, and the sense time SEc is set to be shorter than the sense time SEb. As a result, the current amounts respectively flowing through the bit lines BLa, BLb, and BLc are set to be substantially the same current amount. Accordingly, the voltages VDDao, VDDbo, and VDDco of the sense nodes SEN respectively connected to the memory cells MCa, MCb, and MCc are fixed to substantially the same voltage level. As a result, the data stored in the selected memory cells MCa, MCb, and MCc can be accurately determined, and the performance of the read operation can be improved.

Further, according to the configuration of the present embodiment, when the write operation is performed for the memory cells MCa, MCb, and MCc, the voltage VMCa of the bit line BLa is set to be lower than the voltage VMCb of the bit line BLb and the voltage VMCc of the bit line BLc, and the voltage VMCc of the bit line BLc is set to be lower than the voltage VMCb of the bit line BLb. Accordingly, the difference in write speed in the memory cells MCa, MCb, and MCc is adjusted, and the threshold voltages respectively written into the memory cells MCa, MCb, and MCc are set to substantially the same voltage level. Thereby, the performance of the write operation can be improved.

Further, according to the configuration of the present embodiment, for example, when the states A, B, . . . , and G are set to the memory cells MCa, MCb, and MCc, the write operation of the present embodiment is not applied to the setting of the states A to F. Instead, for example, an operation of narrowing the threshold voltage distribution of each of the states A to F is executed, and the write operation of the present embodiment is applied only to the setting of the state G. Specifically, in the setting of the state G, the voltage VMCa of the bit line BLa is set to be lower than the voltage VMCb of the bit line BLb and the voltage VMCc of the bit line BLc, and the voltage VMCc of the bit line BLc is set to be lower than the voltage VMCb of the bit line BLb. Accordingly, the difference in write speed in the memory cells MCa, MCb, and MCc is adjusted, and the threshold voltages respectively written into the memory cells MCa, MCb, and MCc are set to substantially the same voltage level. As a result, since the number of write loops in the setting of the state G can be reduced, the time required for the write operation can be shortened, and the performance of the write operation can be improved.

Other effects of the second embodiment are as described in the section of the read operation and the write operation.

3. Other Modification Examples and the Like

In the above-described embodiment, the NAND flash memory was described as an example of the semiconductor storage device, but the present disclosure can be applied not only to the NAND flash memory but also to other semiconductor memories in general, and further to various storage devices other than the semiconductor memory.

While certain embodiments have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
a first word line extending in a first direction and a second direction crossing the first direction;
a first insulating layer extending in the first direction and a third direction crossing the first and second directions;
a first memory cell connected to the first word line;
a second memory cell connected to the first word line, the second memory cell being farther from the first insulating layer than the first memory cell in the second direction;
a first bit line connected to the first memory cell;
a second bit line connected to the second memory cell;
a first transistor in a sense amplifier, that is connected to the first bit line;
a second transistor in the sense amplifier, that is connected to the second bit line; and
a control circuit configured to:
apply a first voltage to the first bit line during a read operation of the first memory cell, and apply a second voltage to the second bit line during a read operation of the second memory cell, the second voltage being higher than the first voltage; and
apply a third voltage to a gate of the first transistor during the read operation of the first memory cell, and apply a fourth voltage to a gate of the second transistor during the read operation of the second memory cell, the fourth voltage being higher than the third voltage.

2. The semiconductor storage device according to claim 1, further comprising:
a second word line extending in the first direction and the second direction, wherein
the first word line is formed with a first conductive layer that has a plate shape extending in the first direction and the second direction,
the second word line is formed with a second conductive layer that has a plate shape extending in the first direction and the second direction,
the first insulating layer has a plate shape extending in the first direction and the third direction, and
the first insulating layer is disposed between the first conductive layer and the second conductive layer.

3. The semiconductor storage device according to claim 2, further comprising:
a first pillar penetrating the first conductive layer in the third direction, the first pillar including the first memory cell; and
a second pillar penetrating the first conductive layer in the third direction, the second pillar including the second memory cell and being farther from the first insulating layer than the first pillar in the second direction.

4. The semiconductor storage device according to claim 3, wherein
the first memory cell is provided at an intersection of the first pillar and the first conductive layer, and
the second memory cell is provided an intersection of the second pillar and the first conductive layer.

5. The semiconductor storage device according to claim 1, wherein
the first word line is formed with a first conductive layer that has a plate shape extending in the first direction and the second direction,
the first insulating layer has a plate shape extending in the first direction and the third direction, and
an end portion of the first word line in the second direction is in contact with the first insulating layer.

6. The semiconductor storage device according to claim 1, wherein the first memory cell is closest to the first insulating layer among all memory cells connected to the first word line.

7. The semiconductor storage device according to claim 1, further comprising:

a first select gate line on the first word line;

a second insulating layer adjacent to the first select gate line;

a third memory cell connected to the first word line, the third memory cell being closer to the second insulating layer than the first memory cell and the second memory cell; and a third bit line connected to the third memory cell, wherein the control circuit is configured to apply a third voltage to the third bit line during a read operation of the third memory cell, the third voltage being higher than the first voltage and lower than the second voltage.

8. The semiconductor storage device according to claim 7, further comprising:

a second select gate line, wherein the first select gate line is formed with a third conductive layer that has a plate shape extending in the first direction and the second direction, the second select gate line is formed with a fourth conductive layer that has a plate shape extending in the first direction and the second direction, and the second insulating layer is between the third conductive layer and the fourth conductive layer.

9. The semiconductor storage device according to claim 8, wherein the first word line is formed with a first conductive layer extending in the first direction and the second direction, and the semiconductor storage device further comprises:

a first pillar penetrating the first conductive layer and the third conductive layer in the third direction, the first pillar including the first memory cell, a second pillar penetrating the first conductive layer and the third conductive layer in the third direction, the second pillar including the second memory cell and being farther from the first insulating layer than the first pillar in the second direction, and a third pillar penetrating the first conductive layer and the third conductive layer in the third direction, the third pillar including the third memory cell and being closer to the second insulating layer than the first pillar and the second pillar in the second direction.

10. The semiconductor storage device according to claim 9, wherein the first memory cell is provided an intersection of the first pillar and the first conductive layer, the second memory cell is provided at an intersection of the second pillar and the first conductive layer, and the third memory cell is provided at an intersection of the third pillar and the first conductive layer.

11. The semiconductor storage device according to claim 7, wherein the third memory cell is closest to the second insulating layer among all memory cells connected to the first word line.

* * * * *